US010615155B2

(12) United States Patent
Feng

(10) Patent No.: US 10,615,155 B2
(45) Date of Patent: Apr. 7, 2020

(54) INTELLIGENT POWER MODULE AND MANUFACTURING METHOD THEREOF

(71) Applicants: GD MIDEA AIRCONDITIONING EQUIPMENT CO., LTD., Foshan (CN); MIDEA GROUP CO., LTD., Foshan (CN)

(72) Inventor: Yuxiang Feng, Foshan (CN)

( * ) Notice: Subject to any disclaimer, the term of this patent is extended or adjusted under 35 U.S.C. 154(b) by 181 days.

(21) Appl. No.: 15/559,834

(22) PCT Filed: Mar. 23, 2016

(86) PCT No.: PCT/CN2016/077143
§ 371 (c)(1),
(2) Date: Sep. 20, 2017

(87) PCT Pub. No.: WO2016/150391
PCT Pub. Date: Sep. 29, 2016

(65) Prior Publication Data
US 2018/0047714 A1    Feb. 15, 2018

(30) Foreign Application Priority Data

Mar. 23, 2015  (CN) .......................... 2015 1 0128312
Mar. 23, 2015  (CN) .......................... 2015 1 0128550
(Continued)

(51) Int. Cl.
*H01L 25/18*   (2006.01)
*H01L 23/498*  (2006.01)
(Continued)

(52) U.S. Cl.
CPC .......... *H01L 25/18* (2013.01); *H01L 21/4853* (2013.01); *H01L 21/4871* (2013.01);
(Continued)

(58) Field of Classification Search
CPC combination set(s) only.
See application file for complete search history.

(56) References Cited

U.S. PATENT DOCUMENTS

2006/0158853 A1*  7/2006  Jeong ................. H05K 7/20963
                                                   361/704
2006/0164813 A1*  7/2006  Yoshioka .......... H01L 23/49844
                                                   361/717
(Continued)

FOREIGN PATENT DOCUMENTS

CN    102047414 A   5/2011
CN    102484103 A   5/2012
(Continued)

OTHER PUBLICATIONS

Inamura Misao, Paper sheet radiator, Mar. 2011, IP.com English translation. (Year: 2019).*
(Continued)

*Primary Examiner* — Jayprakash N Gandhi
*Assistant Examiner* — Michael A Matey
(74) *Attorney, Agent, or Firm* — Kilpatrick Townsend & Stockton, LLP

(57) ABSTRACT

An intelligent power module and a manufacturing method thereof are provided. The intelligent power module includes a radiator, an insulating layer, a circuit wiring, a circuit component and a metal wire. At least part of a lower surface of the radiator is defined as a heat dissipating area, the heat dissipating area is provided with a heat dissipating corrugation, the insulating layer is provided to an upper surface of the radiator, the circuit wiring is provided to the insulating layer, and the circuit component is provided to the circuit wiring and is connected to the circuit wiring via the metal wire.

23 Claims, 39 Drawing Sheets

(30) Foreign Application Priority Data

| Mar. 23, 2015 | (CN) | 2015 1 0129209 |
|---|---|---|
| Mar. 23, 2015 | (CN) | 2015 1 0129237 |
| Mar. 23, 2015 | (CN) | 2015 1 0129283 |
| Mar. 23, 2015 | (CN) | 2015 1 0130088 |
| Mar. 23, 2015 | (CN) | 2015 1 0130307 |
| Mar. 23, 2015 | (CN) | 2015 1 0130308 |
| Mar. 23, 2015 | (CN) | 2015 1 0130426 |
| Mar. 23, 2015 | (CN) | 2015 2 0166339 U |
| Mar. 23, 2015 | (CN) | 2015 2 0166443 U |
| Mar. 23, 2015 | (CN) | 2015 2 0167653 U |

(51) Int. Cl.

| H01L 23/367 | (2006.01) |
|---|---|
| H01L 23/31 | (2006.01) |
| H05K 1/11 | (2006.01) |
| H01L 23/00 | (2006.01) |
| H01L 23/36 | (2006.01) |
| H05K 7/20 | (2006.01) |
| H01L 25/16 | (2006.01) |
| H02M 7/00 | (2006.01) |
| H01L 23/24 | (2006.01) |
| H01L 21/48 | (2006.01) |
| H01L 21/56 | (2006.01) |
| H01L 21/66 | (2006.01) |
| H01L 23/053 | (2006.01) |
| H01L 23/06 | (2006.01) |
| H01L 23/373 | (2006.01) |
| H01L 25/00 | (2006.01) |
| H05K 1/02 | (2006.01) |
| H05K 1/18 | (2006.01) |
| H05K 3/28 | (2006.01) |
| H05K 3/34 | (2006.01) |
| H02M 7/5387 | (2007.01) |

(52) U.S. Cl.
CPC ............ *H01L 21/565* (2013.01); *H01L 22/14* (2013.01); *H01L 23/053* (2013.01); *H01L 23/06* (2013.01); *H01L 23/24* (2013.01); *H01L 23/3121* (2013.01); *H01L 23/36* (2013.01); *H01L 23/3675* (2013.01); *H01L 23/3735* (2013.01); *H01L 23/49811* (2013.01); *H01L 23/49838* (2013.01); *H01L 24/48* (2013.01); *H01L 24/83* (2013.01); *H01L 24/85* (2013.01); *H01L 24/92* (2013.01); *H01L 25/16* (2013.01); *H01L 25/50* (2013.01); *H02M 7/003* (2013.01); *H05K 1/0204* (2013.01); *H05K 1/111* (2013.01); *H05K 1/181* (2013.01); *H05K 3/284* (2013.01); *H05K 3/341* (2013.01); *H05K 3/3494* (2013.01); *H05K 7/209* (2013.01); *H01L 24/16* (2013.01); *H01L 24/32* (2013.01); *H01L 24/45* (2013.01); *H01L 24/49* (2013.01); *H01L 24/73* (2013.01); *H01L 2224/16225* (2013.01); *H01L 2224/32225* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48106* (2013.01); *H01L 2224/48137* (2013.01); *H01L 2224/48227* (2013.01); *H01L 2224/48472* (2013.01); *H01L 2224/4903* (2013.01); *H01L 2224/49171* (2013.01); *H01L 2224/49175* (2013.01); *H01L 2224/73265* (2013.01); *H01L 2224/83815* (2013.01); *H01L 2224/85815* (2013.01); *H01L 2224/92247* (2013.01); *H01L 2924/1203* (2013.01); *H01L 2924/13055* (2013.01); *H01L 2924/13091* (2013.01); *H01L 2924/181* (2013.01); *H01L 2924/19107* (2013.01); *H02M 7/5387* (2013.01); *H05K 2201/066* (2013.01); *H05K 2201/10166* (2013.01); *H05K 2201/10174* (2013.01); *H05K 2201/10287* (2013.01); *H05K 2201/10318* (2013.01); *H05K 2201/10522* (2013.01); *H05K 2203/1316* (2013.01); *H05K 2203/1322* (2013.01); *H05K 2203/162* (2013.01)

(56) References Cited

U.S. PATENT DOCUMENTS

| 2006/0284211 | A1* | 12/2006 | Takubo | H01L 24/49 257/177 |
|---|---|---|---|---|
| 2009/0114462 | A1* | 5/2009 | Tahara | B60K 11/04 180/65.21 |
| 2011/0031612 | A1* | 2/2011 | Mitsui | H01L 23/3107 257/713 |
| 2011/0284924 | A1* | 11/2011 | Teramae | H01L 23/3735 257/140 |
| 2012/0001349 | A1 | 1/2012 | Harada et al. | |
| 2012/0236500 | A1* | 9/2012 | Higuchi | H01L 23/473 361/699 |
| 2013/0062745 | A1* | 3/2013 | Kimura | H01L 23/4334 257/675 |
| 2013/0343001 | A1* | 12/2013 | Kwak | H01L 23/473 361/717 |
| 2014/0048918 | A1* | 2/2014 | Nagaune | H01L 23/4334 257/675 |
| 2014/0138063 | A1* | 5/2014 | Kawaura | F28F 3/022 165/104.33 |
| 2014/0210093 | A1* | 7/2014 | Wang | H01L 23/36 257/773 |
| 2014/0374896 | A1* | 12/2014 | Nishida | H01L 21/4882 257/712 |
| 2015/0021750 | A1* | 1/2015 | Fujino | H01L 23/24 257/667 |
| 2015/0115288 | A1* | 4/2015 | Tamada | H01L 23/3107 257/77 |
| 2016/0343640 | A1* | 11/2016 | Gohara | H01L 23/473 |
| 2017/0341638 | A1* | 11/2017 | Sawada | H01L 23/36 |

FOREIGN PATENT DOCUMENTS

| CN | 104112719 A | 10/2014 | | |
|---|---|---|---|---|
| CN | 104112740 A | 10/2014 | | |
| CN | 104752373 A | 7/2015 | | |
| CN | 104766842 A | 7/2015 | | |
| CN | 104767396 A | 7/2015 | | |
| CN | 104767417 A | 7/2015 | | |
| CN | 104779174 A | 7/2015 | | |
| CN | 104795388 A | 7/2015 | | |
| CN | 104795974 A | 7/2015 | | |
| CN | 104835794 A | 8/2015 | | |
| CN | 204558448 U | 8/2015 | | |
| CN | 204559407 U | 8/2015 | | |
| CN | 204596778 U | 8/2015 | | |
| CN | 105047623 A | 11/2015 | | |
| JP | 11126870 A | 5/1999 | | |
| JP | 2012169529 A | 9/2012 | | |
| WO | WO-2011025020 A1 * | 3/2011 | ......... | H01L 23/3672 |

OTHER PUBLICATIONS

CN First Office Action dated Oct. 24, 2016 in the corresponding CN application (application No. 201510130426.3).
CN First Office Action dated Mar. 1, 2017 in the corresponding CN application (application No. 201510128550.6).
CN First Office Action dated Feb. 28, 2017 in the corresponding CN application (application No. 201510129209.2).

(56) References Cited

OTHER PUBLICATIONS

CN First Office Action dated Mar. 8, 2017 in the corresponding CN application (application No. 201510129237.4).
CN First Office Action dated Feb. 28, 2017 in the corresponding CN application (application No. 201510130307.8).
CN First Office Action dated Oct. 27, 2016 in the corresponding CN application (application No. 201510130308.2).
CN Second Office Action dated Jun. 30, 2017 in the corresponding CN application (application No. 201510130426.3).

* cited by examiner

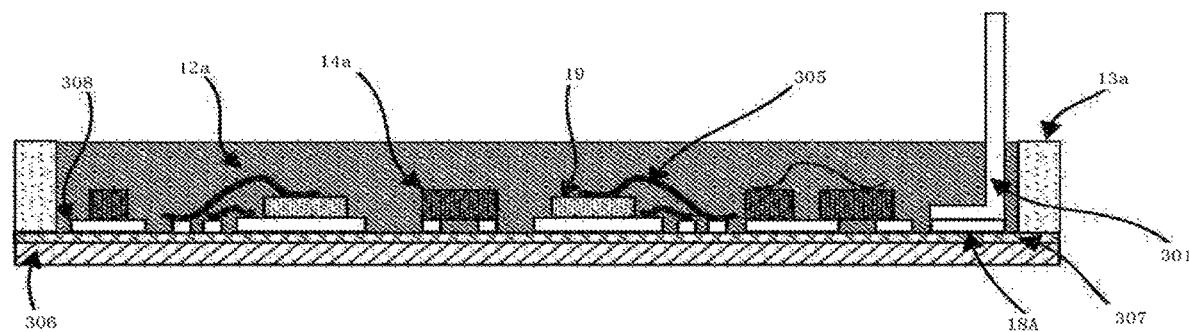
Fig. 15
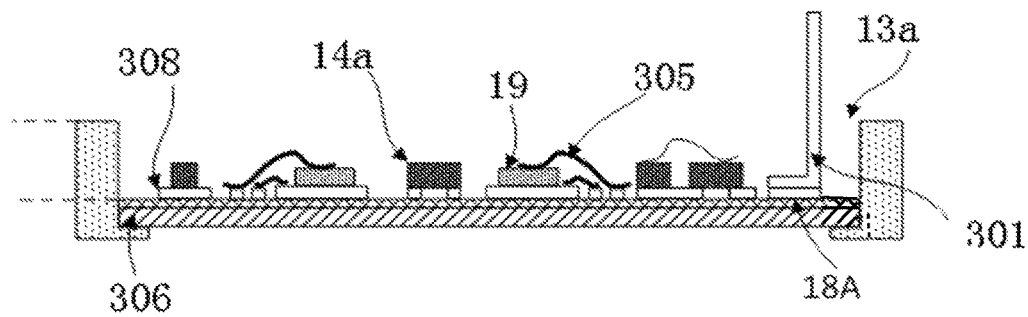
Fig. 15 (a)
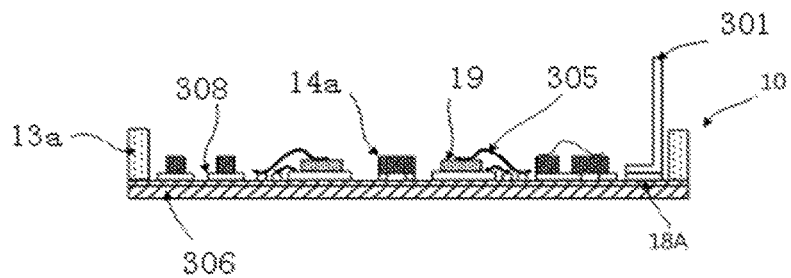
Fig. 15 (aa)
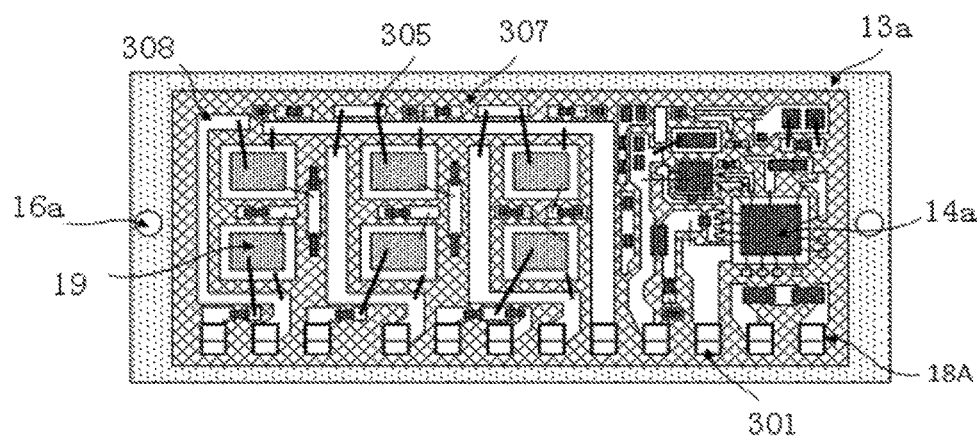
Fig. 15 (b)

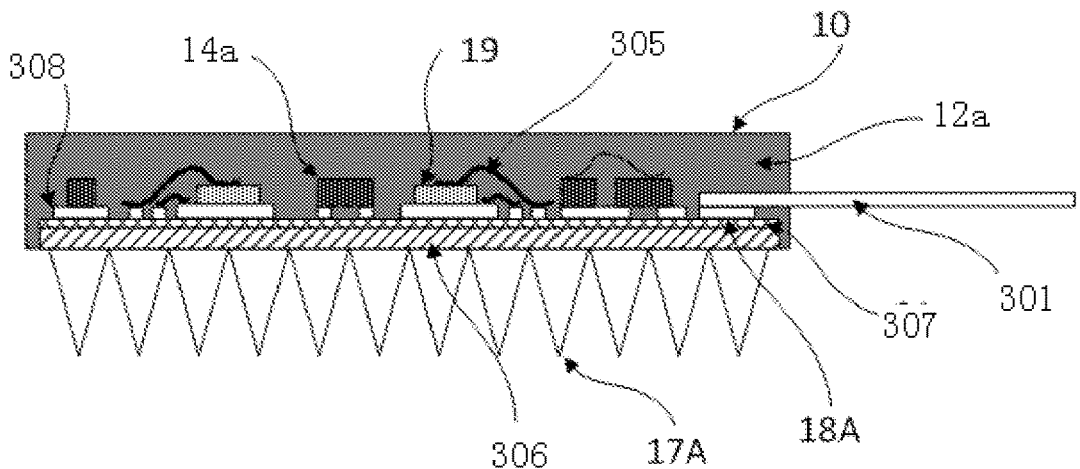

Fig. 36

| | |
|---|---|
| manufacturing a radiator and a pin, flatting an upper surface of the radiator, and arranging a heat dissipating corrugation to a lower surface of the radiator | P10 |
| arranging an insulating layer on the upper surface of the radiator, and arranging a circuit wiring on an upper surface of the insulating layer | P20 |
| arranging a circuit component and the pin connected to an exterior on the circuit wiring | P30 |
| connecting the circuit component with the circuit wiring via a metal wire | P40 |
| baking the radiator and molding a sealing resin, shaping the pin to acquire the intelligent power module | P50 |
| performing a module function test on the intelligent power module | P60 |

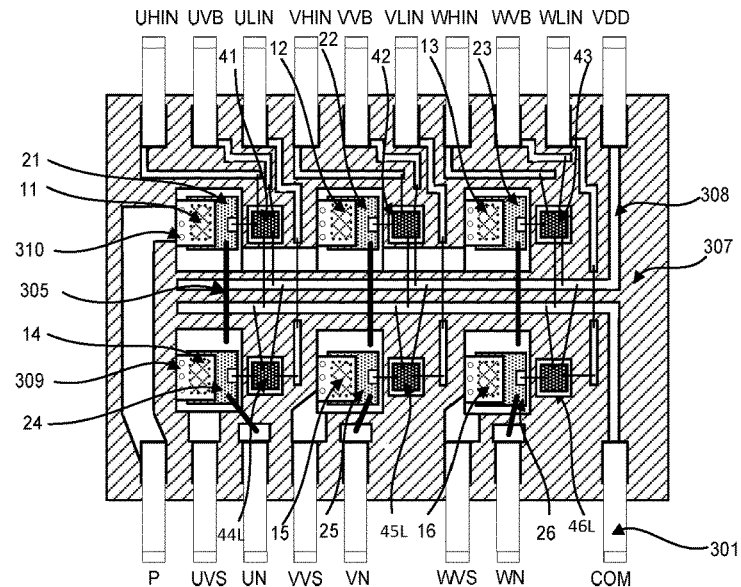
Fig. 46(C)
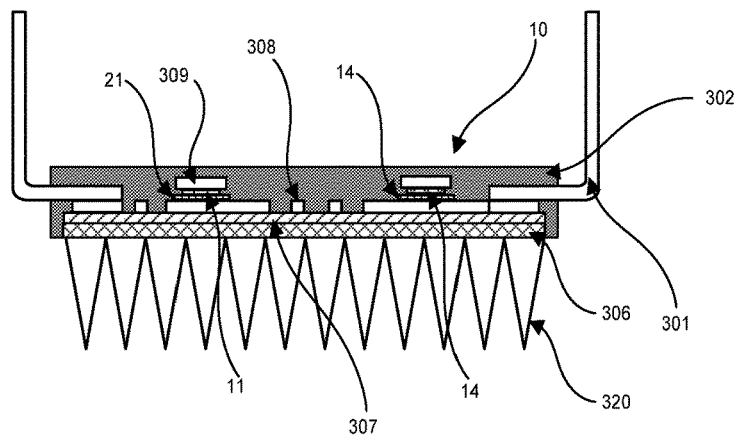
Fig. 46 (D)
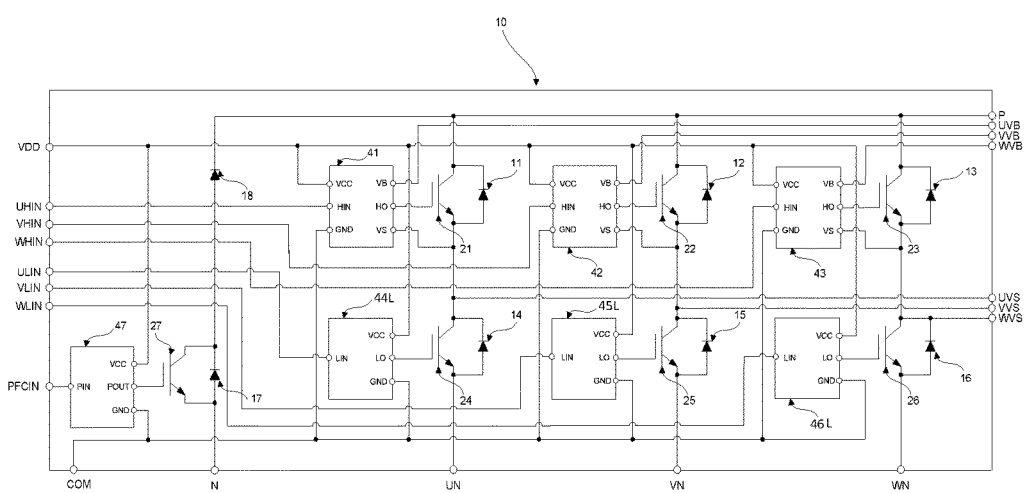
Fig. 46 (AA)

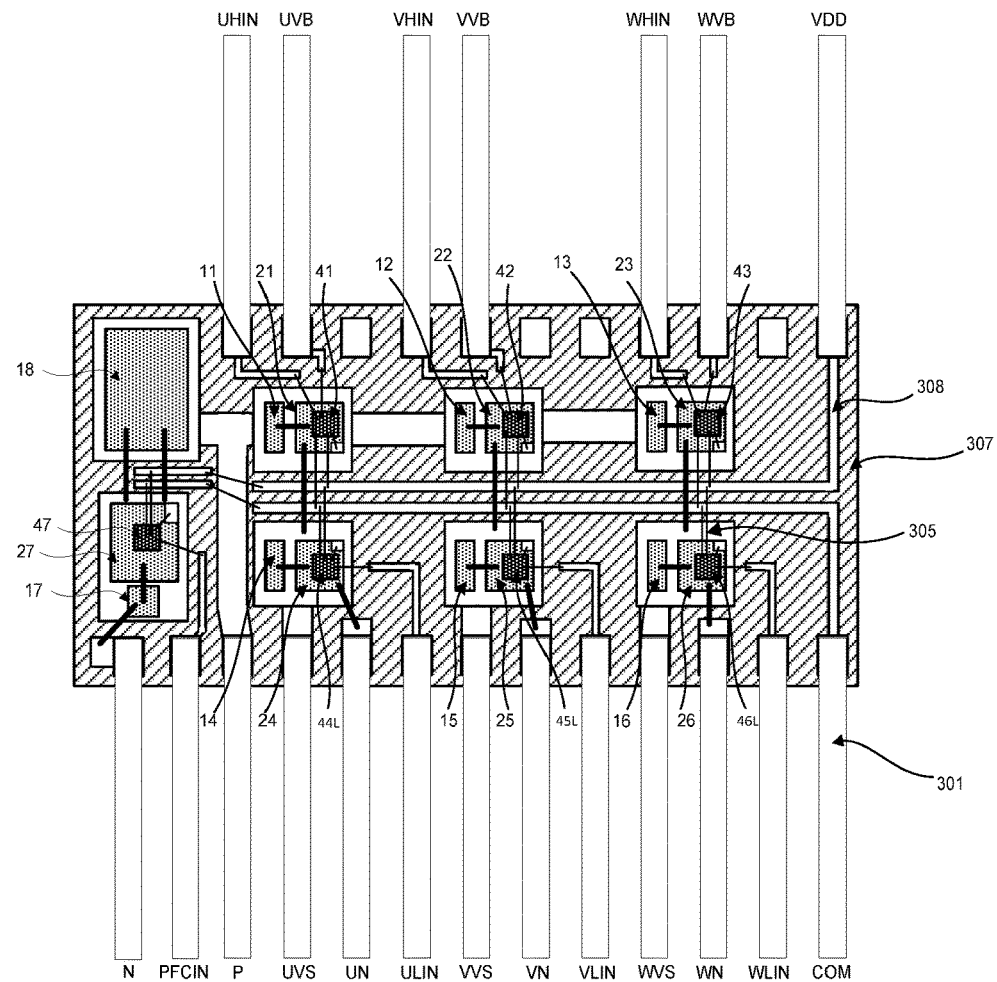
Fig.46(CC)
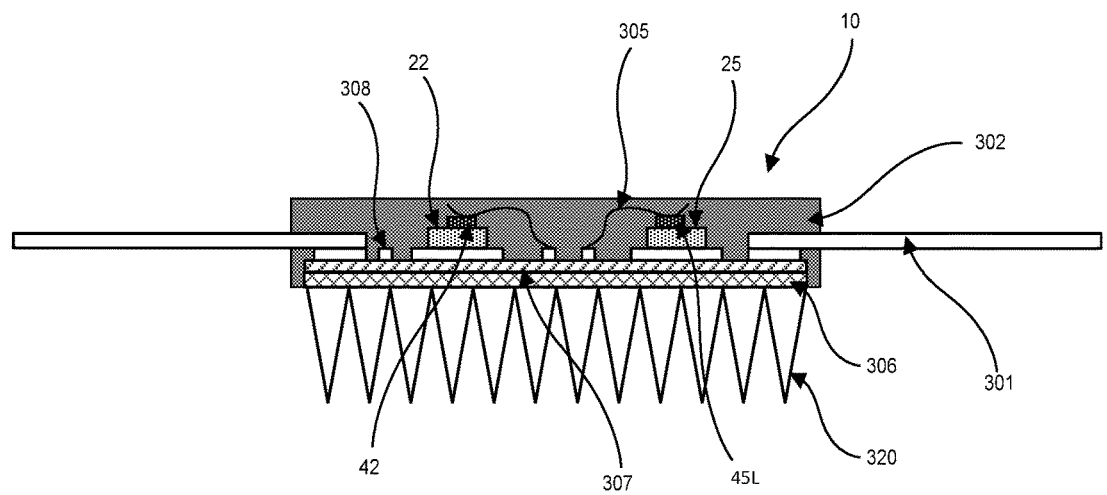
Fig. 46 (DD)

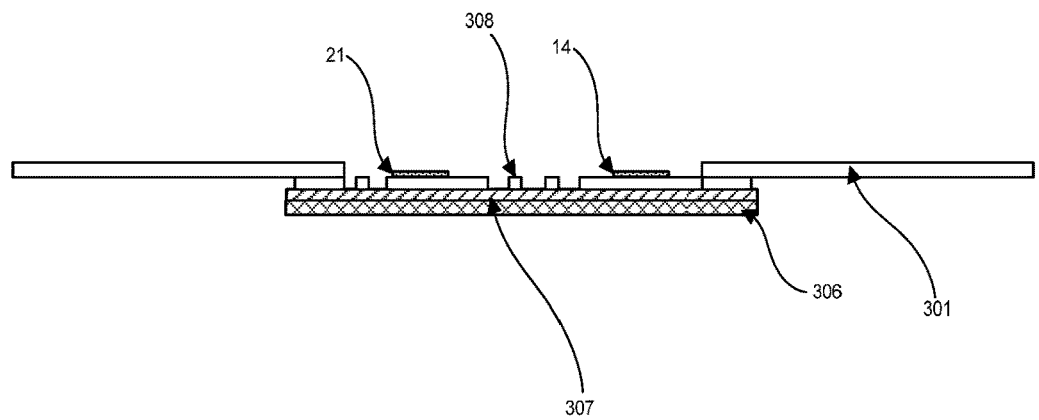
Fig. 48 (B)
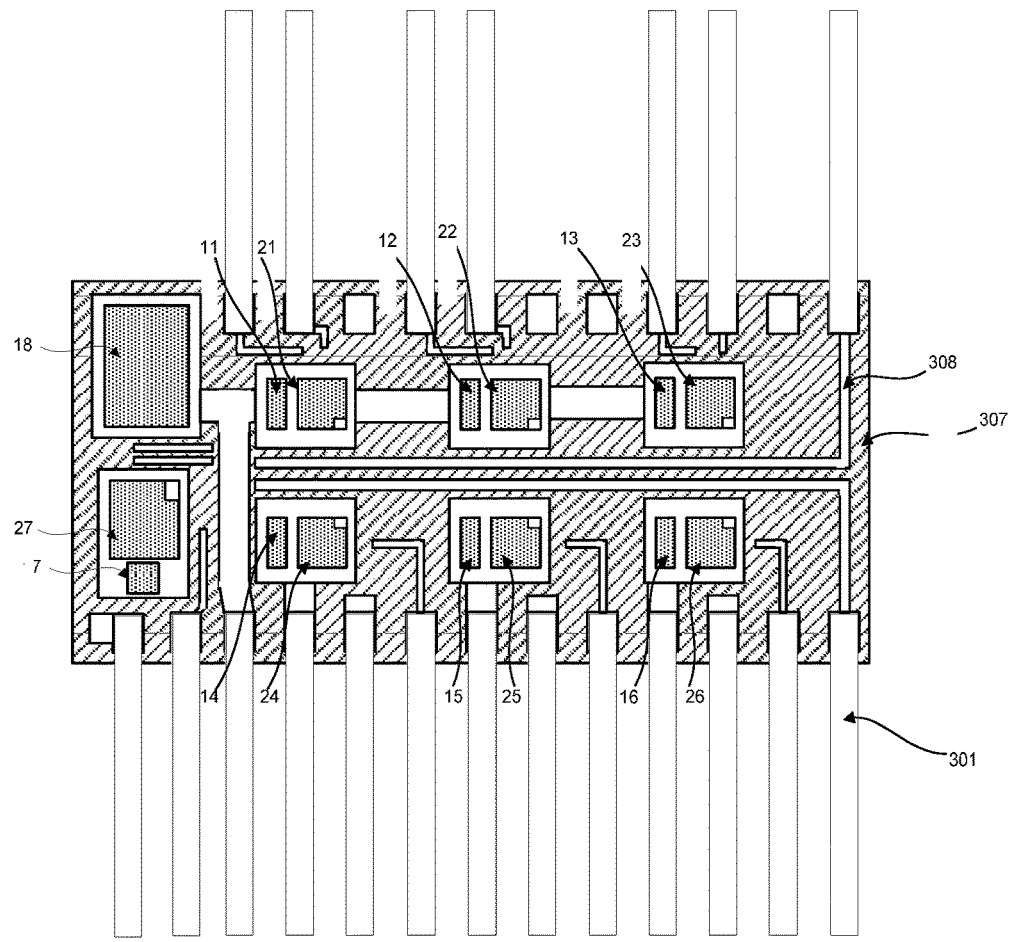
Fig 48 (AA)

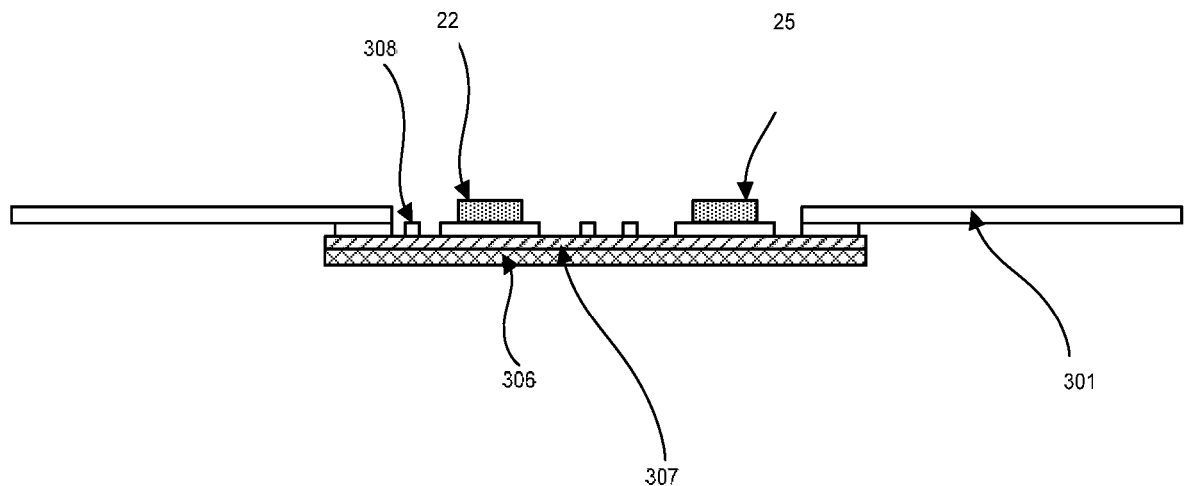
Fig 48 (BB)
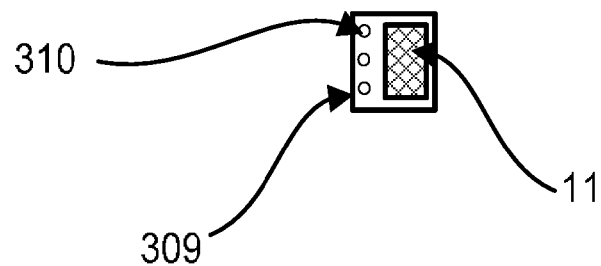
Fig 48 (C)
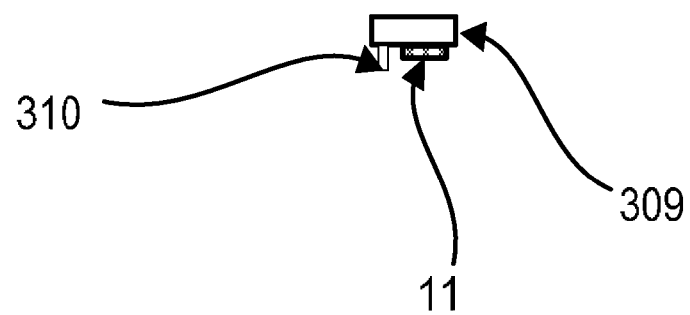
Fig .48 (D)

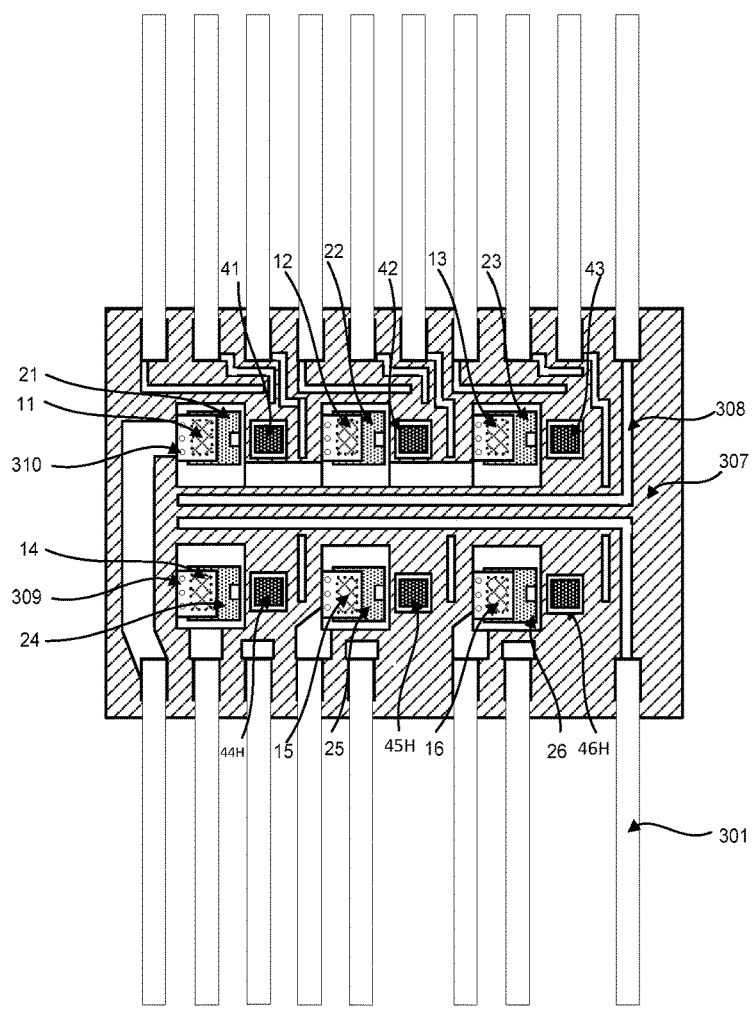
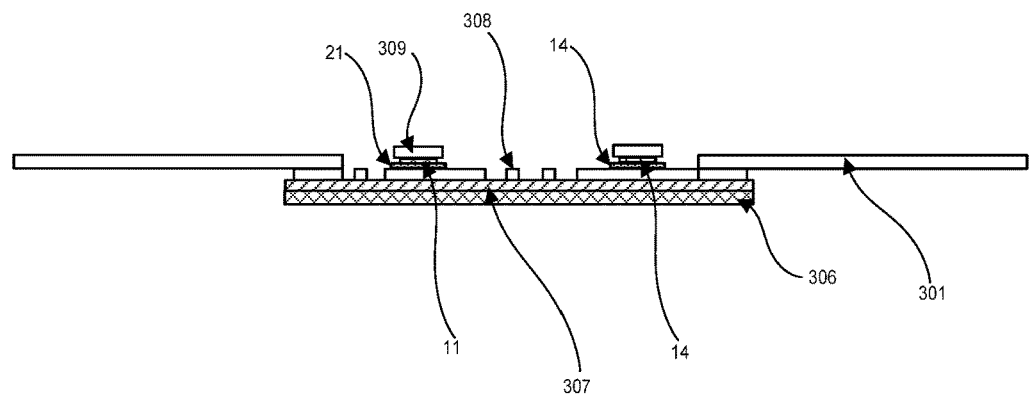
Fig. 49 (A)
Fig. 49 (B)

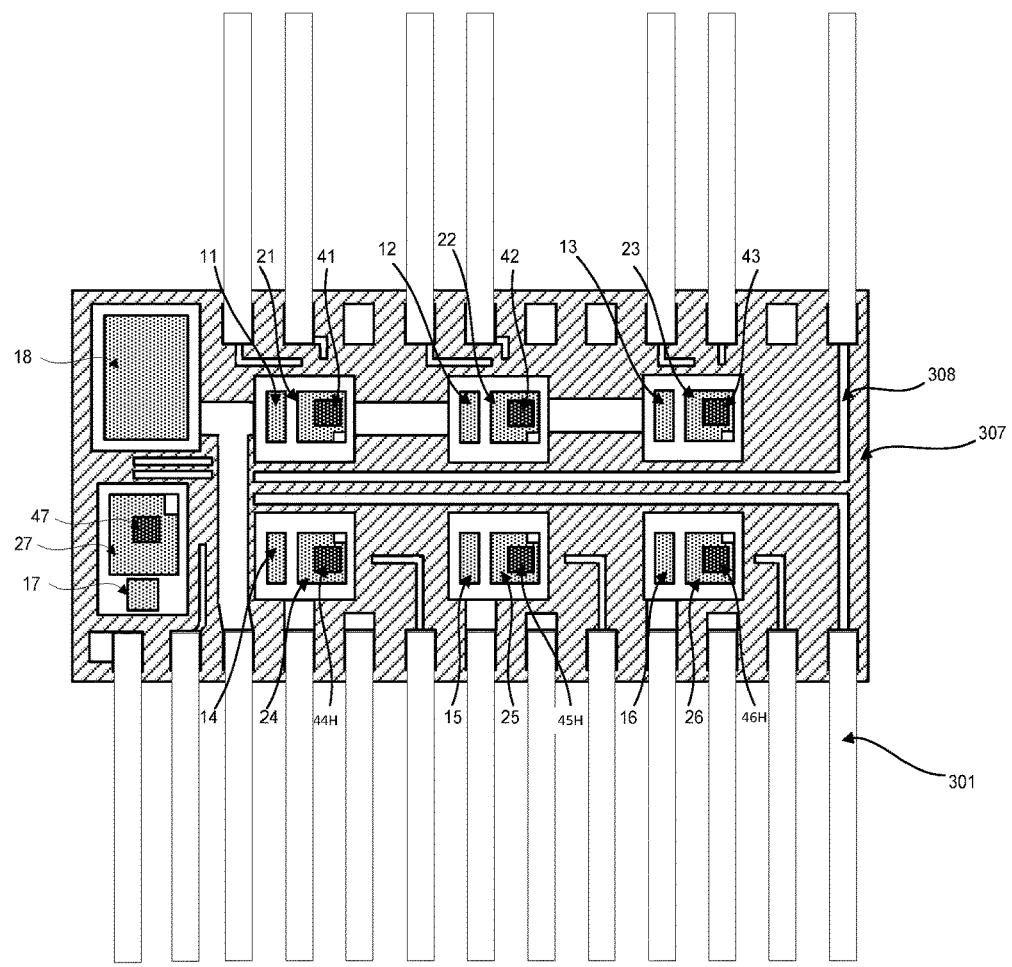
Fig. 49 (AA)
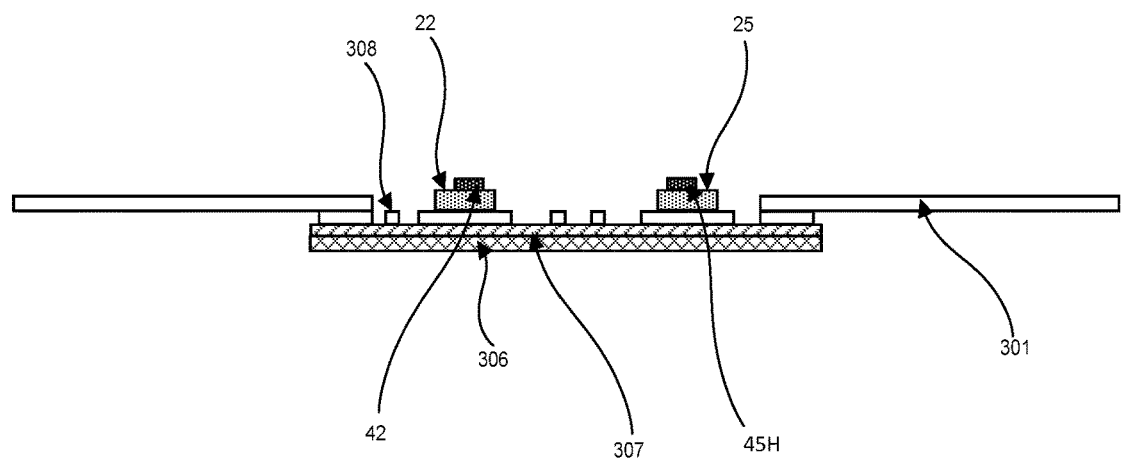
Fig. 49 (BB)

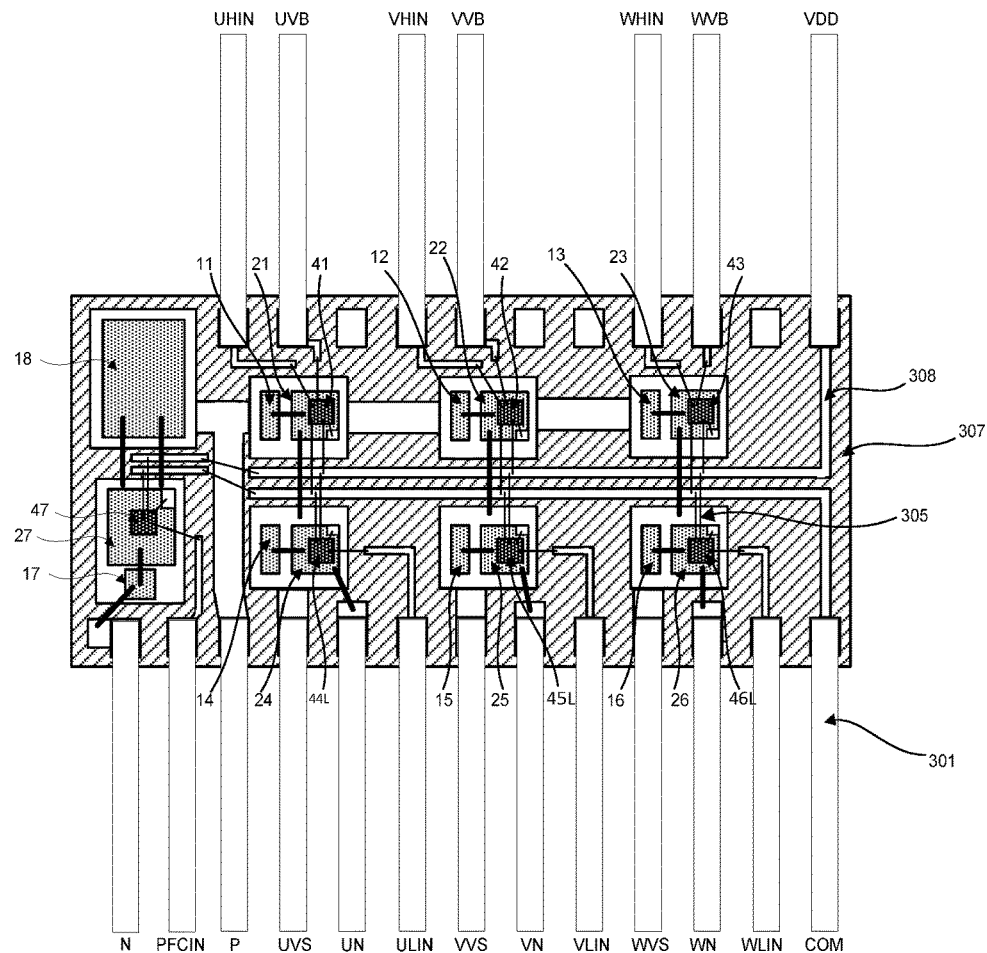
Fig. 50 (AA)
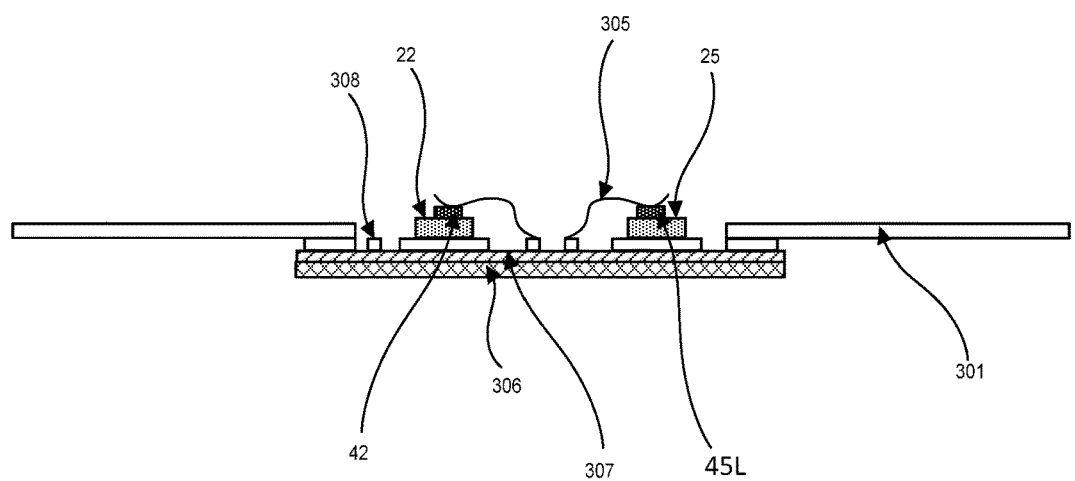
Fig. 50 (BB)

INTELLIGENT POWER MODULE AND MANUFACTURING METHOD THEREOF

CROSS-REFERENCE TO RELATED APPLICATION

This application is a national phase entry under 35 USC § 371 of International Application PCT/CN2016/077143, filed Mar. 23, 2016, which claims priority to and benefits of Chinese Patent Applications Serial No. 201510128550.6, 201520166443.8, 201520167653.9, 201510128312.5, 201520166339.9, 201510130308.2, 201510129209.2, 201510130426.3, 201510130307.8, 201510129237.4, 201510129283.4 and 201510130088.3, filed with the State Intellectual Property Office of P. R. China on Mar. 23, 2015, the entire contents of which are incorporated herein by reference.

FIELD

The present disclosure relates to a field of electronic device manufacturing processes, and more particularly to an intelligent power module and a manufacturing method thereof.

BACKGROUND

An intelligent power module, i.e., an IPM, is a power driving product which combines a power electronic technology with an integrated circuit technology. The intelligent power module integrates a power switching device with a high voltage drive circuit, and is provided with a fault detection circuit for overvoltage, overcurrent, overheating and the like therein. The intelligent power module, on one hand, receives a control signal of MCU to drive a follow-up circuit to operate, and on the other hand, sends a status detection signal back to the MCU. Compared with a traditional discrete scheme, the intelligent power module wins a more and more bigger market due to its advantages such as high integration density, high reliability and the like, which is in particular suitable for a frequency converter of a drive motor and various inverter power sources, and is an ideal power electronic device for frequency conversion and speed governing, metallurgical machinery, electric traction, servo drive and inverter appliances.

Since the intelligent power module generally operates in a high temperature environment and a power component in the intelligent power module may emit a large amount of heat during its operation, resulting in a high junction temperature in the power device. Although a circuit base board may serve to dissipate heat, however due to existence of an insulating layer, an overall thermal resistance of the intelligent power module is high. A long-term high temperature environment may seriously reduce a service life of the intelligent power module, and may influence stability of properties of the intelligent power module. Particularly under an extreme case, it may lead to an incontrollable blast of the intelligent power module due to the overheating of an interior component during the operation, causing personal casualties and property damages.

The power devices of the intelligent power module may emit a large amount of heat during the operation, resulting in the high junction temperature of the power components. Though the circuit base board may serve to dissipate heat, however due to existence of the insulating layer, the overall thermal resistance of the intelligent power module is high. Moreover, due to heat conduction of the circuit base board, heat of the power components is transmitted to other components, allowing electrical parameters of the other components to generate a non-negligible temperature drift.

Employing a high thermal-conductive insulating layer and adding a radiator are a principal method to solve the heat-dissipation problem of the current intelligent power module. However, on one hand, cost of the high thermal-conductive insulating layer is very high, and on the other hand, the high thermal-conductive insulating layer has high hardness as using a large amount of doping, thereby increasing the manufacturing difficulty of the intelligent power module. If the radiator is added to the interior of the intelligent power module and the power components are mounted to a surface of the radiator, on one hand, the cost of raw material may be increased, and on the other hand, the processing difficulty of the intelligent power module may be increased. If the radiator is added to the exterior of the intelligent power module, the radiator needs to be mounted to a back face of the intelligent power module, on one hand, increasing the application cost and on the other hand, increasing the assembly difficulty, both of which create difficulties for application and promotion of the intelligent power module, thereby being bad for popularization of the intelligent power module in a civilian occasion.

SUMMARY

Embodiments of the present disclosure seek to solve at least one of the problems existing in the related art to at least some extent. For that reason, an intelligent power module is provided by the present disclosure, which has good heat dissipation and a low manufacturing difficulty.

A plurality of manufacturing methods for the intelligent power module is further provided by the present disclosure.

The intelligent power module according to embodiments of the present disclosure includes: a radiator, at least part of a lower surface of the radiator defining a heat dissipating area, the heat dissipating area being provided with a heat dissipating corrugation; an insulating layer provided to an upper surface of the radiator; a circuit wiring provided to the insulating layer; and a circuit component provided to the circuit wiring and connected to the circuit wiring via a metal wire.

In the intelligent power module according to embodiments of the present disclosure, by providing the heat dissipating corrugation to the lower surface of the radiator, most heat of the circuit component is allowed to emit out rapidly, making the intelligent power module constantly operate in a low temperature environment, thereby improving electrical property and heat stability of the intelligent power module.

In some embodiments, the radiator is configured as a paper radiator having wet-type carbon composite material function or the radiator is configured as a paper radiator made from an insulating material capable of withstanding temperature of above 350° C.

In some embodiments, a plurality of heat dissipating corrugations are provided, the plurality of heat dissipating corrugations are spaced apart from each other or the plurality of heat dissipating corrugations area arranged continuously.

In some embodiments, a distance between an outer edge of the heat dissipating corrugation and an outer edge of the lower surface of the radiator is more than 1 mm.

In some embodiments, the heat dissipating area protrudes downwards to form a boss and the heat dissipating corrugation is arranged on the boss.

In some embodiments, the intelligent power module further includes a frame structure fitted over a periphery of the intelligent power module, the frame structure comprising an annular frame surrounding at a side face of the intelligent power module and an extending portion perpendicularly extending from a bottom portion of the annular frame to an inner side and in contact with a bottom portion of the radiator, thickness of the extending portion being 1 mm to 1.5 mm.

In some embodiments, a plurality of circuit wirings spaced apart from each other are provided, and the intelligent power module further comprises a plurality of pins having first ends respectively connected with the plurality of circuit wirings, and second ends connected to an exterior.

In some embodiments, an edge of at least one side of the insulating layer is provided with a plurality of welding pads, and the second ends of the plurality of pins are respectively connected with the plurality of welding pads.

In some embodiments, a thickness of the radiator in an up-down direction is 1.2 mm to 2.5 mm, and dimension of heat dissipating corrugation extending along the up-down direction is 0.3 mm to 0.7 mm.

In some embodiments, the intelligent power module further includes a sealing resin, the sealing resin completely seals the circuit wiring and the circuit component and covers the upper surface of the radiator and an area apart from the heat dissipating area.

In some embodiments, the circuit component comprises a power component and a non-power component, the power component and the non-power component both are arranged on the circuit wiring, the power component and the non-power component are electrically connected with the circuit wiring via the metal wire, the power component is opposite to the heat dissipating area, a partition portion is provided between the power component and the non-power component, the partition portion is arranged on a corresponding position on the lower surface of the radiator, a width of the partition portion is 1 mm to 5 mm.

In some embodiments, the power component includes an Insulated Gate Bipolar Transistor ("IGBT") tube and an Fast Recovery Diode ("FRD") tube connected with the IGBT tube, a bottom portion of the FRD tube is provided with a bearing tray, the FRD tube is arranged at a preset position of the IGBT tube upside down and a top portion of the FRD tube is in contact with the IGBT tube, the bearing tray is connected with the IGBT tube through the circuit wiring.

In some embodiments, a side of the bearing tray mounted with the FRD tube is provided with a flat part and is provided with one or more protrusion parts for connecting the circuit wiring at an edge away from the flat part.

In some embodiments, six power components are provided and includes three upper bridge-arm power components and three lower bridge-arm power components, the power component further includes a U-phase high voltage drive integrated tube, a V-phase high voltage drive integrated tube and a W-phase high voltage drive integrated tube correspondingly connected with the three upper bridge-arm power components respectively, and a U-phase low voltage drive integrated tube, a V-phase low voltage drive integrated tube and a W-phase low voltage drive integrated tube correspondingly connected with the three lower bridge-arm power components respectively;

The intelligent power module further includes a power factor correction circuit, the power factor correction circuit has functions of a bridge, a compressor inverter and a power factor correction or has functions of a bridge, a compressor inverter, a power factor correction and a fan inverter, the power factor correction circuit is connected with the U-phase high voltage drive integrated tube, the V-phase high voltage drive integrated tube, the W-phase high voltage drive integrated tube, the U-phase low voltage drive integrated tube, the V-phase low voltage drive integrated tube and the W-phase low voltage drive integrated tube.

In some embodiments, the three upper bridge-arm power components are configured as a first power component, a second power component and a third power component, and the three lower bridge-arm power components are configured as a fourth power component, a fifth power component and a sixth power component;

The first power component includes a first IGBT tube and a first FRD tube, the second power component includes a second IGBT tube and a second FRD tube, the third power component includes a third IGBT tube and a third FRD tube, the fourth power component includes a fourth IGBT tube and a fourth FRD tube, the fifth power component includes a fifth IGBT tube and a fifth FRD tube, and the sixth power component includes a sixth IGBT tube and a sixth FRD tube;

The U-phase high voltage drive integrated tube, the V-phase high voltage drive integrated tube, and the W-phase high voltage drive integrated tube comprise power supply terminals, input terminals, output terminals, high voltage power supply positive terminals, high voltage power supply negative terminals and ground terminals, the U-phase low voltage drive integrated tube, the V-phase low voltage drive integrated tube and the W-phase low voltage drive integrated tube comprise power supply terminals, input terminals, output terminals and ground terminals, wherein:

The input terminals of the U-phase high voltage drive integrated tube, the V-phase high voltage drive integrated tube, and the W-phase high voltage drive integrated tube are respectively configured as input terminals of a U-phase upper bridge arm, a V-phase upper bridge arm and a W-phase upper bridge arm of the intelligent power module; the input terminals of the U-phase low voltage drive integrated tube, the V-phase low voltage drive integrated tube and the W-phase low voltage drive integrated tube are respectively configured as input terminals of a U-phase lower bridge arm, a V-phase lower bridge arm and a W-phase lower bridge arm of the intelligent power module;

The power supply terminals of the U-phase high voltage drive integrated tube, the V-phase high voltage drive integrated tube, and the W-phase high voltage drive integrated tube and the power supply terminals of the U-phase low voltage drive integrated tube, the V-phase low voltage drive integrated tube and the W-phase low voltage drive integrated tube are connected and configured as a positive terminal of a low voltage area power supply of the intelligent power module, the ground terminals of the U-phase high voltage drive integrated tube, the V-phase high voltage drive integrated tube, and the W-phase high voltage drive integrated tube and the ground terminals of the U-phase low voltage drive integrated tube, the V-phase low voltage drive integrated tube and the W-phase low voltage drive integrated tube are connected and configured as a negative terminal of a low voltage area power supply of the intelligent power module, the high voltage power supply positive terminals of the U-phase high voltage drive integrated tube, the V-phase high voltage drive integrated tube, and the W-phase high voltage drive integrated tube are configured as positive terminals of a U, V, W three-phase high voltage area power supply of the intelligent power module.

The output terminal of the U-phase high voltage drive integrated tube is connected to a grid of the first IGBT tube, the high voltage power supply negative terminal of the U-phase high voltage drive integrated tube is connected with an emitter of the first IGBT tube, an anode of the first FRD tube, a collector of the fourth IGBT tube and a cathode of the fourth FRD tube and is configured as a negative terminal of a U-phase high voltage area power supply of the intelligent power module; the output terminal of the V-phase high voltage drive integrated tube is connected with a grid of the second IGBT tube, the high voltage power supply negative terminal of the V-phase high voltage drive integrated tube is connected with an emitter of the second IGBT tube, an anode of the second FRD tube, a collector of the fifth IGBT tube and a cathode of the fifth FRD tube and is configured as a negative terminal of a V-phase high voltage area power supply of the intelligent power module; the output terminal of the W-phase high voltage drive integrated tube is connected with a grid of the third IGBT tube, the high voltage power supply negative terminal of the W-phase high voltage drive integrated tube is connected with an emitter of the third IGBT tube, an anode of the third FRD tube, a collector of the sixth IGBT tube and a cathode of the sixth FRD tube and is configured as a negative terminal of a W-phase high voltage area power supply of the intelligent power module;

A collector of the first IGBT tube, a cathode of the first FRD tube, a collector of the second IGBT tube, a cathode of the second FRD tube, a collector of the third IGBT tube and a cathode of the third FRD tube are connected and configured as a high voltage input terminal of the intelligent power module;

The output terminal of the U-phase low voltage drive integrated tube is connected with a grid of the fourth IGBT tube, an emitter of the fourth IGBT tube and an anode of the fourth FRD tube are connected and configured as a U-phase low voltage reference terminal of the intelligent power module, the output terminal of the V-phase low voltage drive integrated tube is connected with a grid of the fifth IGBT tube, an emitter of the fifth IGBT tube and an anode of the fifth FRD tube are connected and configured as a V-phase low voltage reference terminal of the intelligent power module, the output terminal of the W-phase low voltage drive integrated tube is connected with a grid of the sixth IGBT tube, an emitter of the sixth IGBT tube and an anode of the sixth FRD tube are connected and configured as a W-phase low voltage reference terminal of the intelligent power module.

In some embodiments, the power factor correction circuit includes a high speed IGBT tube, a high power FRD tube, a small power FRD tube and a first low voltage drive integrated tube.

The first low voltage drive integrated tube includes an input terminal, an output terminal, a power supply terminal and a ground terminal.

The input terminal of the first low voltage drive integrated tube is configured as an input terminal of the power factor correction circuit; the power supply terminal of the first low voltage drive integrated tube is configured as a power supply terminal of the power factor correction circuit; the ground terminal of the first low voltage drive integrated tube is configured as a ground terminal of the power factor correction circuit.

The input terminal of the first low voltage drive integrated tube is connected with a grid of the high speed IGBT tube, an emitter of the high speed IGBT tube is connected with an anode of the small power FRD tube, a collector of the high speed IGBT tube is connected with a cathode of the small power FRD tube and an anode of the high power FRD tube.

In the manufacturing method of the intelligent power module according to embodiments of the present disclosure, the intelligent power module is configured as the above-mentioned intelligent power module, the manufacturing method includes the following steps of:

S10: fabricating a radiator, and forming a heat dissipating corrugation on a lower surface of the radiator, and covering an upper surface of the radiator with an insulating layer;

S20: laying out a circuit wiring on a surface of the insulating layer;

S30: mounting a circuit component and a pin to a corresponding position of the circuit wiring;

S40: connecting the circuit wiring and the circuit component via a metal wire;

S50: coating a sealing layer on the surface of the insulating layer, to cover the circuit wiring, the circuit component and the metal wire;

S60: providing a waterproof layer on the lower surface of the radiator; and

S70: performing a module functional test on the intelligent power module, the module functional test including an insulation and voltage resistance test, a static power test and a delay time test.

In some embodiments, the step S10 further includes the following substeps of:

S11: according to a set circuit layout, choosing a wet-type carbon composite material with a predetermined dimension to form a paper radiator;

S12: forming a through hole at an appointed position between the circuit wirings, the through hole runs through the insulating layer and the radiator;

S13: using an insulating material and copper material on a front face of the radiator, and by means of hot pressing, making the insulating material formed on the surface of the radiator as the insulating layer, and making the copper material formed on the surface of the insulating layer as a copper clad layer;

S14: corroding a particular position on the copper clad layer, and making the rest part formed as the circuit wiring and a welding pad; and S15: forming the corrugation with the wet-type carbon composite material, and adhering the corrugation to a back face of the radiator via high temperature resistant glue.

In some embodiments, the step S50 further includes the following substeps of:

S51: arranging a thermosetting resin frame around the surface of the insulating layer;

S52: injecting a thermoplastic resin in the range of the thermosetting resin frame and in the through hole so as to seal the circuit wiring, the circuit component and the metal wire;

S53: trimming and shaping the pin and sealing the position on the back face of the radiator that is not covered with the corrugation by using the sealing resin.

In some embodiments, the step S30 of preforming the pin before mounting the circuit component to the corresponding position of the circuit wiring, further includes the following substeps of:

S31: choosing copper base material, and forming a row of pins by stamping or etching of the copper base material, the pins being connected to each other by a reinforcing rib; and S32: forming a nickel layer and a nickel-tin alloy layer in sequence on a surface of the pin, to acquire the pin with a clad layer.

The step S40 further includes the following substeps of:

S41: welding the circuit component to the circuit wiring by reflow soldering;

S42: eliminating soldering flux residues on the insulating layer;

S43: connecting the circuit wiring and the circuit component by using the metal wire.

In some embodiments, the radiator is the paper radiator, the step of covering the front face of the radiator with the insulating layer and forming the circuit wiring and the welding pad on the surface of the insulating layer includes:

S'10: according to a set circuit layout, choosing a wet-type carbon composite material with a predetermined dimension to form a paper radiator;

S'20: using an insulating material and copper material on a front face of the radiator, and by means of hot pressing, making the insulating material formed on the surface of the radiator as the insulating layer, and making the copper material formed on the surface of the insulating layer as a copper clad layer;

S'30: corroding a particular position on the copper clad layer, and making the rest part formed as the circuit wiring and a welding pad;

S'40: forming a partition portion on a back face of the radiator, and fixing the preformed heat dissipating corrugation to the position on the back face of the radiator corresponding to the power component, in which S'40 includes S'41 of removing the material on the particular position of the back face of the paper radiator by means of cutting, tearing, corroding or the like, to form the partition portion.

S'50: forming the corrugation with the wet-type carbon composite material, and adhering the corrugation to the position on the back face of the radiator corresponding to the power component by means of high temperature resistant glue.

In the manufacturing method of the intelligent power module according to embodiments of the present disclosure, the intelligent power module is configured as the abovementioned intelligent power module, the manufacturing method includes the following steps of:

T10: manufacturing a radiator and a pin, and flatting an upper surface of the radiator;

T20: arranging an insulating layer on the upper surface of the radiator, and forming a circuit wiring on an upper surface of the insulating layer;

T30: arranging a circuit component and the pin connected to an exterior on the circuit wiring respectively, arranging a heat dissipating area to a lower surface of the radiator, and defining a heat dissipating corrugation in the heat dissipating area;

T40: connecting the circuit component with the circuit wiring via a metal wire; and T50: baking the radiator and molding a sealing resin, shaping the pin to acquire the intelligent power module.

In the manufacturing method of the intelligent power module according to embodiments of the present disclosure, the intelligent power module is configured as the abovementioned intelligent power module, the manufacturing method includes the following steps of:

P10: manufacturing a radiator and a pin, flatting an upper surface of the radiator, and arranging a heat dissipating corrugation to a lower surface of the radiator;

P20: arranging an insulating layer on the upper surface of the radiator, and arranging a circuit wiring on an upper surface of the insulating layer;

P30: arranging a circuit component and the pin connected to an exterior on the circuit wiring;

P40: connecting the circuit component with the circuit wiring via a metal wire;

P50: baking the radiator and molding a sealing resin, shaping the pin to acquire the intelligent power module.

In some embodiments, the step P30 further includes a step of cleaning the radiator;

In the Step P50, the radiator is baked in an oxygen-free environment, baking time is more than 2 hours and baking temperature is 110° C. to 140° C.

The manufacturing method of the intelligent power module according to embodiments of the present disclosure includes:

Q10: forming a radiator;

Q20: taking the radiator as a power module base material, and forming an insulating layer at one side of the power module base material;

Q30: forming a welding area and a pin at one side of the insulating layer not in contact with the radiator;

Q40: mounting at least one power component in a power welding area of the welding area; and Q50: forming a sealing layer to complete the fabricating of the intelligent power module.

In some embodiments, the welding area also includes a non-power welding area, at least one non-power component is mounted in the non-power welding area, The step Q10 includes a step Q11 of forming the radiator by means of a wet-type carbon composite layer;

The step Q30 includes a step Q31 of forming a heat dissipating corrugation at one side of the radiator not in contact with the insulating layer, the heat dissipating corrugation is corresponding to the area where the at least one non-power component is;

The step Q40 includes:

Q41: coating a first solder paste layer on the power welding area;

Q42: after mounting the at least one power component in the power welding area, processing reflow soldering on the first solder paste layer to solidify the first solder paste layer;

Q43: coating a second solder paste layer on the non-power welding area;

Q44: after mounting the at least one non-power component in the non-power welding area, processing reflow soldering on the solder paste layer by means of the reflow soldering to solidify the second solder paste layer; and Q45: making the radiator subject to a cleaning treatment, in which the cleaning treatment includes a spraying treatment and/or an ultrasonic cleaning treatment.

In some embodiment, the step Q30 includes:

Q'31: forming a metal seed layer at one side of the insulating layer not in contact with the radiation layer, in which, a thickness of the metal seed layer is 0.01 to 0.1 micrometers;

Q'32: making the seed layer subject to an electroplating treatment to form a circuit wiring, in which, a thickness of the circuit wiring is 1 to 5 micrometers;

Q'33: etching the circuit wiring to form the welding area, the pin and the welding pad; and Q'34: connecting a metal wire between the welding area, the pin and the welding pad.

BRIEF DESCRIPTION OF THE DRAWINGS

FIG. 1 (a) is a bottom view of an intelligent power module provided according to embodiments of the present disclosure;

FIG. 2 (a) is a schematic view of an intelligent power module provided according to embodiments of the present disclosure;

FIG. 2 (b) is a schematic view of an intelligent power module provided according to embodiments of the present disclosure;

FIG. 6 (a) is a schematic view illustrating that a circuit wiring is formed on a copper clad layer after an insulating layer and the copper clad layer are formed on a front face of a radiator;

FIG. 6 (b) is a schematic view illustrating that a through hole is defined on a circuit wiring of an intelligent power module according to embodiments of the present disclosure;

FIG. 6 (c) is a schematic view illustrating an intelligent power module according to embodiments of the present disclosure with a sealing resin removed;

FIG. 12 (a) is a top view schematically illustrating a process for mounting a circuit component and a pin to a circuit wiring;

FIG. 13 (a) is a schematic view of an intelligent power module provided according to embodiments of the present disclosure;

FIG. 15 (a) is a schematic view of an intelligent power module according to embodiments of the present disclosure;

FIG. 15 (aa) is a schematic view of an intelligent power module according to embodiments of the present disclosure;

FIG. 15 (b) is a schematic view of an intelligent power module according to embodiments of the present disclosure;

FIG. 15 (bb) is a schematic view of an intelligent power module according to embodiments of the present disclosure;

FIG. 15 (c) is a schematic view of an intelligent power module according to embodiments of the present disclosure;

FIG. 15 (cc) is a schematic view of an intelligent power module according to embodiments of the present disclosure;

FIG. 15 (d) is a schematic view of an intelligent power module according to embodiments of the present disclosure;

FIG. 17 (a) is a schematic view of an intelligent power module according to embodiments of the present disclosure;

FIG. 17 (b) is a schematic view of an intelligent power module according to embodiments of the present disclosure;

FIG. 18 (a) is a schematic view of an intelligent power module according to embodiments of the present disclosure;

FIG. 21 (a) is a top view of an intelligent power module according to embodiments of the present disclosure, in which a sealing resin is removed;

FIG. 28 (a) is a schematic view of a pin with an arc of an intelligent power module according to embodiments of the present disclosure;

FIG. 32 (a) is a schematic view of an intelligent power module according to embodiments of the present disclosure;

FIG. 32 (b) is a schematic view of an intelligent power module according to embodiments of the present disclosure;

FIG. 36 is a cross sectional view taken along a line X-X' in FIG. 35;

FIG. 37 is a flow chart of a manufacturing method of an intelligent power module according to embodiments of the present disclosure;

FIG. 46 (B) is a top view of an intelligent power module of embodiments of the present disclosure;

FIG. 46 (C) is a cross sectional view taken along a line X-X' of FIG. 46 (B);

FIG. 46 (D) is a front top view illustrating an intelligent power module with a sealing resin removed according to embodiments of the present disclosure;

FIG. 46 (AA) is a circuit diagram of a preferable embodiment of an intelligent power module of the present disclosure;

FIG. 46 (BB) is a top view of a preferable embodiment of an intelligent power module of the present disclosure;

FIG. 46 (CC) is a cross sectional view taken along a line X-X' of FIG. 46 (BB);

FIG. 46 (DD) is a front top view illustrating an intelligent power module with a sealing resin removed according to embodiments of the present disclosure;

FIG. 47 (B) is a side view of FIG. 47 (A);

FIG. 48 (B) is a side view of FIG. 48 (A);

FIG. 48 (AA) is a top view illustrating that an IGBT tube, an FRD tube and a pin are mounted to a circuit wiring in a second process of embodiments of the present disclosure;

FIG. 48 (BB) is a side view of FIG. 48 (AA);

FIG. 48 (C) is a bottom view of a bearing tray in a second process of embodiments of the present disclosure;

FIG. 48 (D) is a front view of a bearing tray in a second process of embodiments of the present disclosure;

FIG. 49 (A) is a top view illustrating that an FRD tube is mounted to an emitter of an IGBT tube in a third process of embodiments of the present disclosure;

FIG. 49 (B) is a side view of FIG. 49 (A);

FIG. 49 (AA) is a top view illustrating that a high voltage drive integrated tube and a low voltage drive integrated tube are mounted to an emitter of an IGBT tube in a third process of embodiments of the present disclosure;

FIG. 49 (BB) is a side view of FIG. 49 (AA);

FIG. 50 (B) is a side view of FIG. 50 (A);

FIG. 50 (AA) is a top view illustrating that a power component, a non-power component, a radiator and a circuit wiring are connected via a metal wire in a fourth process of embodiments of the present disclosure;

FIG. 50 (BB) is a side view of FIG. 50 (AA);

FIG. 51 (A) is a cross sectional view illustrating that a paper radiator is sealed by a sealing resin through a mold in a fifth process of embodiments of the present disclosure;

FIG. 52 (B) is a schematic view illustrating that a heat dissipating corrugation is mounted in a sixth process of embodiments of the present disclosure;

FIG. 53 (A) is a flow chart of a manufacturing method of an intelligent power module according to embodiments of the present disclosure;

DETAILED DESCRIPTION

Figure 1:
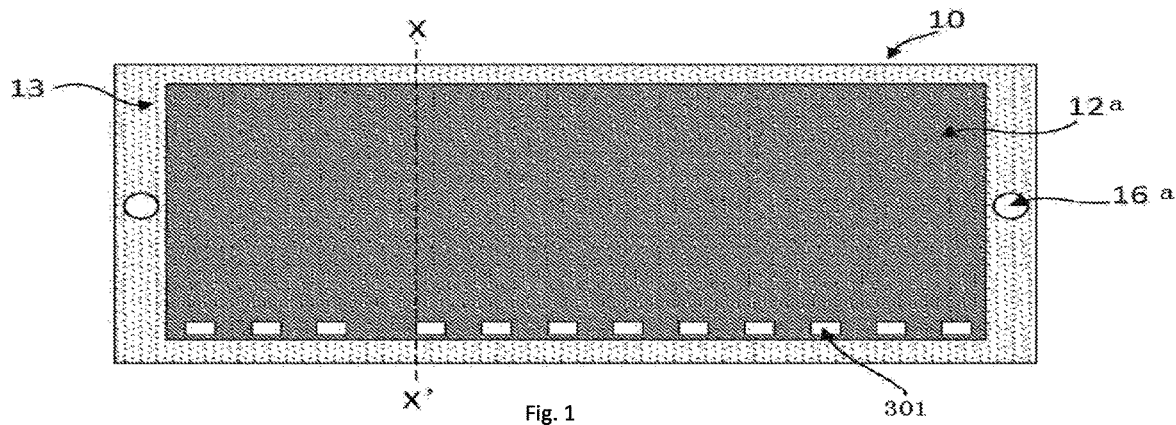
FIG. 1 is a top view of an intelligent power module provided according to embodiments of the present disclosure.
Figure 1A:
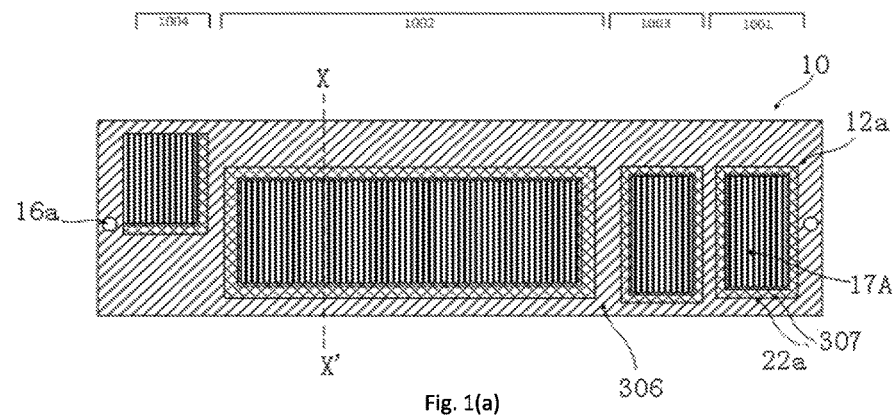

Embodiments of the present disclosure will be described in detail in the following and examples of the embodiments will be shown in drawings, in which the same or similar elements and the elements having same or similar functions are denoted by like reference numerals throughout the descriptions. The embodiments described herein with reference to drawings are explanatory, and used to generally understand the present disclosure. The embodiments shall not be construed to limit the present disclosure.

Figure 54:
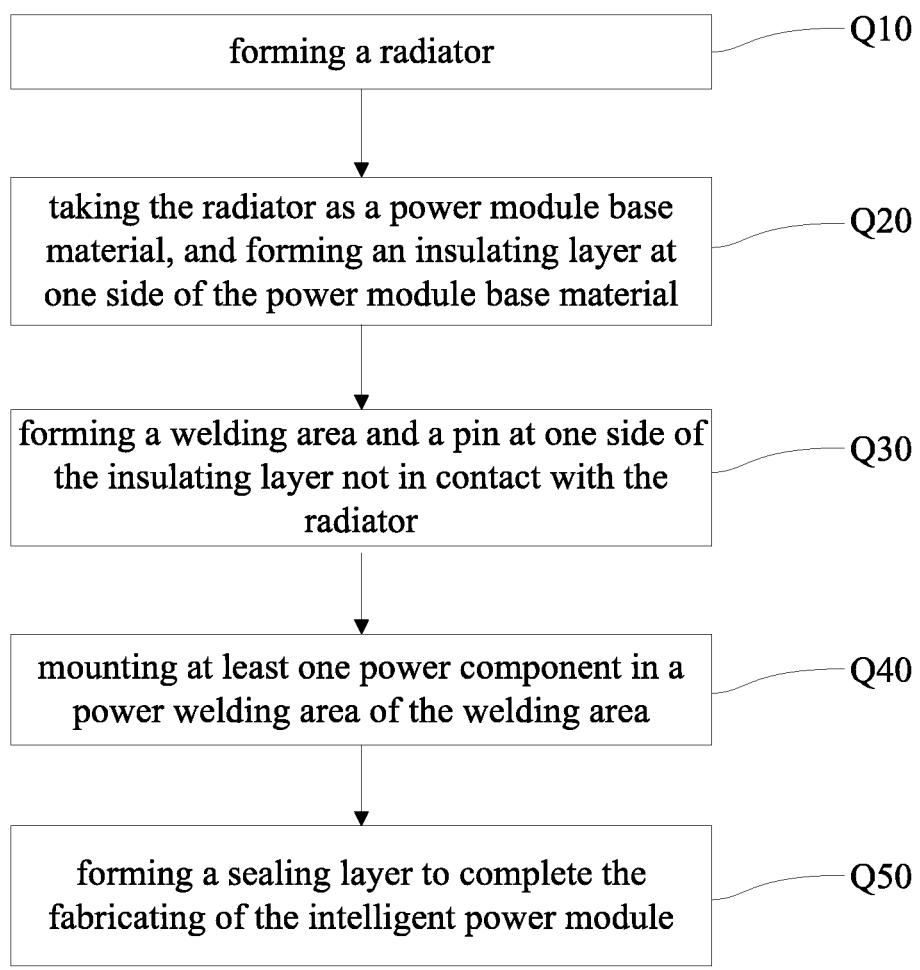
FIG. 54 is a flow chart of a manufacturing method of an intelligent power module according to embodiments of the present disclosure.

An intelligent power module 10 according to embodiments of the present disclosure will be described in detail in the following with reference to FIGS. 1-54.

As shown in FIGS. 1-42, the intelligent power module 10 according to embodiments of the present disclosure includes a radiator 306, an insulating layer 307, a circuit wiring 308, a circuit component and a metal wire 305.

Specifically, at least part of a lower surface of the radiator 306 defines a heat dissipating area 17B, the heat dissipating area 17B is provided with a heat dissipating corrugation 17A, the insulating layer 307 is arranged on an upper surface of the radiator 306. The circuit wiring 308 is arranged on the insulating layer 307, the circuit component is arranged on the circuit wiring 308 and is connected to the circuit wiring 308 via a metal wire 305.

In the intelligent power module 10 according to embodiments of the present disclosure, by providing the heat dissipating corrugation 17A to the lower surface of the radiator 306, most heat of the circuit component is allowed to emit out rapidly, making the intelligent power module 10 constantly operate in a low temperature environment, thereby improving electrical property and heat stability of the intelligent power module 10.

Figure 2:
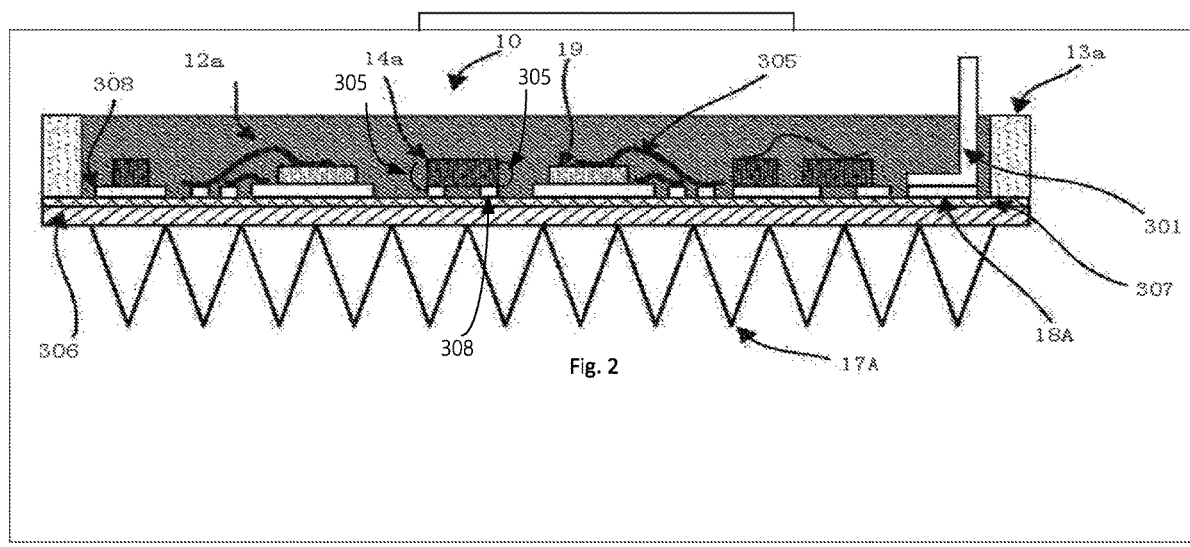
FIG. 2 is a cross sectional view taken along a line X-X' in FIG. 1.
Figure 2A:
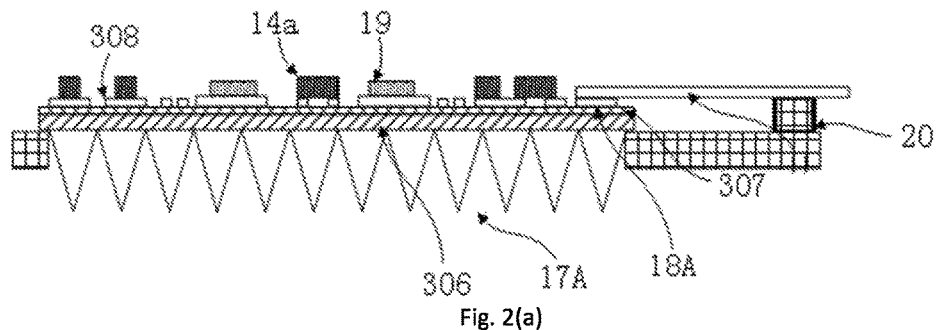

In combination with FIGS. 1 and 2, the intelligent power module 10 according to embodiments of the present disclosure has a pin 301, a sealing layer 12a, the metal wire 305, the radiator 306, the circuit wiring 308, the insulating layer 307 and the circuit component. The circuit component includes a power component 19 and a non-power component 14a. The radiator 306 is a paper radiator, the lower surface of the radiator 306 is provided with a mass of heat dissipating corrugation 17A, and the upper surface of the radiator 306 is provided with the insulating layer 307. The circuit wiring 308 is mounted to a surface of an insulation layer 307 and includes a welding pad 18A arranged adjacently to a surface edge of the radiator 306. The metal wire 305 is configured to, according to a circuit schematic diagram, form a circuit connection between the circuit wirings 308, between the circuit components and between the circuit wiring 308 and the circuit component. The sealing layer 12a includes a thermosetting resin frame 13a and a thermoplastic resin injected within the range of the thermosetting resin frame 13a, to seal the circuit and completely cover all components on the upper surface of the radiator 306.

In the present embodiment, the radiator 306 is made from an insulating material capable of withstanding a high temperature above 350° C., for example, a wet-type carbon composite functional paper. Graphite paper may be formed by powdery and fibrous carbon materials through a combined machining, and may be folded into any shapes according to needs, to acquire the heat dissipating corrugation 17A. In order to improve corrosion resistance and waterproofness, the surface may be subject to waterproof treatment, that is, the lower surface of the radiator 306 is covered with a waterproof layer (not shown in drawings). In the present embodiment, the radiator 306 and the heat dissipating corrugation 17A are integrally formed, in which the radiator 306 has a regular shape and the heat dissipating corrugation 17A has an irregular shape. The radiator 306 and the heat dissipating corrugation 17A may be configured as the wet-type carbon composite materials with different thickness, and the way of different thickness is adopted by the present embodiment. In order to increase mechanical strength, the radiator 306 adopts a thicker wet-type carbon composite material, of which the thickness may be designed to be 1.5 mm, and in order to lower cost and increase corrugation density, the heat dissipating corrugation 17A adopts a thinner wet-type carbon composite material, of which the thickness may be designed to be 0.5 mm. In this case, one side of the radiator 306 which is provided with the heat dissipating corrugation 17A may be called as a back face (i.e., the lower surface), and an opposite side may be called as a surface of the radiator 306 (the upper surface).

In actual application, the heat dissipating corrugation 17A may not completely cover the back face of the radiator 306. An edge of the back face of the radiator 306 needs to set aside a flattening space of at least 2 mm, and a short side of the rectangular radiator 306 may define a mounting hole 16a of which the diameter is at least 1 mm.

The insulating layer 307 is made on basis of a common insulating material, and dopants such as silicon dioxide, silicon nitride, silicon carbide and the like may be added to improve thermal conductivity. In this case, the dopants may be spherical or angular in shape, which is fitted with the surface of the radiator 306 by means of hot pressing, and location of the mounting hole 16a on the radiator 306 is exposed.

The circuit wiring 308 is constituted by metal such as copper and the like, and is formed at a corresponding position (the position is designed according to a circuit schematic diagram) on the insulating layer 307. According to power requirement, the thickness may be designed to be 0.035 mm or 0.07 mm, and may be designed to be 0.07 mm with respect to a general intelligent power module. The thickness of 0.07 mm is adopted in the present embodiment. In addition, an edge of the insulating layer 307 is provided with the welding pad 18A constituted by the circuit wiring 308. A plurality of welding pads 18A aligned with each other are provided adjacently to one edge of the insulating layer 307, and according to function requirement, a plurality of welding pads 18A aligned with each other may be provided adjacently to a plurality of edges of the insulating layer 307.

The power component 19 and the non-power component 14a are fixed to the circuit wiring 308 to constitute a prescribed circuit. In this case, the power component 19 may adopt an IGBT tube, a high voltage MOSFET tube, a high voltage FRD tube and the like. The power component 19 is connected to the circuit wiring 308 via the metal wire 305. The non-power component 14a adopts an active component such as an integrated circuit, a transistor or a diode or the like, or a passive component such as a capacitor or a resistor or the like, the active component or the like which is mounted face up are connected to the circuit wiring 308 via the metal wire 305.

The metal wire 305 may be an aluminum wire, a gold wire or a copper wire, which allows electrical connections between the power components 19, between the non-power components 14a, and between the circuit wirings 308 through binding, and is sometimes used to allow electrical connections between the pin 301 and the circuit wiring 308 or the power component 19, or the non-power component 14a.

The pin 301 is fixed to the welding pad 18A at one or more edges of the radiator 306, and is configured to, for example, input from or output to the outside. In this case, one side is designed to have a plurality of pins 301 thereon, the pins 301 are welded to and the welding pad 18A by a conductive electrical adhesive such as a tin solder, allowing the pins 301 to connect with the welding pads 18A and to extend outwards from the radiator 306. The pins 301 are generally made from metal such as copper. A nickel-tin alloy layer is formed on a surface of the copper by chemical plating and electroplating, thickness of the alloy layer is generally 5 μm. A clad layer may protect the copper from corrosion and oxidation, and may improve weldability.

Given that, in a specific occasion such as an inverter air-conditioner, a high thermal-conductive insulating layer and an added radiator may solve the heat-dissipation problem of the intelligent power module. However, employing a high thermal-conductive insulating layer to dissipate heat, on one hand, cost is very high, and on the other hand, the intelligent power module has high hardness as the high thermal-conductive insulating layer using a large amount of doping, thereby increasing the manufacturing difficulty of the intelligent power module. If the radiator is added to the interior of the intelligent power module and the power components are mounted to a surface of the radiator, on one hand, the cost of raw material may be increased, and on the other hand, the processing difficulty of the intelligent power module may be increased. If the radiator is added to the exterior of the intelligent power module, the radiator needs to be mounted to the back face of the intelligent power module, in this case, because there are other heating components on the application circuit cooperating with the intelligent power module, if mounting one radiator for all the heating components, area of the radiator may be increased, thereby improving the application cost, and if mounting the radiator for the respective heating components, the assembly difficulty may be increased. Thus choosing the intelligent power module and adding the radiator both create difficulties for application and promotion of the intelligent power module, thereby being bad for popularization of the intelligent power module in a civilian occasion.

Based on the above considerations, in the embodiments of the present disclosure, by introducing a paper radiator, a partition portion is formed on the back face of the paper radiator and the heat dissipating corrugation is arranged to a position corresponding to the power component. The insulating layer, the circuit wiring, the power component, the non-power component and the like are formed on the front face of the paper radiator, and an orderly processing is completed. As weight of the paper radiator is lighter, requirement for a carrier during the processing is lower, positioning is easier, thereby reducing manufacturing cost, improving the process qualification rate. The process for mounting the power component to the interior of the radiator is omitted, thereby reducing the investment fees for the devices. In addition, as the back face of the paper radiator is provided with the heat dissipating corrugation, the heat dissipating area increases greatly, moreover due to existence of the partition portion, thermal crosstalk among groups of the power components having different functions greatly reduces, the heat of heating parts are different from each other but rarely transmits to one another, and instead is dissipated through the heat dissipating corrugation. Under the premise of using the common insulating layer, the heating components of the intelligent power module and an application platform thereof may acquire a good heating dissipation effect, and thermal interference between heat sources is little, allowing the properties of the intelligent power module steady, thereby improving the reliability of the intelligent power module. Besides, the paper radiator is easy to transport.

A partition portion 202a is provided to the back face of the radiator 306, the partition portion 202a is formed by removing the heat dissipating material at a particular position on the back face of the radiator, the removal may be partly as well as be completely to expose the insulating layer 307. To achieve a better heat dissipating effect, the present embodiment adopts the manner of complete removal.

Herein, the corrugation 17A is arranged below the power component 19, and there is no power component 19 above the partition portion 202a. The heat dissipating corrugation 17A is located at the back face of the power component 19 to be surrounded by the partition portion 202a, and has a distance of at least 2 mm from the edge of the short side on the back face of the paper radiator 306, to ensure a through hole 16 uncovered.

The partition portion 202a is configured as a hollow formed by caverning the paper radiator 306. The partition portion is located between the groups of heating power components of functional circuits, such that the heat may not transmit through the high thermal-conductive paper radiator 306. The width of the partition portion 202a is determined according to a distance between the groups of heating power components. In general, in order to reach a thermal partition effect, the width of the partition portion 202a should not be less than 1 mm, and in order to increase mechanical strength of the paper radiator 306, the width of the partition portion 202a should not be more than 5 mm. Besides, in the partition portion 202a, the paper radiator 306 may be removed completely, to expose the insulating layer 307 and as well, only the most of the paper radiator 306 may be removed and an extremely thin layer combined with the insulating layer 307 may be retained. In some embodiments, the method of complete removal is adopted.

A bridge and a drive part of a compressor inverter, a drive part of a power factor correction, a drive part of a fan inverter and the other control parts (including the non-power component 14a and the like) are separated from each other by the partition portion 202a, such that not only the thermal interference between the heating components is low, the most heat is dissipated by the corrugation 17A, but also the temperature of the control parts keeps at a low state, avoiding the properties of the intelligent power module 10 from declining due to a temperature drift of the control parts. In addition, it is preferable that a binding point of the metal wire 305 is not arranged above the partition portion 202.

Figure 43:
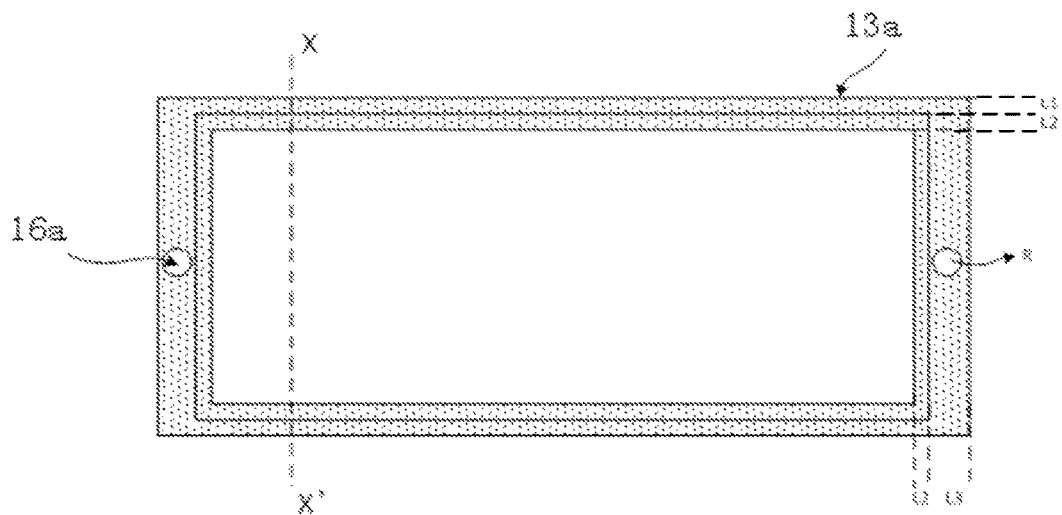
FIG. 43 is a schematic view of a separate frame structure.
Figure 44:
FIG. 44 is a cross sectional view taken along a line X-X' in FIG. 43.
Figure 45:
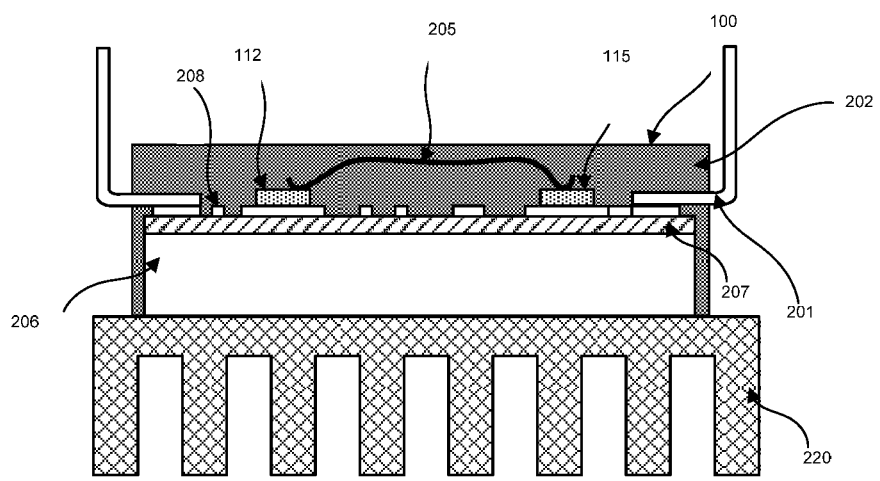
FIG. 45 is a schematic view illustrating that an existing intelligent power module is mounted to an aluminum radiator.

As shown in FIGS. 43-44, the intelligent power module 10 further includes a frame structure 13 fitted over the periphery of the intelligent power module 10, the frame structure 13 may be configured as a thermosetting resin frame, and includes an annular frame surrounding at a side face of the intelligent power module and an extending portion formed by perpendicularly extending from a bottom of the annular frame to an inner side and contacting with the bottom of the radiator. Thickness of the extending portion is 1 mm-1.5 mm.

The thermosetting resin frame 13a is formed by transfer molding, dimension of an outer edge of the thermosetting resin frame 13a is equivalent to or little less than that of the radiator 306. In application, distance between an inner edge and the outer edge of the thermosetting resin frame 13a is not less than 1.5 mm, and the mounting hole 16a is defined in the short side of the rectangular thermosetting resin frame 13a, to mount the intelligent power module 10, in which the position and diameter of the mounting hole 16a are the same as those of the radiator 306.

The sealing layer 12a is molded by injection molding with the thermoplastic resin. Herein, the sealing layer 12a is completely within the thermosetting resin frame 13a and configured to seal all components on the upper surface of the radiator 306. The sealing layer 12a coats the surface of the insulating layer 307, and covers the circuit wiring 308, the circuit components and the metal wire 305.

As the back face of the intelligent power module 10 has the heat dissipating corrugation 17A, the heat dissipating area greatly increases, the insulating layer 307 may satisfy the requirement of the power component for heat dissipation without using the high thermal-conductive material. The heat dissipating structure is made of paper material and the weight is light, such that the total weight of the intelligent power module 10 is lowered, thereby being convenient for a long-distance transportation and assembly by workers. Since the module itself has the radiator, in the application process, no radiator needs mounting on the exterior, thereby reducing the application difficulty and cost and improving assembly quality. Therefore, the intelligent power module 10 of the present disclosure reduces the cost while improving the reliability, and may be designed to be compatible with functions and pin definitions of the current intelligent power module, thereby being convenient for promotion and application of the intelligent power module.

Figure 32:
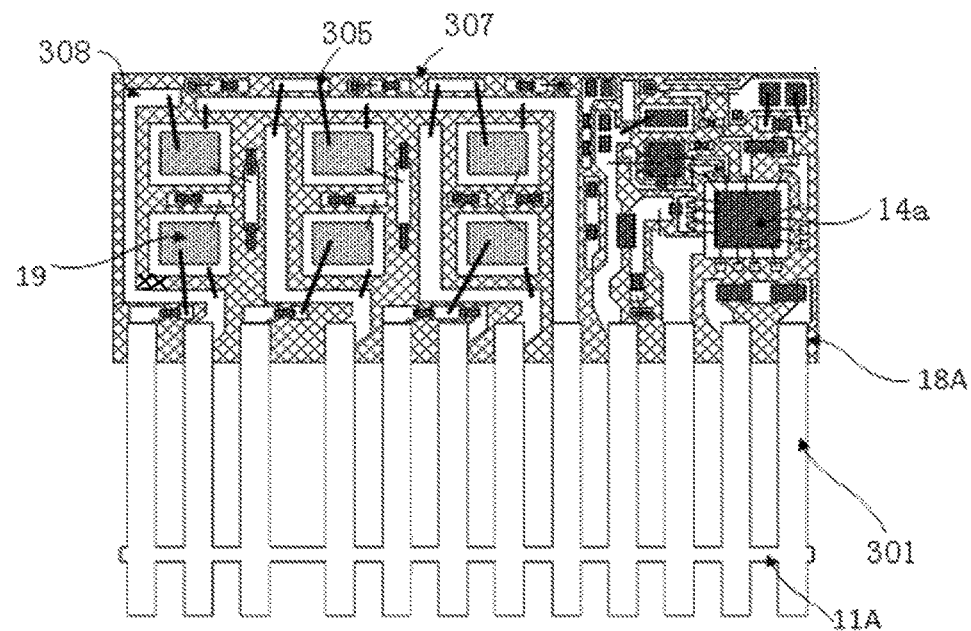
FIG. 32 is a top view of the structure shown in FIG. 31.
Figure 32A:
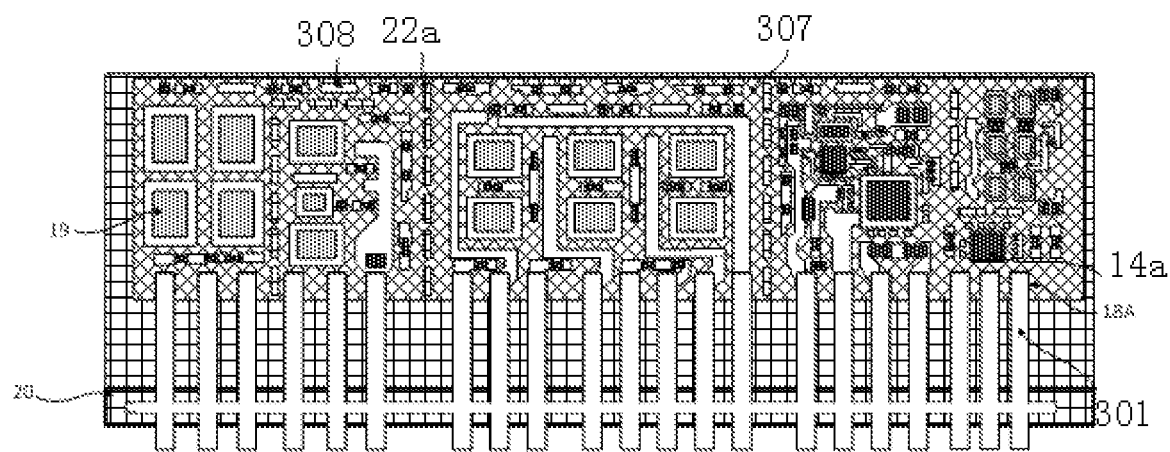
Figure 32B:
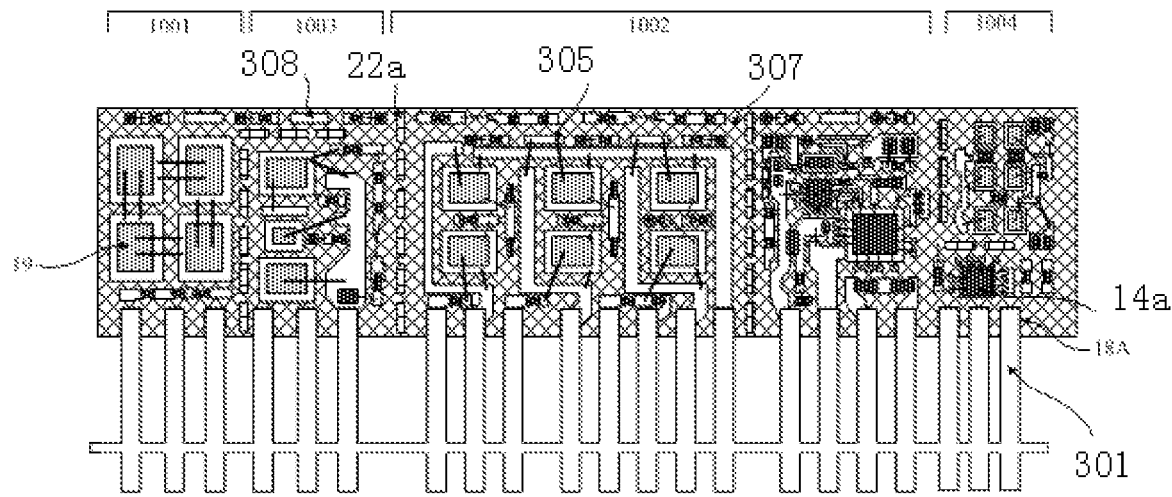

In the present embodiment, to facilitate heat dissipation, as shown in FIG. 32(b), a through hole 22a is further provided in the radiator 306. The through hole 22a runs through the radiator 306 and the insulating layer 307.

The through hole 22a is defined at a specific position of the radiator 306, and in particular, the through hole 22a is located between the components and circuits constituting a heating source and the components and circuits not constituting a heating source, such that the thermal interference between the respective heating sources of the power component 19 is little, and the most heat of the power component 19 emits out rapidly instead of transmitting to the non-power component 14a, thereby making the properties of the intelligent power module 10 stable, and improving the reliability of the intelligent power module 10.

In order to avoid a machining error of the through hole 22a, a set distance (which will be described in detail in the following) is provided between the edge of the circuit wiring 308 and the edge of the through hole 22a, and another set distance (which will be described in detail in the following) is provided between the edge of the insulating layer 307 and the edge of the through hole 22a.

Herein, the bridge, the drive part of the compressor inverter, the drive part of the power factor correction, the drive part of the fan inverter and the other control parts are separated from each other by the through hole 22a.

Besides, the intelligent power module 10 further includes the pin 301, which are arranged at edge of the power module, connected to the circuit wiring 308, extending outwards and configured as an input or an output by.

Herein, according to the needs of a circuit layout inside the intelligent power module 10 and peripheral applications, the pin 301 may be arranged at one edge, two edges, three edges or four edges of the intelligent power module 10.

In the present embodiment, the circuit wiring 308, the power component 19, the non-power component 14a, the metal wire 15, and a connection portion between the pin 301 and the circuit wiring 308 are packaged by a sealing resin 12. The resin 12 fills up the through hole 22a.

As shown in FIGS. 17(a) and 21(a), a circuit unit 1001 implements function of the bridge, a circuit unit 1002 implements function of the compressor inverter, a circuit unit 1003 implements function of the power factor correction, and a circuit unit 1004 implements function of the fan inverter.

Herein, the bridge, the drive part of the compressor inverter, the drive part of the power factor correction, the drive part of the fan inverter and the other control parts are separated from each other by the through hole 22a.

The through holes 22a are located between the circuit wirings 308, and have a distance of above 1 mm from the insulating layer 307 and the circuit wirings 308, the through holes 22a run through the insulating layer 307 and the paper radiator 306. When the intelligent power module 10 is packaged by the sealing resin 12, the through holes 22a are completely filled with the sealing resin 12. The through holes 22a are located between the components and circuits constituting a heating source and the components and circuits not constituting a heating source, thereby forming a thermal separation between the respective heating sources and forming a lateral thermal separation between the heating source and the non-heating source as thermal conductivity of the sealing resin 12 is much less than that of the paper radiator 306. Moreover, as the bottom of the heating source has the corrugation 17A, longitudinal heat conduction efficiency of the heating sources increases greatly, such that the through holes 22a achieve the thermal separation of the intelligent power module 10.

Besides, in order to improve the effect of the thermal separation, as a first design method, a length of each through hole 22a may be designed to be long enough. As a second design method, in order to improve the hardness of the paper radiator 306, the length of through hole 22a may be designed to be 5 mm-6 mm. With respect to the second design method, distance between the through holes 22a may be designed to be 0.5 mm-1 mm. In order to improve the effect of the thermal separation, a lateral width of each through hole 22a may be designed to be 3 mm-3.5 mm, and in order to reduce volume of the intelligent power module 10, the lateral width of each through hole 22a may be designed to be 1 mm-2.5 mm.

The metal wire 305 also may be used to establish electrical connections between the pin 301 and the circuit wiring 308 or the power component 19 or the non-power component 14a. With respect to the connection of the power component 19, an aluminum wire of 300 μm-400 μm may be adopted. With respect to the connection of the non-power component 14a, an aluminum wire of 38 μm-125 μm may be adopted. If there exists a connection across the through hole 22a, an aluminum wire of above 250 μm is preferably adopted.

The sealing resin 12 may be molded by transfer molding with thermosetting resin 12, and also may be molded by injection molding with the thermoplastic resin 12. Herein, the resin 12 is configured to seal all components on the surface of the paper radiator 306, i.e., to seal only one surface which has the components, and the other surface is exposed completely. The through hole 22a on the paper radiator 306 is completely filled by the resin 12.

Compared with the prior art, the intelligent power module 10 according to embodiments of the present disclosure has the following beneficial effects.

1. As the back face of the intelligent power module 10 has the heat dissipating corrugation 17A, the heat dissipating area greatly increases, the insulating layer 307 may satisfy the requirement of the power component 19 for heat dissipation without using the high thermal-conductive material.

2. The intelligent power module 10 has the functions of the bridge and the compressor inverter, or has the functions of the bridge, the compressor inverter and the fan inverter, such that all the heating circuits in an application field such as an inverter air-conditioner are gathered together to dissipate the heat at the same time.

3. If the heat dissipating corrugation 17A is located below the power component 19, the most heat of the heating component is emitted out rapidly instead of transmitting to the non-power component 14a, such that the non-power component 14a may constantly operate in a low temperature environment, the temperature drift of the non-power component 14a reduces greatly, thereby improving the electrical properties and thermal stability of the intelligent power module 10. As part of the back face of the paper radiator 306 apart from the part provided with the corrugation 17A is also sealed, water tightness and gas tightness of the intelligent power module 10 of the present disclosure are improved, thereby improving long term reliability in a complex application environment.

4. If the heat dissipating corrugation 17A integrally covers the back face of the whole intelligent power module 10, the mounting is easy, the structure is simple, and the heat dissipating area may be increased greatly, such that the heat of the heating component may be dissipated rapidly, moreover as the back face of the intelligent power module 10 is completely exposed, the heat dissipation of the intelligent power module 10 is improved.

5. The bridge, the drive part of the compressor inverter, the drive part of the power factor correction, the drive part of the fan inverter and the other control parts (including the non-power component 14a and the like) are separated from each other by the through holes 22a, such that not only the thermal interference between the heating components is low, the most heat is dissipated by the corrugation 17A, but also the temperature of the control parts keeps at a low state, avoiding the properties of the intelligent power module 10 from declining due to the temperature drift of the control parts.

6. The heat dissipating structure is made of paper material and the weight is light, such that the total weight of the intelligent power module 10 is lowered, thereby being convenient for a long-distance transportation and assembly by workers. Since the intelligent power module 10 itself of the present disclosure has the radiator 306, in the application process, no radiator 306 needs mounting to the exterior, thereby reducing the application difficulty and cost and improving assembly quality.

From the above, the intelligent power module 10 of the present disclosure reduces the cost while improving the reliability and properties, and may be designed to be compatible with functions and pin definitions of the current intelligent power module, thereby being convenient for promotion and application of the intelligent power module 10.

Figure 16:
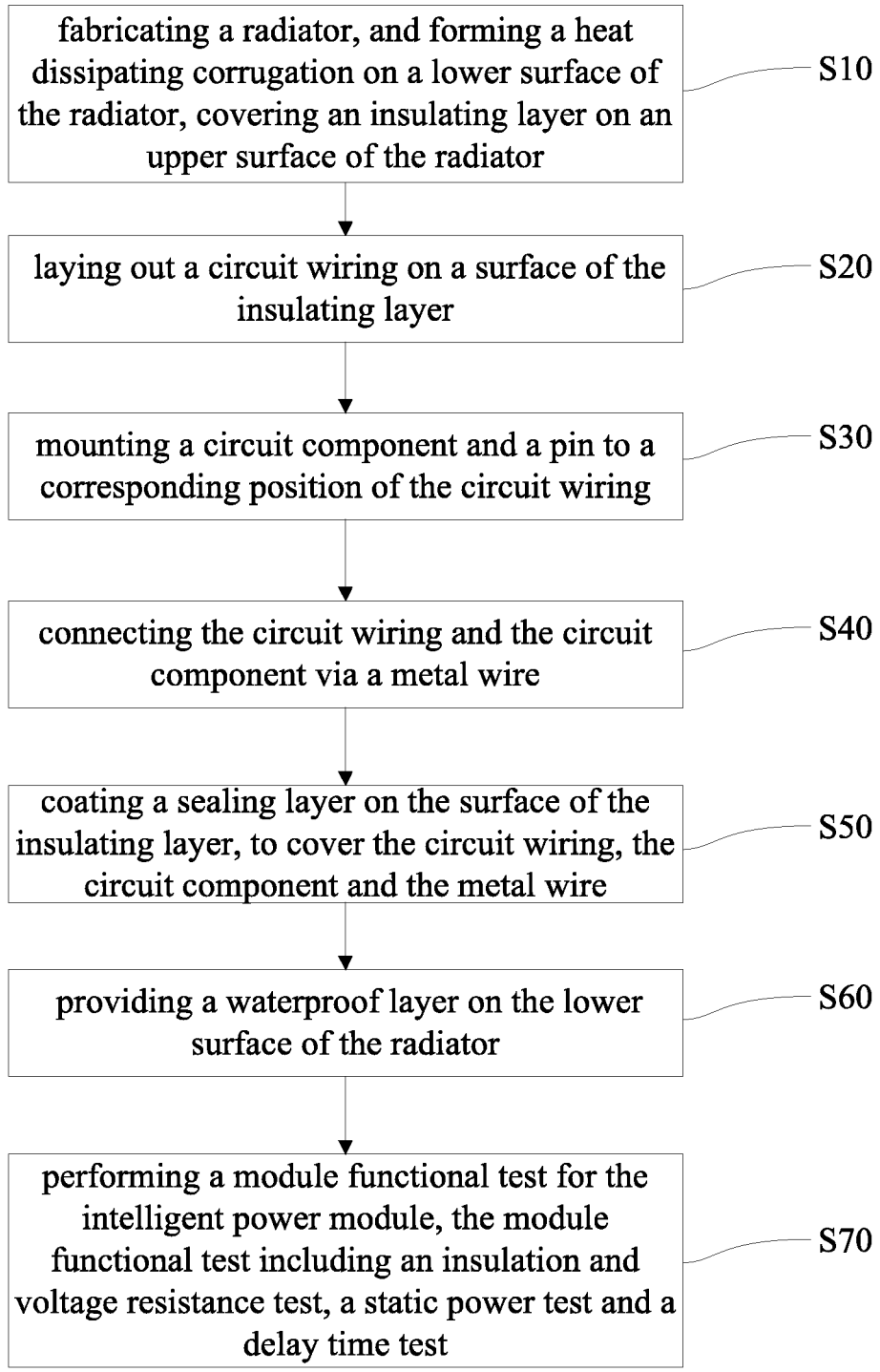
FIG. 16 is a flow chart of a manufacturing method of an intelligent power module according to embodiments of the present disclosure.

As shown in FIG. 16, a manufacturing method of the intelligent power module of the present disclosure includes the following steps of:

S10: fabricating the paper radiator as the radiator, and forming the heat dissipating corrugation on the lower surface of the radiator, and covering the insulating layer on the upper surface of the radiator;

S20: laying out the circuit wiring on the surface of the insulating layer;

S30: mounting the circuit component and the pin to the corresponding positions of the circuit wiring;

S40: connecting the circuit wiring and the circuit component via the metal wire;

S50: coating the sealing layer on the surface of the insulating layer, to cover the circuit wiring, the circuit component and the metal wire;

S60: providing the waterproof layer on the lower surface of the radiator; and

S70: performing a module functional test on the intelligent power module, the module functional test includes an insulation and voltage resistance test, a static power test and a delay time test.

In some embodiments of the present disclosure, the step S10 may further include the following substeps of:

S11: according to a set circuit layout, choosing the wet-type carbon composite material with a predetermined dimension to form the paper radiator;

S12: forming the through hole at an appointed position between the circuit wirings, the through hole runs through the insulating layer and the radiator;

S13: using the insulating material and copper material on the front face of the radiator, and by means of hot pressing, making the insulating material formed on the surface of the radiator as the insulating layer, and making the copper material formed on the surface of the insulating layer as the copper clad layer;

S14: corroding a particular position on the copper clad layer, and making the rest part formed as the circuit wiring and the welding pad;

S15: forming the corrugation with the wet-type carbon composite material, and adhering it to the back face of the radiator via high temperature resistant glue.

In some embodiments of the present disclosure, the step S50 (i.e., the step of coating the sealing layer on the surface of the insulating layer) further includes the following substeps of:

S51: arranging the thermosetting resin frame around the surface of the insulating layer;

S52: injecting the thermoplastic resin in the range of the thermosetting resin frame and in the through hole so as to seal the circuit wiring, the circuit component and the metal wire; and S53: trimming and shaping the pin and sealing the position on the back face of the radiator that is not covered with the corrugation by using the sealing resin.

In some embodiments of the present disclosure, the manufacturing method of the intelligent power module further includes a step S60: providing the waterproof layer on the lower surface of the radiator.

In some embodiments of the present disclosure, the step S30 of preforming the pin before mounting the circuit component to the corresponding position of the circuit wiring, further includes the following substeps of:

S31: choosing copper base material, and forming a row of pins by stamping or etching the copper base material, in which the pins are connected to each other by a reinforcing rib;

S32: forming a nickel layer and a nickel-tin alloy layer in sequence on surfaces of the pins, to acquire the pins with the clad layer.

The step S40 further includes the following substeps of:

S41: welding the circuit component to the circuit wiring by reflow soldering;

S42: eliminating soldering flux residues on the insulating layer;

S43: in the manufacturing method of the intelligent power module, the circuit wiring is formed on the paper radiator and an orderly processing is completed, the paper radiator with the lighter weight has a low requirement for a carrier during the processing, the positioning is easier, thereby reducing manufacturing cost, improving the process qualification rate, omitting the process for mounting the power component to the interior of the radiator, and reducing the investment fees for the devices.

In some embodiments of the present disclosure, the radiator is the paper radiator, the step of covering the front face of the radiator with the insulating layer and forming the circuit wiring and the welding pad on the surface of the insulating layer includes:

S'10: according to a set circuit layout, choosing the wet-type carbon composite material with a predetermined dimension to form the paper radiator;

S'20: using the insulating material and copper material on the front face of the radiator, and by means of hot pressing, making the insulating material formed on the surface of the radiator as the insulating layer, and making the copper material formed on the surface of the insulating layer as the copper clad layer;

S'30: corroding a particular position on the copper clad layer, and making the rest part formed as the circuit wiring and the welding pad;

S'40: forming the partition portion on the back face of the radiator, and fixing the preformed heat dissipating corrugation to the position on the back face of the radiator corresponding to the power component, in which S'40 includes S'41: by means of cutting, tearing, corroding or the like, removing the material on the particular position of the back face of the paper radiator, to form the partition portion.

S'50: forming the corrugation with the wet-type carbon composite material, and binding it to the position on the back face of the radiator corresponding to the power component by means of high temperature resistant glue.

The respective process is described in detail in the following.

Figure 3:
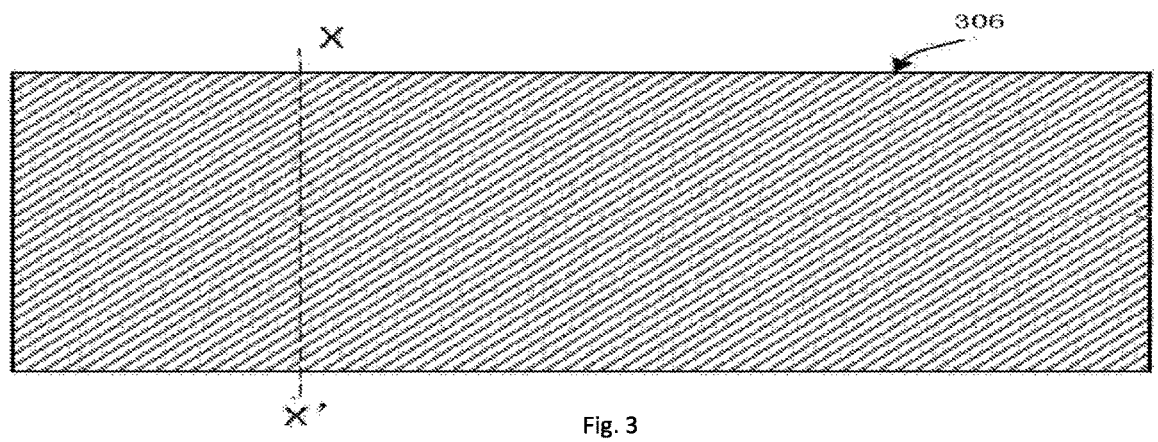
FIG. 3 is a side view schematically illustrating a process of a radiator in a manufacturing method of an intelligent power module according to embodiments of the present disclosure.
Figure 4:
FIG. 4 is a top view schematically illustrating a process of a radiator in a manufacturing method of an intelligent power module according to embodiments of the present disclosure.

In a first process: referring to FIGS. 3-10 and FIGS. 43-44, in which, FIG. 3 is a top view of the radiator, FIG. 4 is a cross sectional view along a line X-X' in FIG. 3.

A radiator 306 with suitable dimension is designed according to the needed circuit layout, and with respect to the general intelligent power module, the dimension of one radiator may be 64 mm×30 mm, the thickness is 1.5 mm, and both faces thereof may be subject to anti-corrosion treatment and waterproof treatment such as treatment of coating with waterproof glue.

Figure 5:
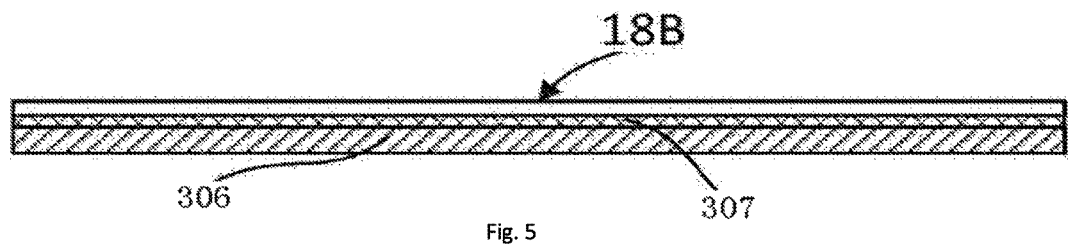
FIG. 5 is schematic view of a process for forming an insulating layer 307 and a copper clad layer 18B on a radiator.

Referring to FIG. 5, by using the insulating material having the spherical or angular dopant and the copper material and by means of the hot pressing at the same time, the insulating material is formed on the surface of the radiator 306 and configured as the insulating layer 307, and the copper material is formed on the surface of the insulating layer 307 and configured as the copper clad layer 18B. Herein, in order to improve the voltage withstanding characteristics, the thickness of the insulating layer 307 may be designed to be 110 μm, and in order to improve the heat dissipating characteristics, the thickness of the insulating layer 307 may be designed to be 70 μm. Herein, in order to improve the flow capacity, the thickness of the copper clad layer 18B may be designed to be 0.07 mm, and in order to reduce costs, the thickness of the copper clad layer 18B may be designed to be 0.035 mm or 0.0175 mm.

Figure 6:
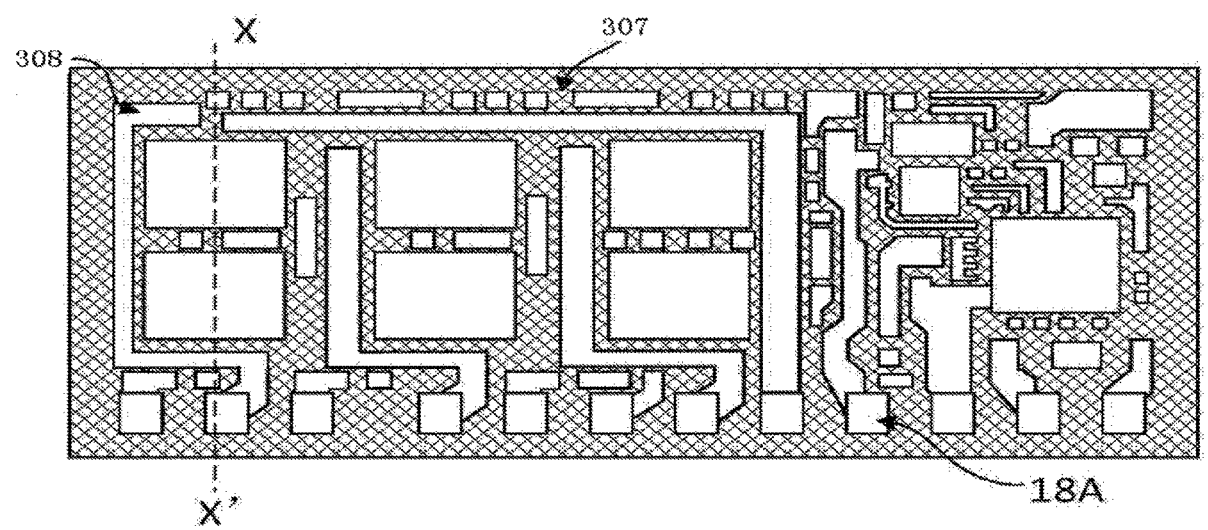
FIG. 6 is a schematic view of a process for fabricating a circuit wiring.
Figure 6:
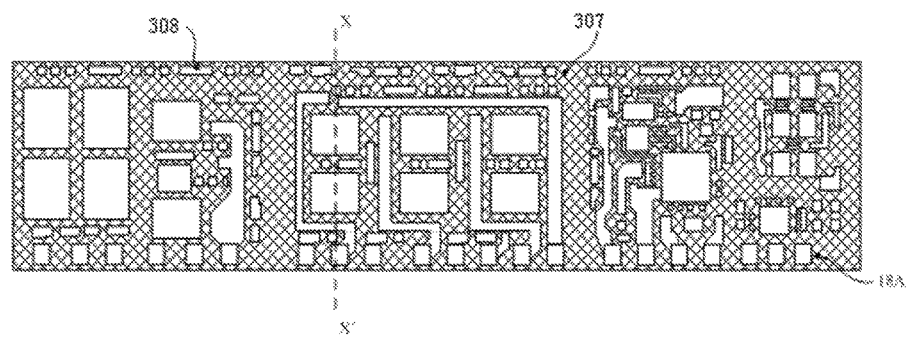
Figure 6B:
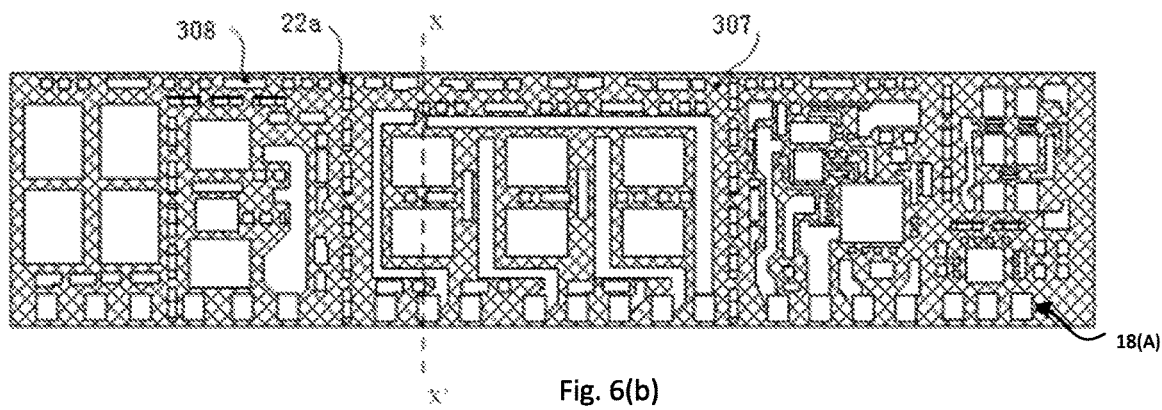
Figure 6C:
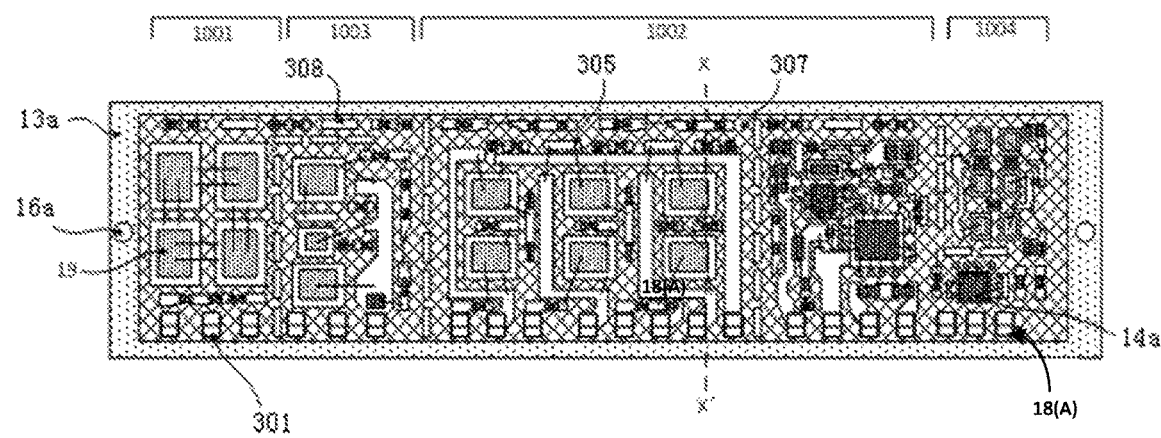
Figure 7:
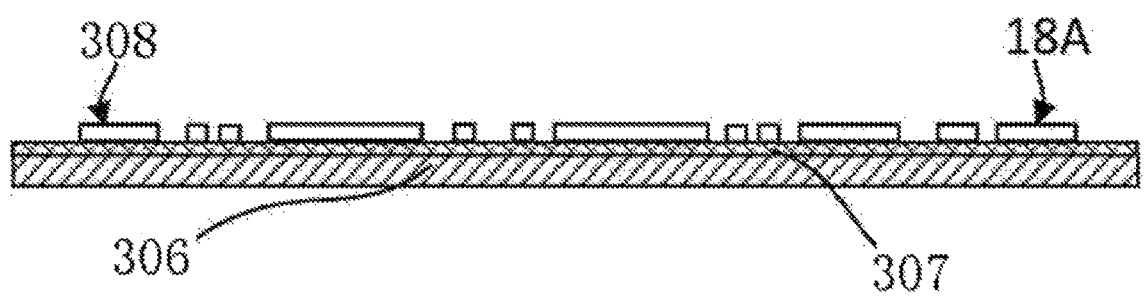
FIG. 7 is a cross sectional view taken along a line X-X' in FIG. 3.

Referring to FIGS. 6 and 7, specific positions of the copper clad layer 18B are corroded, and the rest part is the circuit wirings 308 and the welding pads 18A.

Figure 8:
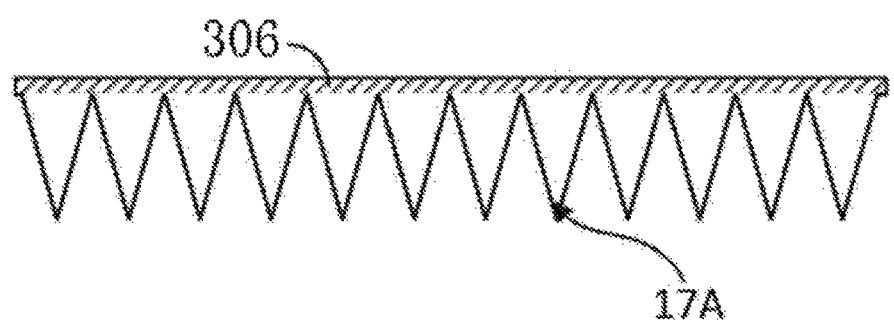
FIG. 8 is a schematic view of a process for fabricating a heat dissipating corrugation.

Referring to FIG. 8, the wet-type carbon composite material with the thickness of 0.5 mm is made to have an irregular shape and configured as the heat dissipating corrugation 17A, and both faces thereof are subject to anti-corrosion treatment and waterproof treatment such as treatment of coating with waterproof glue.

Figure 9:
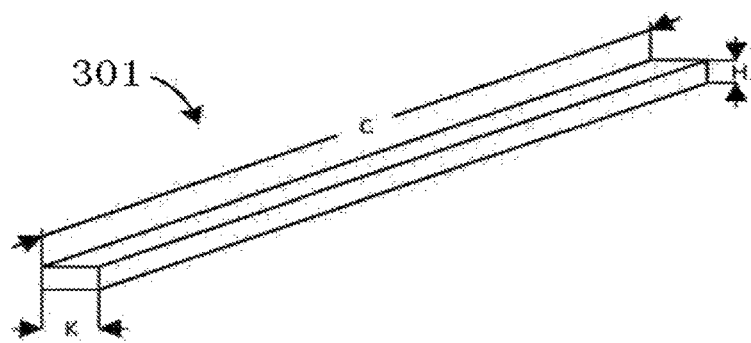
FIG. 9 is a view of a pin in which a dimension is marked.
Figure 10:
FIG. 10 is a schematic view of a process for fabricating a pin.

Each the pin 301 is made of copper base material and formed to be that shown in FIG. 9 by means of stamping or etching. A separate pin unit is configured as a long strip having a length C of 25 mm, a width K of 1.5 mm and a thickness H of 1 mm. In the present embodiment, in order to facilitate the assembly, one end of the pin unit is provided with an arc of 90° by means of pressing, as shown in FIG. 10.

Then the nickel layer is formed by means of chemical plating. By using a mixed solution of nickel salt and sodium hypophosphite with appropriate complexing agent added, a nickel layer is formed on the surface of the copper material which has been formed in a specific shape. The metallic nickel has high passivation capability, and an extremely thin passivation coating may be formed rapidly, thereby withstanding corrosions due to the atmosphere, alkali or some certain acid. A nickeling crystal is extremely tiny and the thickness of the nickel layer is generally 0.1 μm.

Then by means of acid sulfate process and at an indoor temperature, the copper material with the formed shape and coated with the nickel layer is immersed in a plating solution with positive tin ions and is electrified, then a nickel-tin alloy layer is formed on the surface of the nickel layer. The thickness of the alloy layer is generally controlled to be 5 μm, and the formation of the alloy layer greatly improves the protectiveness and the weldability.

A second process is a process for mounting the power components 19 and non-power components 14a on the surface of the circuit wirings 308 and mounting the pins 301 on the surface of the welding pads 18A.

Firstly, by means of a solder paste printer and a steel mesh, the specific positions of the circuit wirings 308 and the welding pads 308 on the insulating layer 307 are coated with solder paste. Herein, in order to improve height of solder wicking, the steel mesh with thickness of 0.15 mm may be employed, and in order to reduce the risk that the power components 19 and the non-power components 14a shift, the steel mesh with thickness of 0.12 mm may be employed. In the present embodiment, the height of the power component 19 in use is 0.07 mm, which is the lightest component, such that the steel mesh with the thickness of 0.12 mm is employed.

Figure 11:
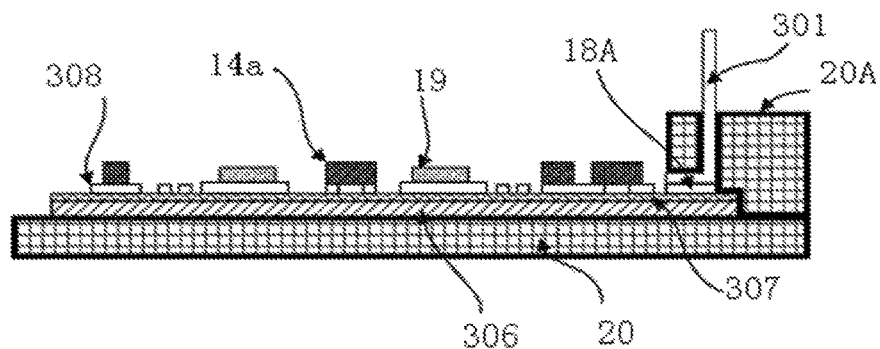
FIG. 11 is a side view schematically illustrating a process for mounting a circuit component and a pin to a circuit wiring.
Figure 12:
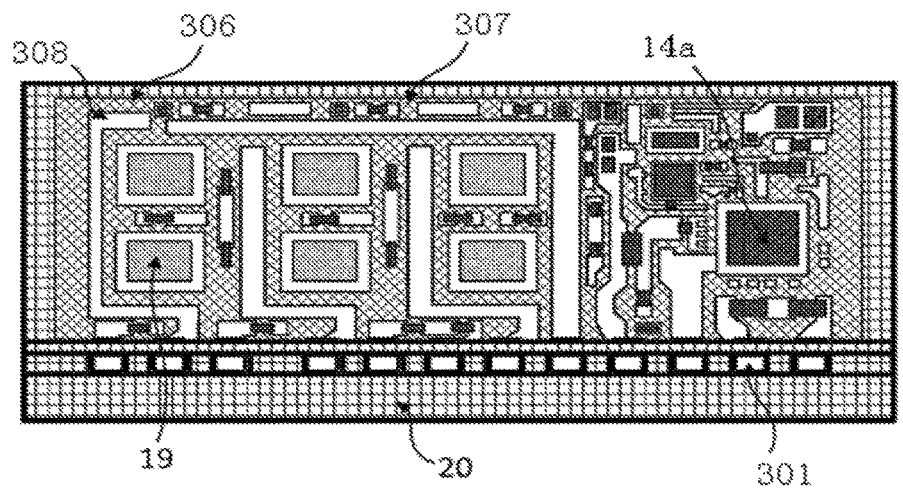
FIG. 12 is a top view schematically illustrating a process for mounting a circuit component and a pin to a circuit wiring.
Figure 12:
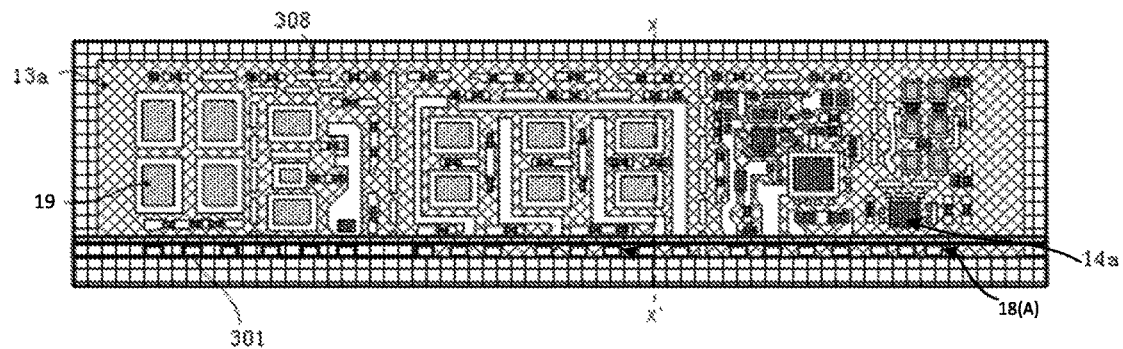

Then, referring to the side view FIG. 11 and the top view FIG. 12, the radiator 306 is placed on a carrier 20 to mount the power components 19, the non-power components 14a and the pins 301. The power components 19 and the non-power components 14a may be directly placed on the specific positions on the circuit wiring 308. However one end of the pin 301 needs to be placed on the welding pad 18A, and the other end needs to be secured by a securing device 20A on the carrier 20, the carrier 20 and the securing device 20A are made from synthetic stone and the like material. Herein, the carrier 20 needs to be subject to a hollowed-out treatment at the bottom, such that the heat dissipating corrugation 17A is exposed. A space having at least 1 mm in distance from the edge of the back face of the radiator 306 and not covered by the heat dissipating corrugation 17A is in contact with the carrier 20 for supporting.

Then, the radiator 306 placed on the carrier 20 is subject to the reflow soldering, such that the solder paste is solidified, and the power components 19, the non-power components 14a and the pins 301 are fixed.

In a third process: firstly, the radiator 306 is placed in a cleaning machine to be cleaned, and the soldering flux residues such as rosin during the reflow soldering and foreign matter residues such as aluminum wire during the stamping are cleaned out. According to an arrangement density of the non-power components 14a on the circuit wirings 308, the cleaning may be performed by means of spraying or ultrasonic or a combination thereof.

During cleaning, the pins 301 are clamped by a mechanical arm, and the radiator 306 is placed in a cleaning tank, and it is noted that the mechanical arm could not touch the radiator 306, as the radiator 306 has brittleness and is prone to deform. If the mechanical arm clamps the radiator 306, vibration generated during the cleaning may cause the radiator 306 to crack.

In a fourth process: according to needs of the flow capacity, an aluminum wire with suitable diameter is chosen as a binding wire (the metal wire 305), and with respect to the integrated circuit for signal control, the gold wire may also be considered as the binding wire. In the present embodiment, the aluminum wire is adopted. In generally, the aluminum wire of 350 μm-400 μm is used for binding the power components 19, the aluminum wire of 38 μm-200 μm is used for binding the non-power components 14a, and the aluminum wire of 350 μm-400 μm is used for binding the radiator 306.

Figure 13:
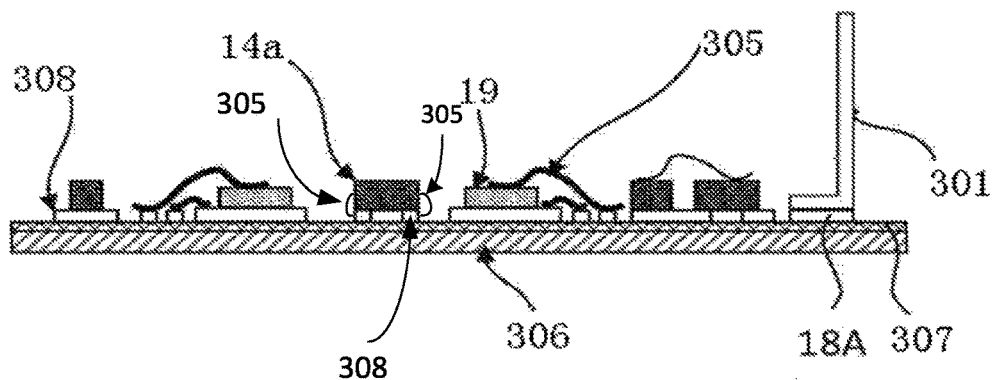
FIG. 13 is a side view schematically illustrating a process for mounting a metal wire.
Figure 13:
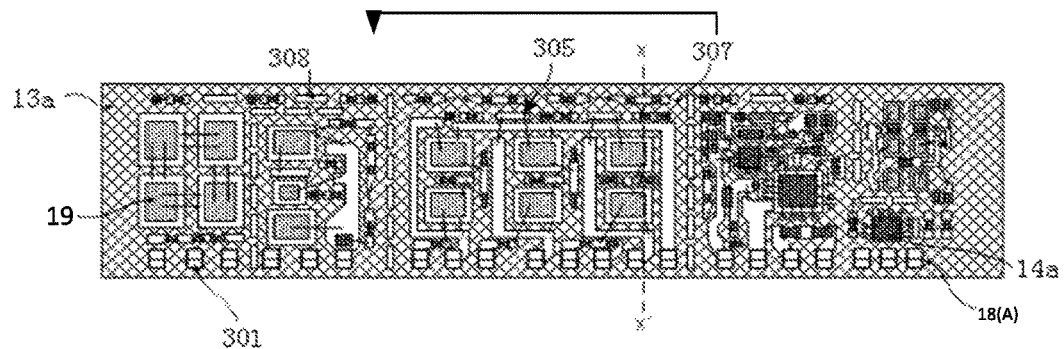
Figure 14:
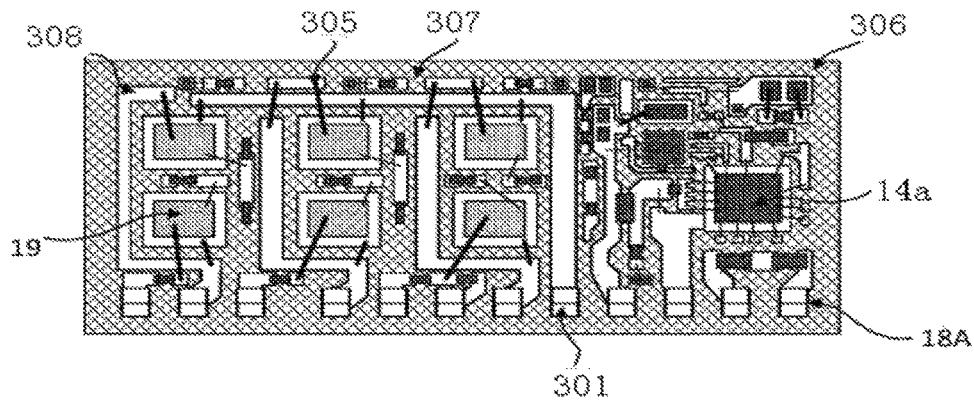
FIG. 14 is a top view schematically illustrating a process for mounting a metal wire.

The product after the process is shown in the side view FIG. 13 and the top view FIG. 14.

A fifth process is a process for the thermosetting resin frame 13a is mounted to the insulating layer 307 and the thermoplastic resin is embedded.

Firstly, the thermosetting resin frame 13*a* of which the short side of the rectangle defines through holes is attached to the insulating layer 307 by means of a non-conductive thermosetting glue such as insulating red glue, and the radiator 306 attached with the thermosetting resin frame 13*a* is baked in an oxygen-free environment. A baking time should not be less than 2 hours and a baking temperature should be 175° C., such that the thermosetting resin frame 13*a* is fixed to the insulating layer 307, referring to FIG. 16. Herein, a height of thermosetting resin frame 13*a* should be larger than that of the insulating layer 307.

Then, the thermoplastic resin is injected into the thermosetting resin frame 13*a*, until the thermosetting resin frame 13 is filled up. An injection temperature of the thermoplastic resin is 150° C. After cooling, the sealing layer 12*a* seals all the components on the radiator 306, and only the pins 301 are exposed.

Figure 15:
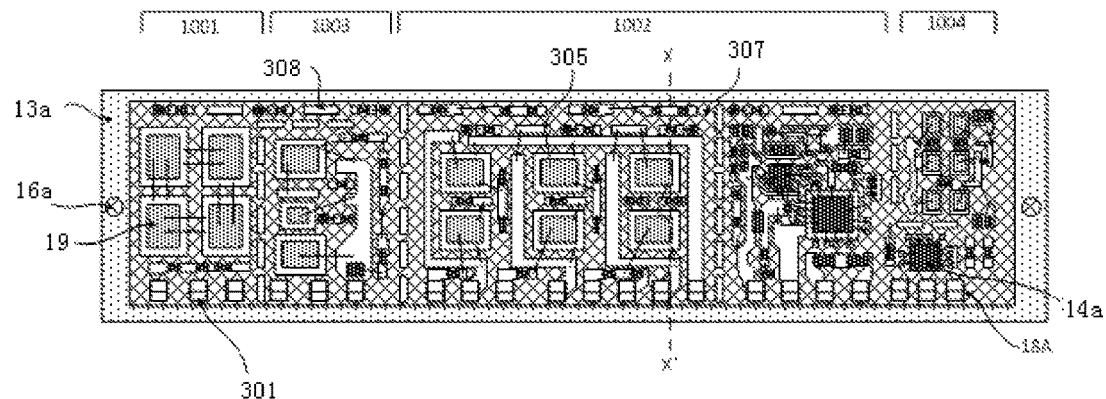
FIG. 15 is a schematic view of a process for sealing an intelligent power module.
Figure 15C:
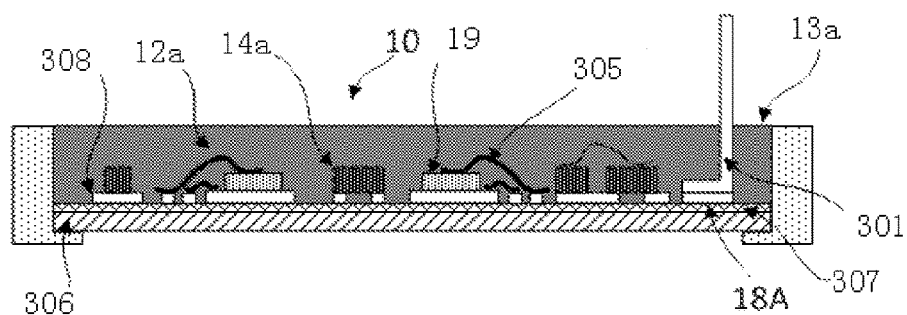
Figure 15:
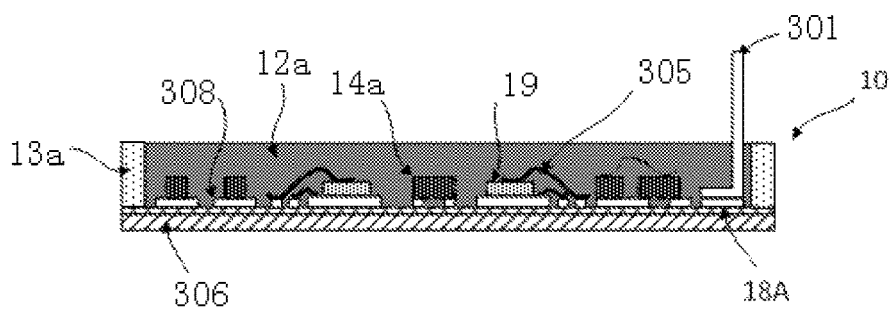
Figure 15D:
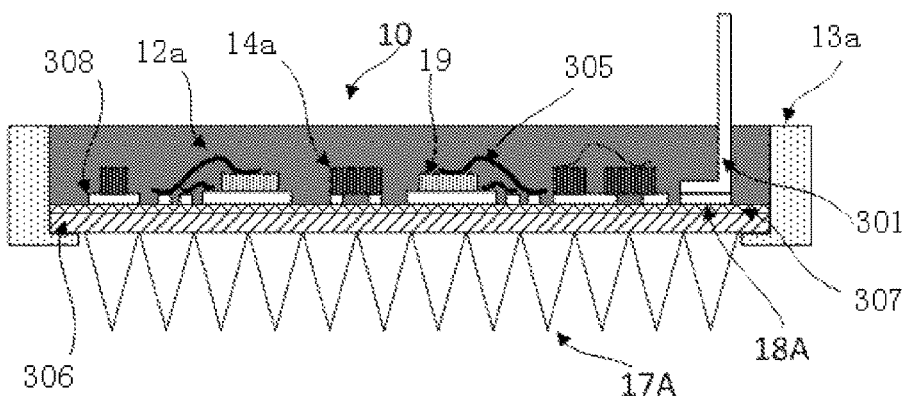

A sixth process is shown in FIGS. 1, 2 and 15(*d*), the mounting holes 16*a* and the partition portion 202*a* are formed and the heat dissipating corrugation 17A is fixed. The intelligent power module is completed as the product after the process.

Referring to FIG. 1, by means of a puncher and the like, the insulating layer 307 and the radiator 306 are punched at positions corresponding to the through hole in the thermosetting resin frame 13, to form the mounting holes 16*a*. The mounting holes 16*a* are used for the assembly of the intelligent power module 10.

By means of cutting, tearing, corroding or the like, the paper radiator 306 is treated at the particular positions of the back face, such that paper heat dissipating material at the particular positions is removed, to form the partition portions 202*a*. Two sides of the partition portion 202*a* are provided with the groups of the heating power components of different functional circuits. The paper heat dissipating material may be removed partially or also may be removed completely to expose the insulating layer 307. To achieve the better effect of the thermal separation, the complete removal is adopted in the present embodiment. If the complete removal of the paper heat dissipating material from the partition portions 202*a* is adopted, it should be noted that a scratch could not be formed on the insulating layer 307.

Referring to FIG. 2, the high temperature resistant glue of which a tolerable temperature is above 150° C. is used to adhere the heat dissipating corrugation 17A to the back face of the radiator 306. Herein, the heat dissipating corrugation 17A could not cover the back face of the radiator 306 completely, for example, the heat dissipating corrugation 17A is located at the back face of the power components 19 and is surrounded by the partition portions 202*a*, and has the distance of at least 2 mm from the edge of the short side on the back face of the radiator 306, to ensure that the mounting hole 16*a* is not covered.

Then the module is placed in a test device to get a common electrical parameter test, which generally includes test items such as the insulation and voltage resistance test, the static power test and the delay time test. The qualified module after the test is a finished product.

By means of the above processes, the manufacturing of the intelligent power module 10 is finished.

In the intelligent power module and the manufacturing method thereof provided by the present disclosure, the paper radiator as the carrier is introduced in the intelligent power module, and the partition portion is arranged to the back face of the paper radiator, the heat dissipating corrugation is arranged at the positions on the back face of the radiator corresponding to the power components, such that the heat dissipating area increases rapidly, and the insulating layer may satisfy the requirement of the power component for heat dissipation without using the high thermal-conductive material. Moreover, the most heat of the power components is emitted out rapidly instead of transmitting to the non-power components, such that the non-power components may constantly operate in a low temperature environment, the temperature drift of the non-power components reduces greatly. In addition the thermal interference between the groups of the power components having different functions greatly decrease due to the existence of the partition portion, the heating of each heating components is different from each other but merely transmit to each other, instead dissipating via the corrugation, thereby improving the electrical properties and thermal stability of the intelligent power module. In the present disclosure, the paper radiator having lighter weight is adopted, the requirement for the carrier during the processing is low, the positioning is easy, thereby reducing manufacturing cost, improving the process qualification rate, omitting the process for mounting the power component to the interior of the radiator, and reducing the investment fees for the devices.

The intelligent power module 10 according to embodiments of the present disclosure will be described in detail in the following with reference to FIGS. 1-34.

Figure 17:
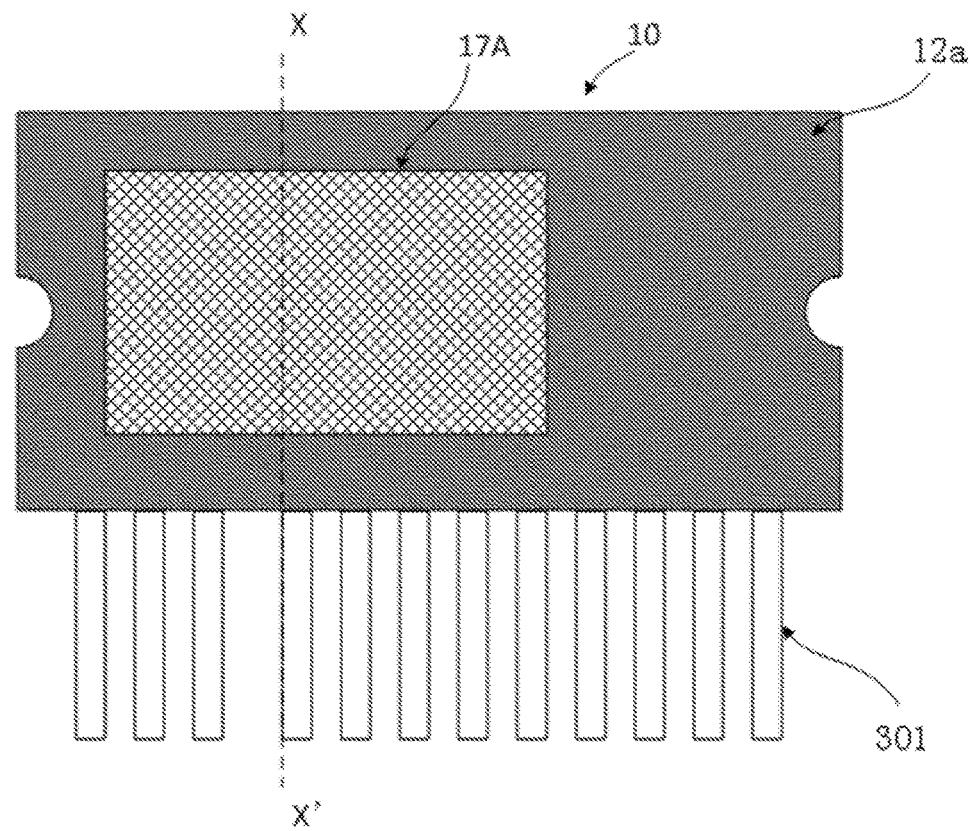
FIG. 17 is a schematic view of an intelligent power module according to embodiments of the present disclosure.
Figure 17:
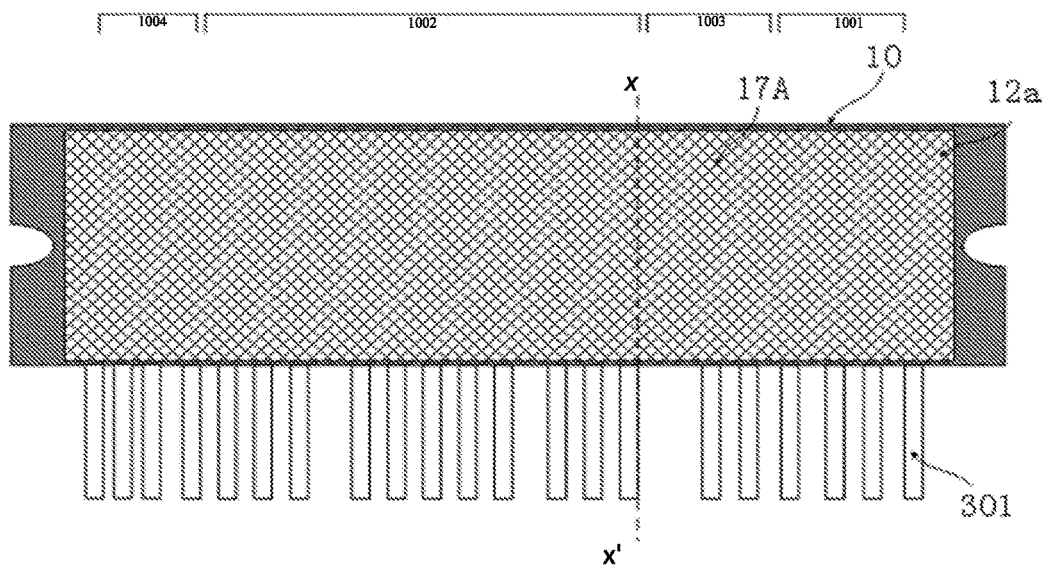
Figure 17:
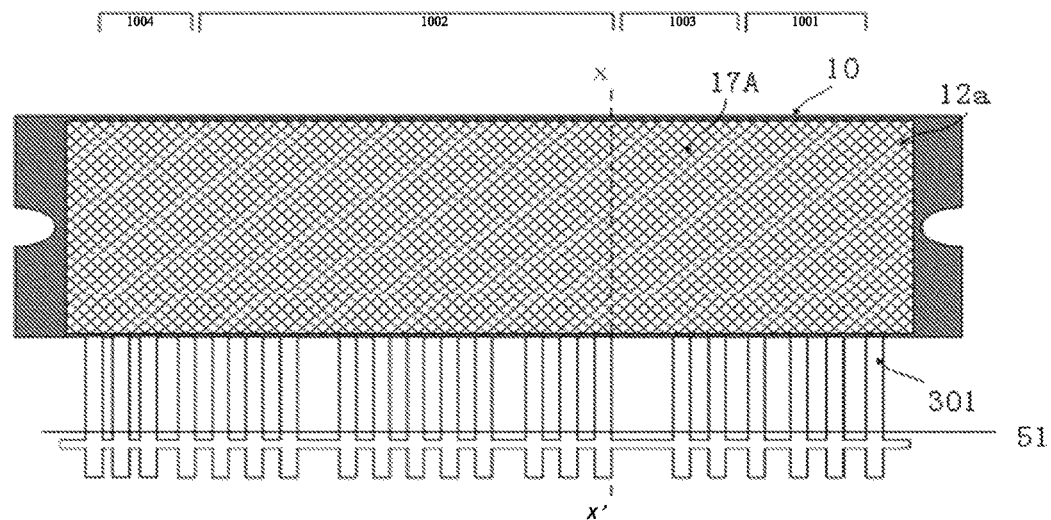
Figure 18:
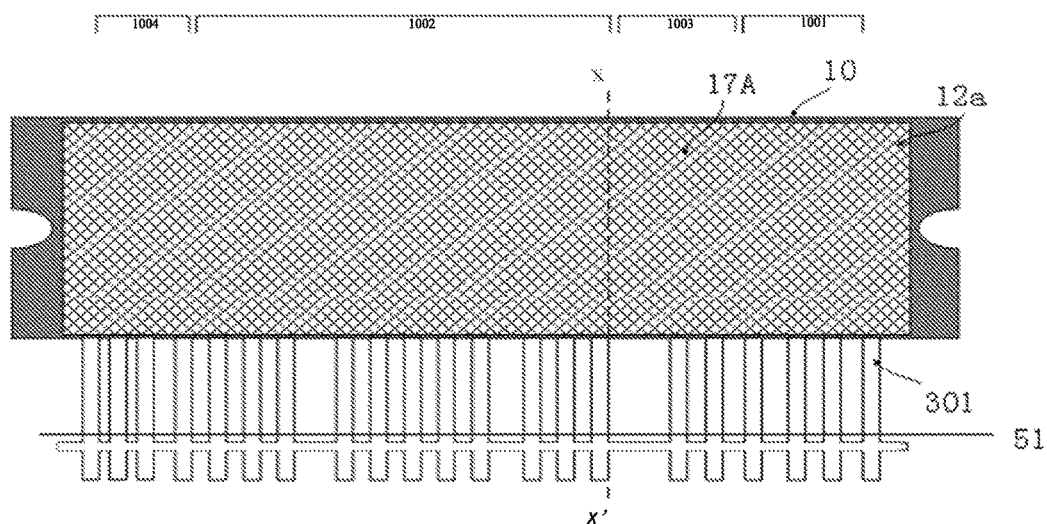
FIG. 18 is a cross sectional view taken along a line X-X' in FIG. 17.
Figure 18:
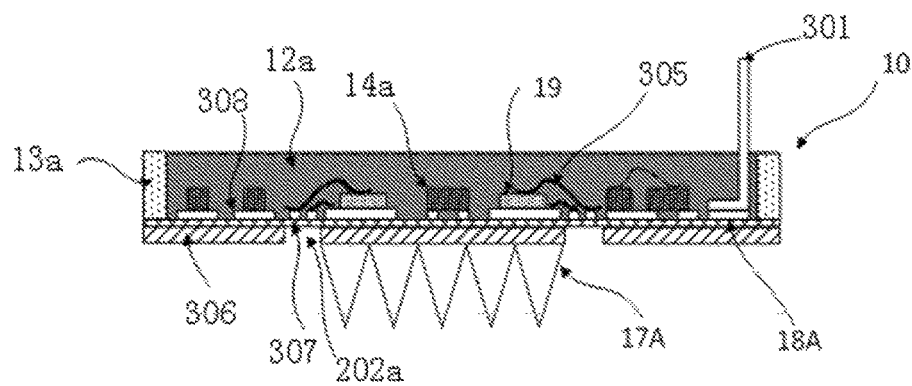
Figure 19:
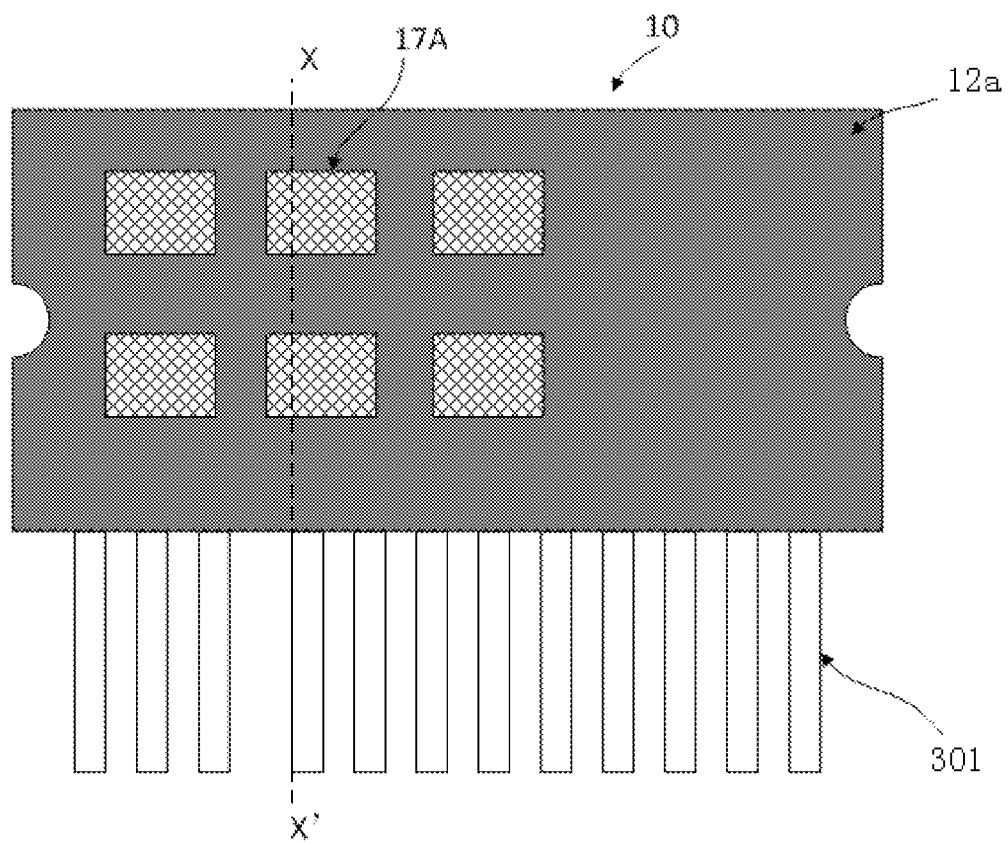
FIG. 19 is a schematic view of an intelligent power module according to embodiments of the present disclosure.

Referring to FIGS. 17, 18 and 19, the intelligent power module 10 according to embodiments of the present disclosure includes the radiator 306, the insulating layer 307, a plurality of circuit wirings 308, the power component 19, the non-power component 14*a*, a plurality of pins 301 and the sealing resin 12.

Specifically, the upper surface of the radiator 306 is flat, the insulating layer 307 is arranged to the upper surface of the radiator 306. The plurality of circuit wirings 308 are spaced apart from each other and arranged on the insulating layer 307. The power component 19 and the non-power component 14*a* are respectively arranged on the plurality of circuit wirings 308. The power component 19 is electrically connected to the circuit wiring 308 via the metal wire 305, and the non-power component 14*a* is electrically connected to the circuit wiring 308 via the metal wire 305.

The lower surface of the radiator 306 defines the dissipating area 17B of which the location corresponds to that of the power component 19, the heat dissipating area 17B is provided with a heat dissipating corrugation 17A. One end of each of the plurality of pins 301 is connected to the plurality of circuit wirings 308, the other end of each of the plurality of pins 301 extends out the intelligent power module 10 to be connected to the other external parts. The sealing resin 12 completely seals the plurality of circuit wirings 308 and covers the upper surface of the radiator 306 and the area apart from the dissipating area 17B.

In the intelligent power module 10 according to embodiments of the present disclosure, the heat dissipating corrugation 17A is arranged at the position on the lower surface of the radiator 306 corresponding to the power component 19, the most heat of the heating component is emitted out rapidly instead of transmitting to the non-power component 14*a*, such that the non-power component 14*a* may constantly operate in a low temperature environment, the temperature drift of the non-power component 14*a* reduces greatly, thereby improving the electrical properties and thermal stability of the intelligent power module 10. As part of the back face of the paper radiator 306 apart from the part provided with the corrugation 17A is also sealed by the sealing resin 12, water tightness and gas tightness are improved, thereby improving the long term reliability of the intelligent power module 10 in a complex application environment.

In addition, in the intelligent power module 10 according to embodiments of the present disclosure, the radiator 306 is arranged below the insulating layer 307 and the heat dissipating area 17B on the lower surface of the radiator 306 is provided with the heat dissipating corrugation 17A, thereby greatly increasing the heat dissipating area of the intelligent power module 10, such that the insulating layer 307 may satisfy the requirement of the power component for heat dissipation without using the high thermal-conductive material. Meanwhile, during the application process of the intelligent power module 10, the exterior needs not to be provided with a radiator, thereby reducing the application difficulty and cost and improving assembly quality. The structure reduces the cost while improving the reliability, and may be designed to be compatible with functions and pin definitions of the current intelligent power module, thereby being convenient for promotion and application of the intelligent power module 10.

There may be various kinds of the radiator 306, for example, according to some embodiments of the present disclosure, the radiator 306 may be constituted by the wet-type carbon composite functional paper. A graphite paper may be actually prepared by powdery and fibrous carbon materials through the combined machining. The material is capable of withstanding the high temperature above 350° C. and may be folded into any shapes according to needs, thereby acquiring the heat dissipating corrugation 17A. As the paper radiator constituted by the paper material has the light weight, the total weight of the intelligent power module 10 is reduced, thereby being convenient for the long-distance transportation and assembly by workers, and reducing the cost.

In order to improve the corrosion resistance and waterproofness of the radiator 306, the outer surface of the radiator 306 may be subject to waterproof treatment, such that the surface of the radiator 306 may be covered with a waterproof layer. For example, the upper surface and the lower surface of the radiator 306 may be both provided with the waterproof layers.

The radiator 306 and the heat dissipating corrugation 17A may be integrally formed, in which the radiator 306 has a regular shape and the heat dissipating corrugation 17A has an irregular shape to improve the heat dissipating area. The structure of the heat dissipating corrugation may be various, for example, as shown in FIG. 18, the heat dissipating corrugation may be a structure having longitudinal section with a plurality of hollow inversed triangles.

It could be understood that, the radiator 306 and the heat dissipating corrugation 17A may also be formed by other materials, for example, the radiator 306 and the heat dissipating corrugation 17A may be fabricated by the wet-type carbon composite materials, in which the radiator 306 and the heat dissipating corrugation 17A have different thicknesses (a dimension extending along up-down direction). In order to improve the mechanical strength, the radiator 306 adopts the thicker wet-type carbon composite material, the thickness may vary between 1.2 mm and 2.5 mm, for example, the thickness may be designed to be 1.5 mm-1.8 mm. For another example, the thickness may be designed to be 0.5 mm. In order to reduce the cost and improve the density of the corrugation, the heat dissipating corrugation 17A adopts the thinner wet-type carbon composite material, and the thickness may vary between 0.3 mm and 0.7 mm, for example, the thickness may be designed to be 0.5 mm.

In order to facilitate the description, herein, one side of the radiator 306 which is provided with the heat dissipating corrugation 17A may be called as the back face of the radiator 306, and an opposite side may be called as a surface of the radiator 306. The configuration of the heat dissipating corrugation 17A on the radiator 306 may be various. According to some embodiments of the present disclosure, a plurality of the heat dissipating corrugations 17A may be provided, and the plurality of the heat dissipating corrugations 17A may be spaced from each other.

Specifically, as shown in FIGS. 17 and 18, a plurality of power components 19 are spaced apart from each other and are arranged on the upper surface of the radiator 17, and a plurality of heat dissipating areas 17B are defined on the lower surface of the radiator 306, the plurality of heat dissipating areas 17B are spaced apart from each other and each the heat dissipating area 17B is provided with the heat dissipating corrugation 17A. Thus, the plurality of heat dissipating areas 17B are spaced apart from each other, thereby reducing a material utilization amount to some extent and reducing the cost.

In some specific embodiments of the present disclosure, a plurality of heat dissipating corrugations 17A are provided. The plurality of heat dissipating corrugations 17A are arranged continuously and a distance between an outer edge of any one heat dissipating corrugation 17A and an outer edge of the lower surface of the radiator is more than 1 mm.

Figure 20:
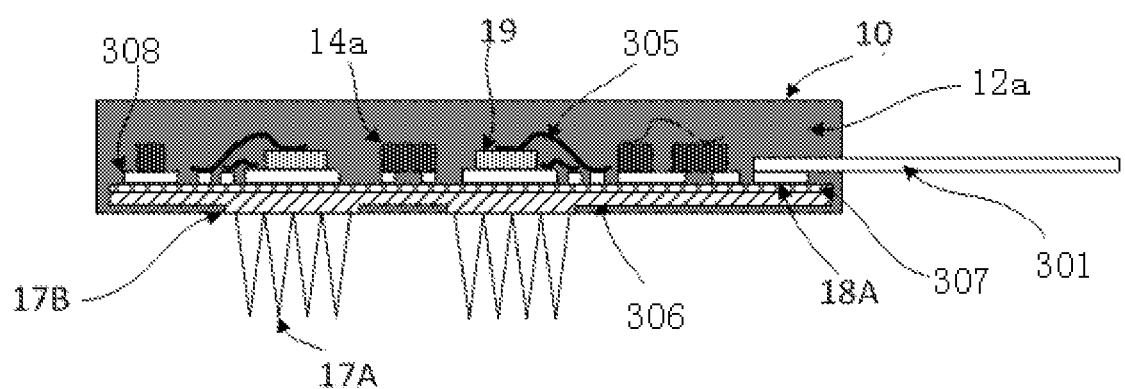
FIG. 20 is a cross sectional view taken along a line X-X' in FIG. 19.

As shown in FIGS. 19 and 20, that is, a plurality of power components 19 are provided and the plurality of power components 19 spaced from each other are arranged on the upper surface of the radiator 17. One heat dissipating area 17B is defined on the lower surface of the radiator 306, and the one heat dissipating area 17B completely cover the positions of the plurality of power components 19. Moreover an area of an orthographic projection of the heat dissipating corrugation 17A on the lower surface of the radiator 306 is less than the area of the lower surface of the radiator 306A.

The distance between the outer edge of the heat dissipating corrugation 17A and the outer edge of the lower surface of the radiator 306 is more than 1 mm, that is, the heat dissipating corrugation 17A could not completely cover the back face of the radiator 306, instead a flat space of at least 1 mm is set aside at the edge of the back face of the radiator 306. Thus, the structure may effectively improve the water tightness and gas tightness of the intelligent power module 10.

According to an embodiment of the present disclosure, the heat dissipating area 17B is formed as a boss protruding from the lower surface of the radiator 306 and extending downwards, the heat dissipating corrugation 17A is arranged on the lower surface of the heat dissipating area 17B. That is, the upper surface of the radiator 306 is a flat surface, thickness of the part of the radiator 306 where the heat dissipating corrugation 17A is mounted is slightly larger than the thickness of the part where no heat dissipating corrugation 17A is mounted. Thus, by defining the heat dissipating area 17B, the area is separated from the area where no heat dissipating corrugation 17A is mounted, such that the sealing resin 12 may be better arranged on the lower surface of the radiator 306.

As shown in FIG. 18 or 20, the lower surface of the sealing resin 12 may be flush with the back face of the radiator 306. Thus, the heat dissipating corrugation 17A may not be sealed by the sealing resin 12, thereby not influencing the heat dissipating property of the heat dissipating corrugation 17A. The sealing resin 12 may be molded by transfer molding with thermosetting resin, and also may be molded by injection molding with the thermoplastic resin. Herein, the sealing resin 12 seals all the components on the upper surface of the paper radiator 306. As shown in FIG. 18, the lower surface of the sealing resin 12 is flush with a lower end surface of the boss of the heat dissipating area 17B.

The insulating layer 307 may be the insulating materials from manufacturers such as Nitto, Nihon Kagaku Sangyo Co., Ltd. and Denka. In order to improve the thermal conductivity of the insulating layer 307, the insulating layer 307 may be a thermal-conductive insulating layer, a thermal-conductive substance may be contained in the thermal-conductive insulating layer. The thermal-conductive substance may be at least one of silicon dioxide, silicon nitride and silicon carbide, the silicon dioxide, silicon nitride and silicon carbide may be spherical or angular. During the specifically manufacturing, the dopant such as silicon dioxide, silicon nitride and silicon carbide may be added into the insulating material, and pressed on the upper surface of the radiator 306 by means of a hot pressing.

The circuit wirings 308 may be constituted by metal such as copper, and formed at the particular positions on the insulating layer 307. According to power requirement, the circuit wirings 308 may be designed to have a thickness of 0.035 mm or 0.07 mm, and may be designed to have the thickness of 0.07 mm with respect to a general intelligent power module 10. The thickness of the circuit wirings 308 is 0.07 mm in an example of the present disclosure.

Figure 21:
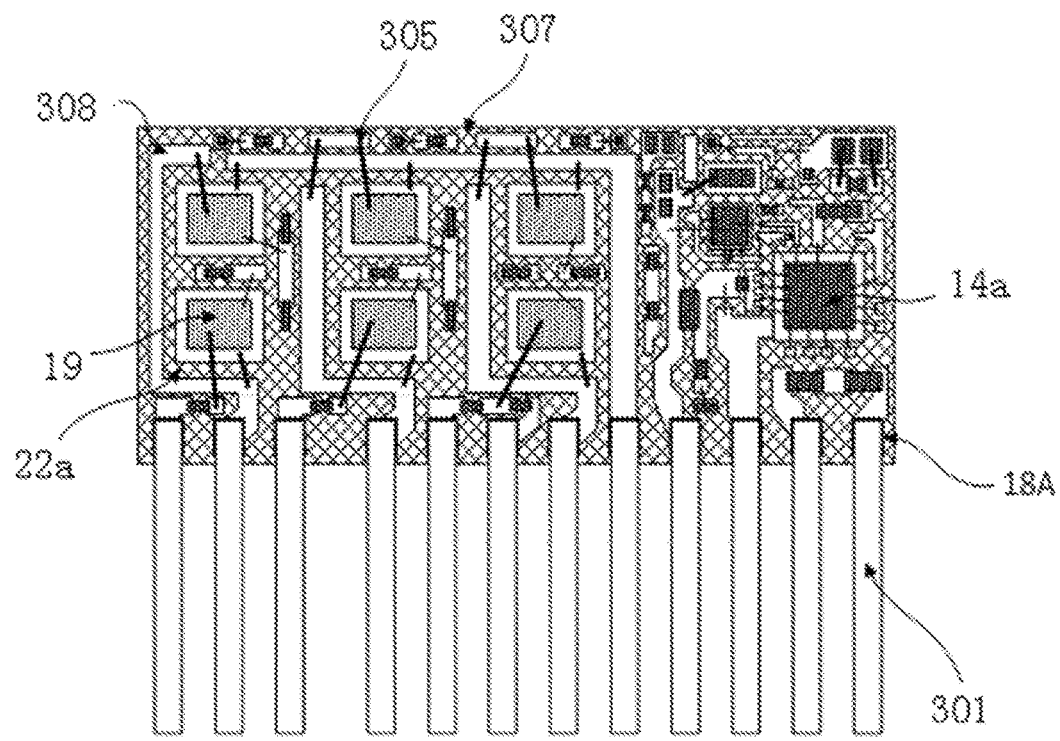
FIG. 21 is a top view of an intelligent power module according to embodiments of the present disclosure, in which a sealing resin is removed.
Figure 21:
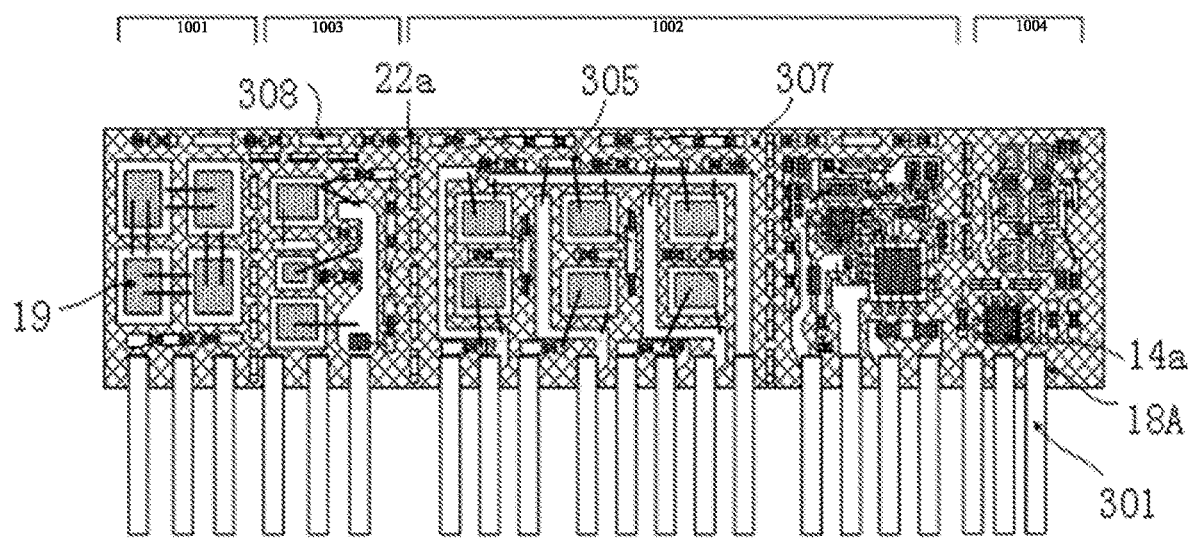

In addition, according to some embodiments of the present disclosure, an edge of at least one side of the insulating layer 307 is provided with a plurality of welding pads 18A, the plurality of welding pads 18A are respectively integrally formed with the plurality of circuit wirings 308. The welding pads 18A may be constituted by the circuit wirings 308. As shown in FIG. 21, the edge of one side of the insulating layer 307 is provided with a plurality of welding pads 18A which are aligned with each other. According to the needs of the function, a plurality of edges of the insulating layer 307 may be provided with the plurality of welding pads 18A.

The power component 19 and the non-power component 14a are fixed to the circuit wiring 308 to constitute the prescribed circuit. In some embodiments of the present disclosure, the power component 19 may be components such as the IGBT tube, the high voltage MOSFET tube, the high voltage FRD tube. The power component 19 is connected to the circuit wiring 308 via the metal wire 305. The non-power component 14a may be an active component such as an integrated circuit, a transistor or a diode or the like, or a passive component such as a capacitor or a resistor or the like, the active component or the like which is mounted face up are connected to the circuit wiring 308 via the metal wire 305.

The metal wire 305 may be configured as an aluminum wire, a gold wire or a copper wire, which allows electrical connections between the power components 19, between the non-power components 14a, and between the circuit wirings 308 through binding, and is sometimes used to allow electrical connections between the pin 301 and the circuit wiring 308, or between the pin 301 and the power component 19, or between the pin 301 and the non-power component 14a.

As shown in FIG. 21, one side of the intelligent power module 10 is provided with a plurality of pins 301, one end of each of the plurality of pins 301 is connected to each of the plurality of welding pads 18A. That is, the pins 301 are fixed to the welding pads 18A arranged to one edge of the circuit board constituted by the insulating layer 307 and the circuit wirings 308, and the pins 301 are configured to, for example, input from or output to the outside. In which, the pins 301 and the welding pads 18A are welded to each other by a conductive electrical adhesive such as a tin solder. The pins 301 may be metal members, the surfaces of the pins 301 may be provided with a nickel-tin alloy layer. For example, the pins 301 may be generally made from metal such as copper. The nickel-tin alloy layer is formed on a surface of the copper by chemical plating and electroplating, thickness of the alloy layer is generally 5 μm. A clad layer may protect the copper from corrosion and oxidation, and may improve weldability.

The manufacturing method of the intelligent power module according to embodiments of the present disclosure may be described in detail in the following with reference to FIG. 22.

Figure 22:
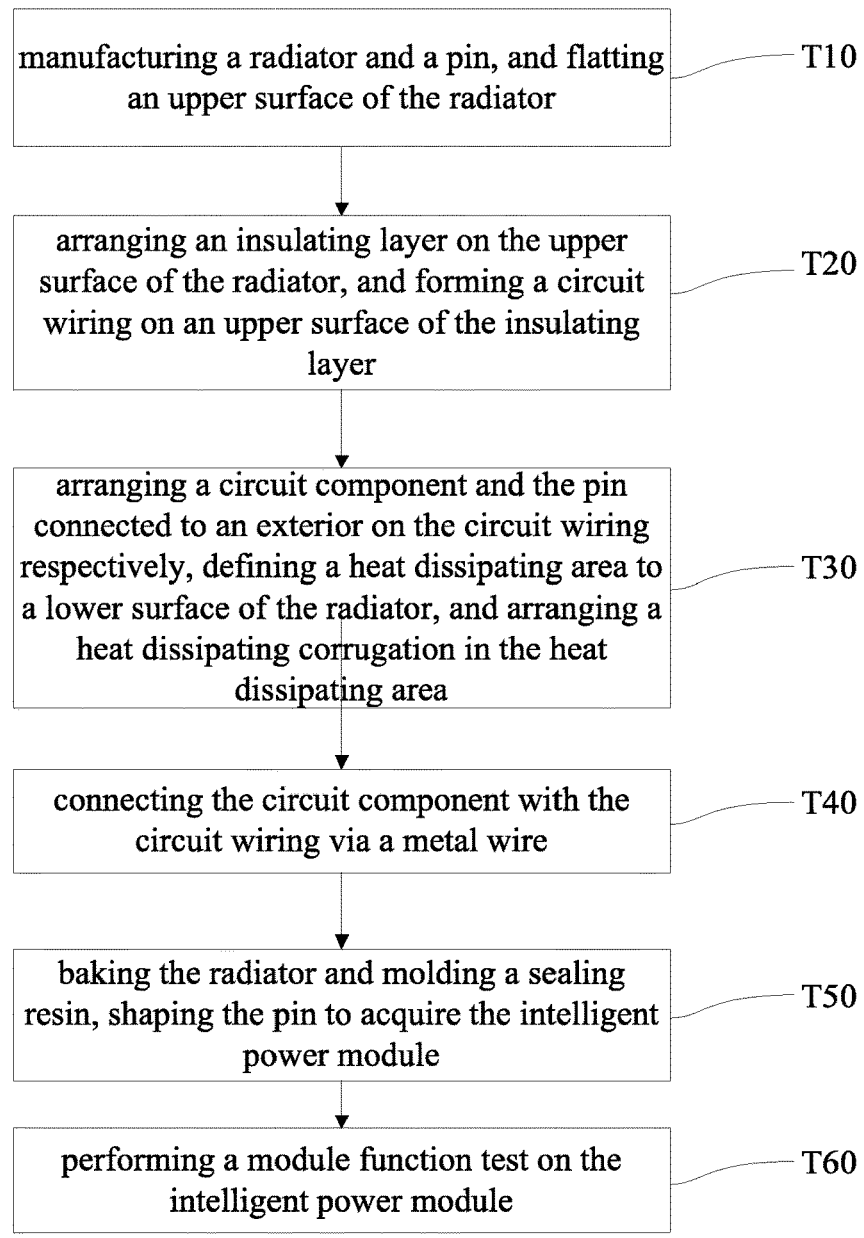
FIG. 22 is a flow chart of a manufacturing method of an intelligent power module according to embodiments of the present disclosure.

As shown in FIG. 22, the intelligent power module may be configured as the above-mentioned intelligent power module, the manufacturing method of the intelligent power module according to embodiments of the present disclosure may include the following steps of:

T10: manufacturing the radiator and the pin, and making the upper surface of the radiator flat.

T20: providing the insulating layer on the upper surface of the radiator, and forming the circuit wiring on the upper surface of the insulating layer.

T30: providing the circuit component and the pin connected to the exterior on the circuit wiring, arranging the heat dissipating area at the position on the lower surface of the radiator corresponding to the power component, and arranging the heat dissipating corrugation in the heat dissipating area.

T40: connecting the power component and the non-power component with the circuit wiring via the metal wire.

T50: baking the radiator and molding the sealing resin, shaping the pin to acquire the intelligent power module.

The manufacturing method of the intelligent power module according to embodiments of the present disclosure has the beneficial effects that: the circuit wiring is formed on the paper radiator and the orderly processing is completed, the paper radiator with the lighter weight has low requirement for the carrier during the processing, the positioning is easier, thereby reducing manufacturing cost, improving the process qualification rate, omitting the process for mounting the power component to the interior of the radiator, and reducing the investment fees for the devices.

The intelligent power module manufactured by means of the above method may be the intelligent power module 10 according to embodiments of the present disclosure. In which, the radiator may be configured as a wet-type carbon composite functional paper radiator.

In the step T20, the step of providing the insulating layer includes doping at least one of the spherical or angular silicon dioxide, silicon nitride and silicon carbide in the insulating material, and then pressing them to the upper surface of the radiator by means of the hot pressing. The upper surface of the insulating layer is provided with the plurality of circuit wirings as well as the plurality of welding pads.

In addition, in the step T20, the plurality of circuit wirings may be formed on the upper surface of the insulating layer. In the step T30, the plurality of circuit wirings each are provided with the circuit components, each circuit component includes the power component and the non-power component, the heat dissipating area corresponds to the power component, and each the circuit wiring is provided with the pin connected to the exterior.

In the step T30, after arranging the pin on the circuit wiring, the radiator may be further cleaned.

In the step T50, the condition of baking the radiator is that: in an oxygen-free environment, the baking time is more than 2 hours and the baking temperature is 110° C. to 140° C.

According to some embodiments of the present disclosure, the manufacturing method of the intelligent power module may further include a step T60 of: performing a module functional test on the intelligent power module, in which, the module functional test includes an insulation and voltage resistance test, a static power test and a delay time test.

In combination with the drawings, several processes for manufacturing the intelligent power module 10 according to embodiments of the present disclosure by means of the above-mentioned manufacturing method will be described in detail in the following.

1. Manufacturing of radiator and heat dissipating corrugation

Specifically, in the process, the wet-type carbon composite material with the suitable dimension is used for forming the paper radiator 306 and the heat dissipating corrugation 17A.

Firstly, referring to FIGS. 2(a), 3, 4 and 32(a), the paper radiator 306 with suitable dimension is designed according to needed circuit layout. With respect to the general intelligent power module, the dimension of one piece may be 64 mm×30 mm with the thickness of 1.5 mm.

Figure 23:
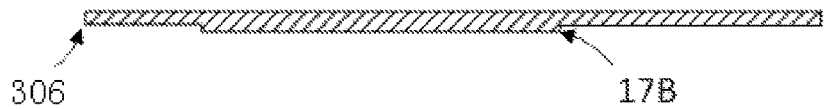
FIG. 23 is a schematic view of the radiator in FIG. 4 with a heat dissipating area added.

Then by means of the high temperature resistant glue of which a tolerable temperature is above 300° C., one surface of the above 64 mm×30 mm rectangular paper radiator is assembled with a rectangle with the same material of which the thickness is 0.5 mm. In the present embodiment, the rectangle may be designed to be 40 mm×25 mm, as the heat dissipating area 17B, as shown in FIG. 23. And then both surfaces may be subject to anti-corrosion treatment and waterproof treatment such as treatment of coating with waterproof glue.

Figure 24:
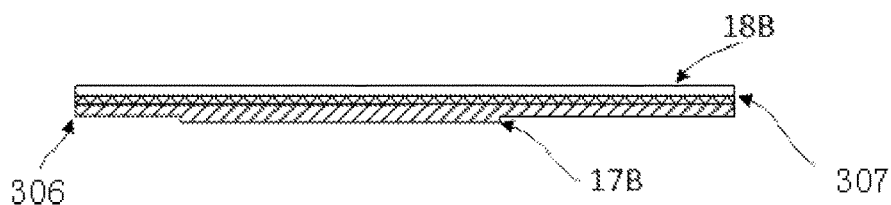
FIG. 24 is a schematic view illustrating that an insulating layer and a copper clad layer are arranged to a radiator of an intelligent power module according to embodiments of the present disclosure.

Referring to FIG. 24, by using the insulating material having the spherical or angular dopant and the copper material and by means of the hot pressing at the same time, the insulating material is formed on the surface of the radiator 306 and configured as the insulating layer 307, and the copper material is formed on the surface of the insulating layer 307 and configured as the copper clad layer 18B. Herein, in order to improve the voltage withstanding characteristics, the thickness of the insulating layer 307 may be 110 μm, and in order to improve the heat dissipating characteristics, the thickness of the insulating layer 307 may be 70 μm. In order to improve the flow capacity, the thickness of the copper clad layer 18B may be 0.07 mm, and in order to reduce cost, the thickness of the copper clad layer 18B may be 0.035 mm or 0.0175 mm.

Referring to FIG. 6 and FIG. 7 which is a sectional view taken along the line X-X' in FIG. 6, specific positions on the copper clad layer 18B are corroded, and the rest part is the circuit wirings 308 and the welding pads 18A.

Figure 25:
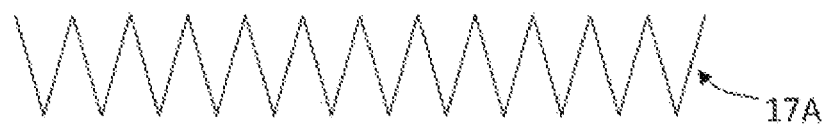
FIG. 25 is a schematic view of a heat dissipating corrugation of an intelligent power module according to embodiments of the present disclosure.

Referring to FIG. 25, the heat dissipating corrugation 17A is formed by making the wet-type carbon composite material with the thickness of 0.5 mm in an irregular shape, and both surfaces thereof are subject to anti-corrosion treatment and waterproof treatment such as treatment of coating with waterproof glue.

Figure 26:
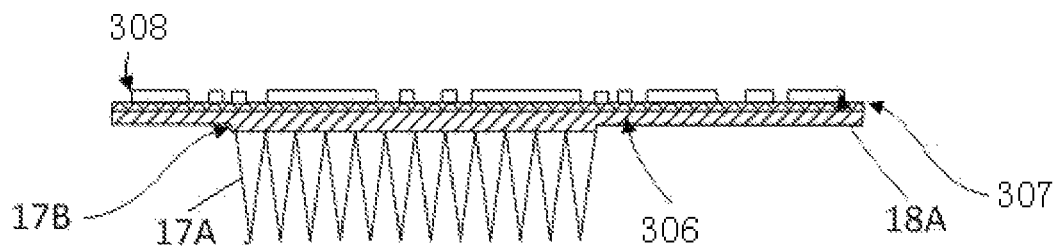
FIG. 26 is a schematic view of an intelligent power module according to embodiments of the present disclosure, in which a heat dissipating corrugation is mounted.

Referring to FIG. 26, by means of the high temperature resistant glue of which a tolerable temperature is above 300° C., the heat dissipating corrugation 17A is adhered to the heat dissipating area 17B on the back face of the paper radiator 306. Herein, the heat dissipating corrugation 17A may not completely cover the back face of the paper radiator 306, and the edge of the back face of the radiator 306 needs to set aside a flattening space of at least 1 mm.

2. Manufacturing of the Pin

In the process, the separate pin 301 with a clad layer is fabricated.

Figure 27:
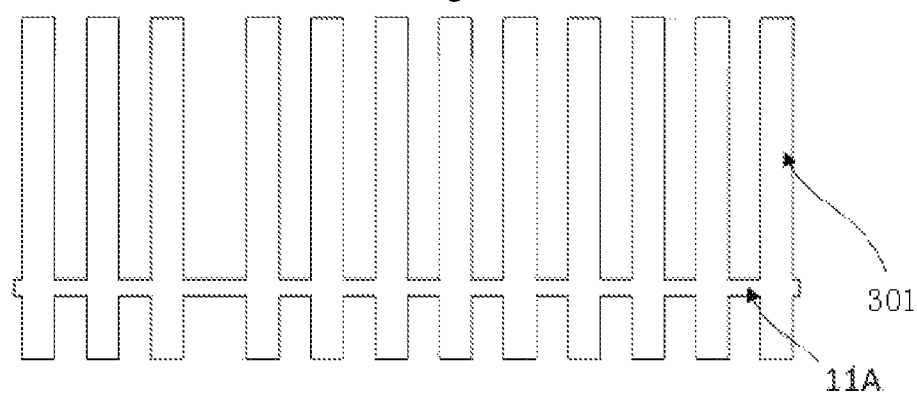
FIG. 27 is a schematic view of a plurality of pins of an intelligent power module according to embodiments of the present disclosure.
Figure 28:
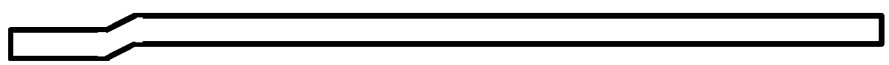
FIG. 28 is a schematic view of a pin of an intelligent power module according to embodiments of the present disclosure.
Figure 28A:

Each pin 301 is made of copper base material, a row of pins 301 are formed by means of stamping or etching shown as FIG. 27. In the present embodiment, the pin 301 is formed by connecting 12 separate pin units via the reinforcing rib 11A. As shown in FIG. 9, the separate pin unit is configured as a long strip having a length C of 25 mm, a width K of 1.5 mm and a thickness H of 1 mm. In order to facilitate the assembly, one end of the pin unit may also be provided with a certain arc by means of pressing, as shown in FIGS. 28 and 28(a).

Then the nickel layer is formed by means of chemical plating. Specifically, by using a mixed solution of nickel salt and sodium hypophosphite with appropriate complexing agent added, a nickel layer is formed on the surface of the copper material which has been formed in a specific shape. The metallic nickel has high passivation capability, and an extremely thin passivation coating may be formed rapidly, thereby withstanding corrosions due to the atmosphere, alkali or some certain acid. A nickeling crystal is extremely tiny and the thickness of the nickel layer is generally 0.1 μm.

Then by means of acid sulfate process and at an indoor temperature, the copper material with the formed shape and coated with the nickel layer is immersed in a plating solution with positive tin ions and is electrified, then a nickel-tin alloy layer is formed on the surface of the nickel layer. The thickness of the alloy layer is generally controlled to be 5 μm, and the formation of the alloy layer greatly improves the protectiveness and the weldability.

3. Mounting of the Components to the Circuit Wiring

Specifically, in the process, the power component 19 and non-power component 14a are mounted to the surface of the circuit wiring 308 and the pin 301 is mounted to the surface of the welding pad 18A.

Firstly, by means of a solder paste printer and a steel mesh, the specific position of the circuit wiring 308 and the welding pad 308 on the insulating layer 307 are coated with solder paste. In order to improve height of solder wicking, the steel mesh with thickness of 0.15 mm may be employed. In order to reduce the risk that the power component 19 and the non-power component 14a shift, the steel mesh with thickness of 0.12 mm may be employed. In the present embodiment, the height of the power component 19 in use is 0.07 mm, which is the lightest component, such that the steel mesh with the thickness of 0.12 mm is chosen.

Figure 29:
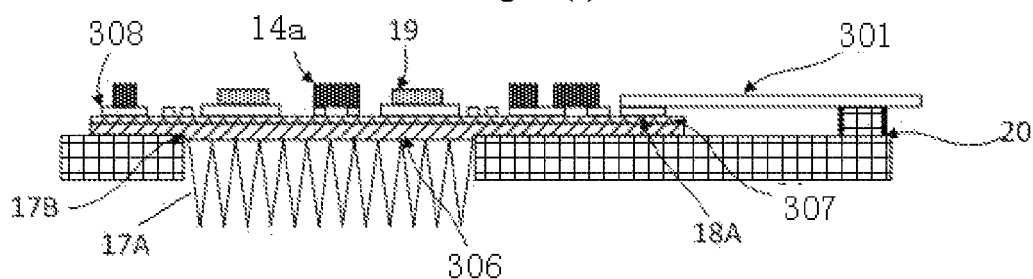
FIG. 29 is a schematic view of an assembled circuit wiring of an intelligent power module according to embodiments of the present disclosure.
Figure 30:
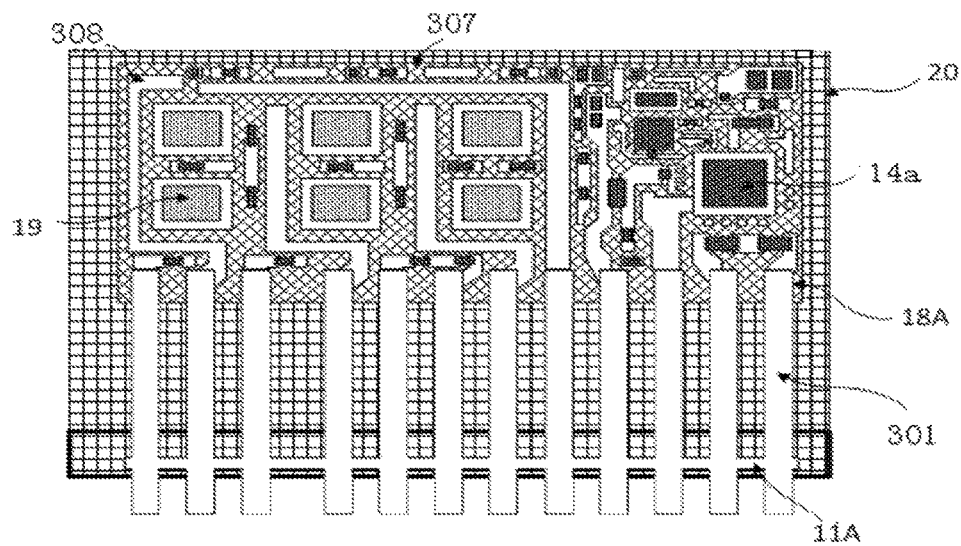
FIG. 30 is a top view of the structure shown in FIG. 29.

Then, referring to the side view FIG. 29 and the top view FIG. 30, the power component 19, the non-power component 14a and the pin 301 are mounted. The power component 19 and the non-power component 14a may be directly placed on the specific position on the circuit wiring 308. However one end of the pin 301 needs to be placed on the welding pad 18A, and the other end needs to be fixed by the carrier 20, the carrier 20 is made from synthetic stone and the like material. Herein, the carrier 20 needs to be subject to a hollowed-out treatment at the bottom, such that the heat dissipating corrugation 17A is exposed. A space having at least 1 mm in distance from the edge of the back face of the radiator 306 and not covered by the heat dissipating corrugation 17A is in contact with the carrier 20 for supporting.

Then, the insulating layer 307 placed on the carrier 20 is subject to the reflow soldering, and the solder paste is solidified, the non-power component 14a and the pin 301 are fixed. Herein, the solder paste of which the solution temperature is 280° C. is chosen.

4. Cleaning of the Radiator

In the process, the paper radiator 306 is cleaned.

Firstly, the radiator 306 is placed in the cleaning machine to be cleaned, and the soldering flux residues such as rosin during the reflow soldering and foreign matter residues such as aluminum wire during the stamping are cleaned out. According to the arrangement density of the non-power component 14a on the circuit wiring 308, the cleaning may be performed by means of spraying or ultrasonic or a combination thereof.

During cleaning, the pin 301 is clamped by a mechanical arm, and the radiator 306 is placed in a cleaning tank, and it is noted that the mechanical arm could not touch the radiator 306, as the radiator 306 has brittleness and is prone to deform. If the mechanical arm clamps the radiator 306, vibration generated during the cleaning may cause the radiator 306 to crack.

5. Connecting Process

Figure 2B:
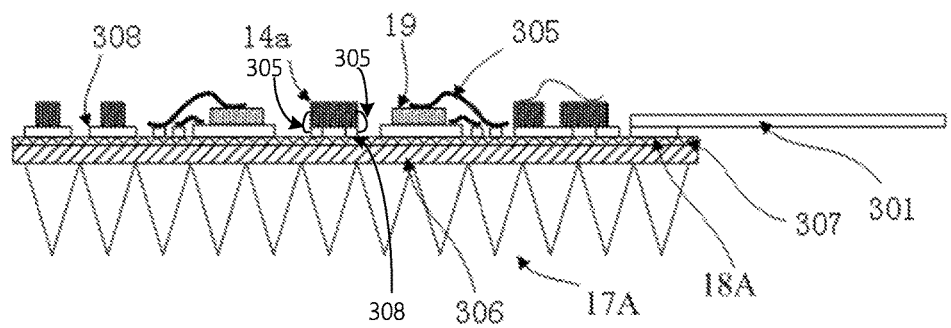

Referring to FIGS. 2(b) and 32(b), in the process, connections between the power component 19, the non-power component 14a, the radiator 13 and the circuit wiring 308 are formed.

According to needs of the flow capacity, an aluminum wire with suitable diameter is used as a binding wire, and with respect to the integrated circuit for signal control, the gold wire may also be considered as the binding wire. In the present embodiment, the aluminum wire is used. In generally, the aluminum wire of 350 μm-400 μm is used for binding the power component 19, the aluminum wire of 38 μm-200 μm is used for binding the non-power component 14a, and the aluminum wire of 350 μm-400 μm is used for binding the radiator 13.

Figure 31:
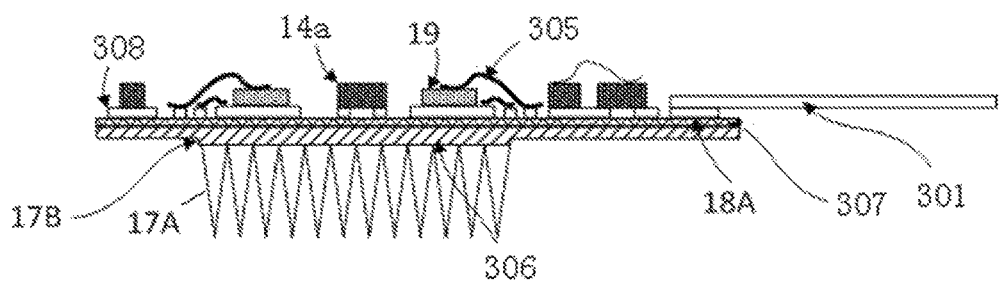
FIG. 31 is a schematic view of the structure shown in FIG. 29, in which a connecting process is performed.

The product after the process is shown in the side view FIG. 31 and the top view FIG. 32.

6. Sealing the Radiator

Figure 33:
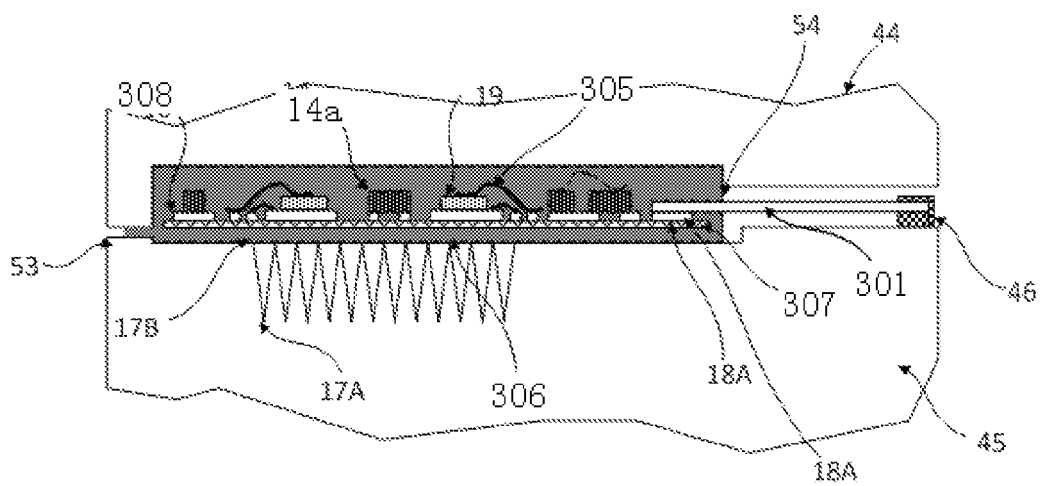
FIG. 33 is a schematic view of the structure shown in FIG. 31, in which a sealing resin is added.

In the process, the sealing resin 12 is used to seal the paper radiator 306. FIG. 33 illustrates a cross sectional view of a process for o sealing the paper radiator 306 with the sealing resin 12 by means of a mold 50.

Firstly, the paper radiator 306 is baked in an oxygen-free environment. A baking time should not be less than 2 hours and a baking temperature should be 125° C.

The paper radiator 306 provided with the pin 301 is conveyed to a mold 44 and 45. By making the specific part of the pin 301 in contact with a fixing device 46, the paper radiator 306 is positioned. The heat dissipating area 17B is made flush with the bottom of a molding chamber, and an ejector pin with a height of 1 mm may also be mounted to the bottom of the molding chamber, to ensure the height be not too low.

When the mold is closed, the paper radiator 306 is placed in the molding chamber formed inside the mold 50, and the sealing resin 12 is injected from a pouring gate 53. The sealing method may adopt the transfer molding of the thermosetting resin or the injection molding of the thermosetting resin. Moreover, gas inside the molding chamber corresponding to the sealing resin 12 injected from the pouring gate 53 is discharged to the exterior via an air outlet 54.

Herein, the back face of the paper radiator 306 is fitted closely to the lower mold 45. In order to improve the closely fitting, an ejector pin may also be added to the upper mold, however there is still a small amount of sealing resin 12 entering a gap between the back face of the paper radiator 306 and the lower mold 45. Therefore, after demolding, laser etching or grinding are needed to remove the small amount of sealing resin 12 residual on the back face of the radiator 306, such that the back face of the radiator 306 may be exposed from the sealing resin 12, and the part of the radiator 306 above the back face is sealed by the sealing resin 12.

7. Shaping of the Pin and Module Function Test

Figure 34:
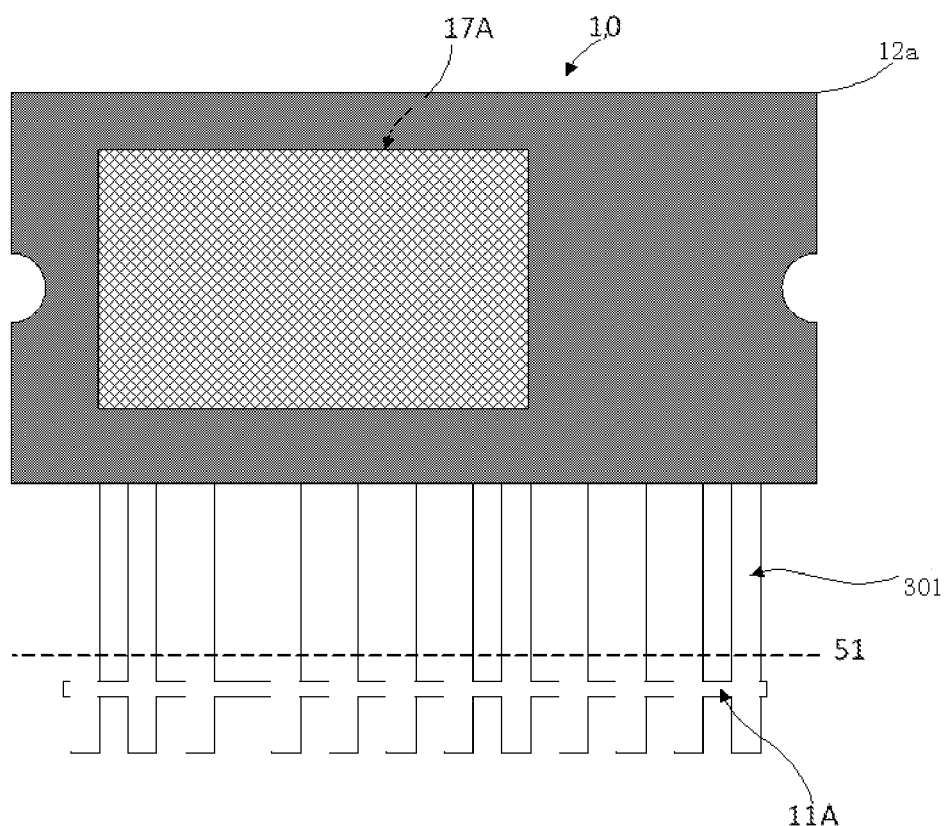
FIG. 34 is a schematic view of the structure shown in FIG. 33, in which a pin is cut off.

Referring to FIG. 34, in the process, the pin 301 is trimmed and shaped and the module function test is carried, the intelligent power module 10 becomes a finished product after the process.

In the former process, i.e., the transfer molding process, the other parts apart from the pin 301 are sealed by the resin 12. In the present process, according to requirement for length and shape to be used, for example, the exterior pin 301 is cut off from the position of a dotted line 51, and may be bent into a certain shape sometimes, to make it convenient for the follow-up assembly.

Then the module is placed in the test device to get a common electrical parameter test, which generally includes test items such as the insulation and voltage resistance test, the static power test and the delay time test. The qualified module through the test is a finished product. By means of the above processes, the intelligent power module 10 shown in FIGS. 17-19 is finished.

Other components and other operation steps of the manufacturing method of the intelligent power module 10 according to embodiments of the present disclosure are known to those skilled in the art, which will not be described in detail.

The intelligent power module 10 according to embodiments of the present disclosure will be described in detail with reference to the drawings in the following.

Figure 35:
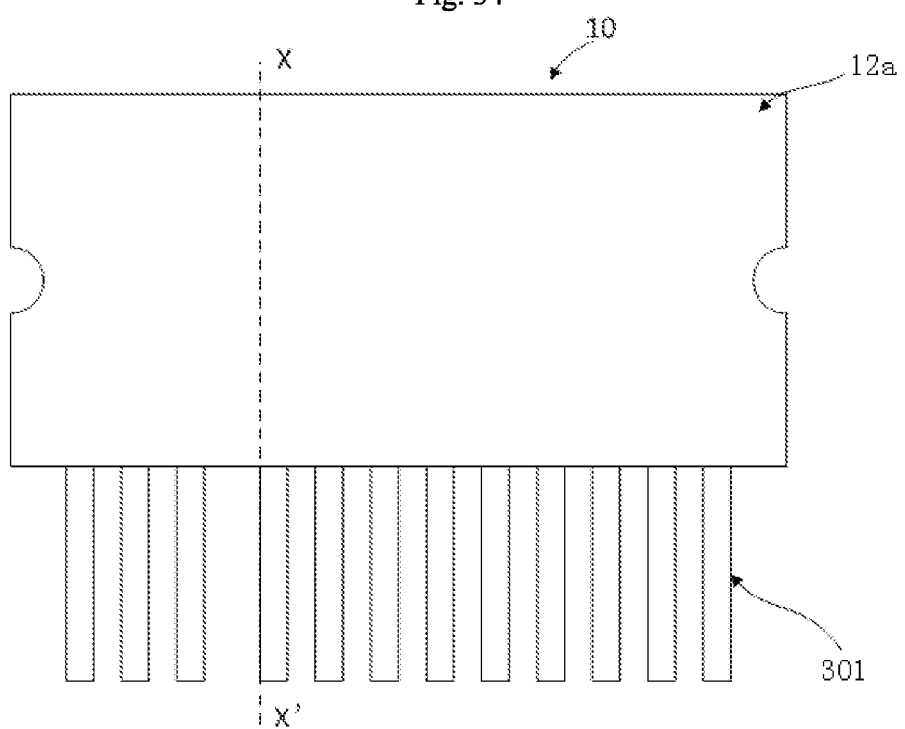
FIG. 35 is a schematic view of an intelligent power module according to embodiments of the present disclosure.
Figure 38:
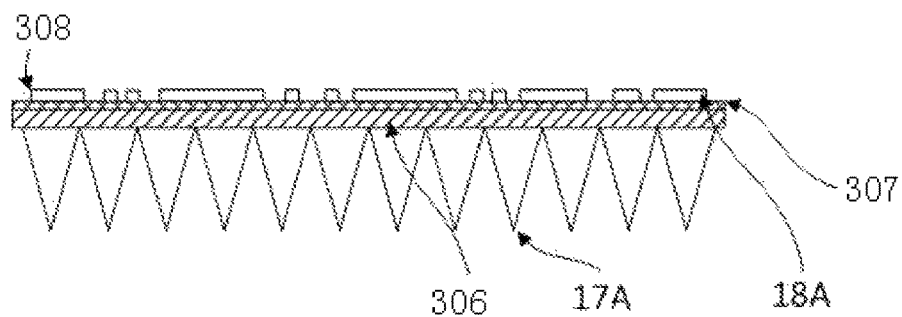
FIG. 38 is a schematic view of an intelligent power module according to embodiments of the present disclosure, in which a heat dissipating corrugation is mounted.
Figure 39:
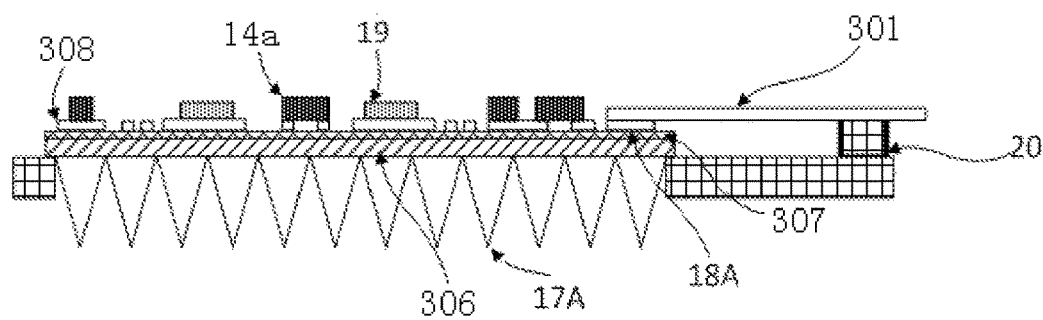
FIG. 39 is a schematic view of an assembled circuit wiring of an intelligent power module according to embodiments of the present disclosure.
Figure 40:
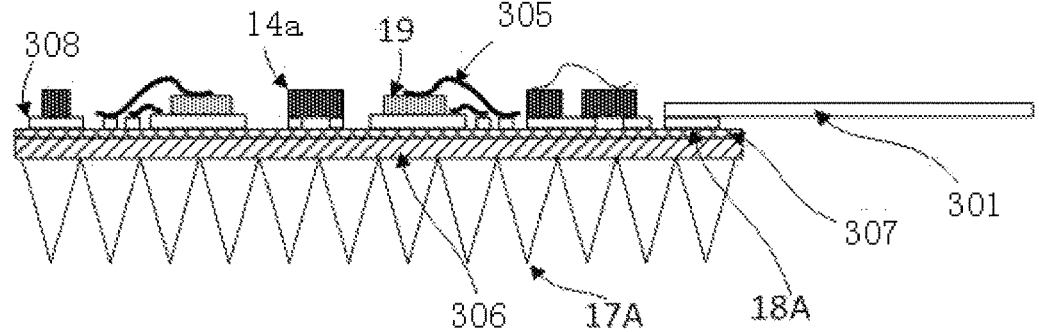
FIG. 40 is a schematic view of the structure shown in FIG. 39, in which a connecting process is performed.
Figure 41:
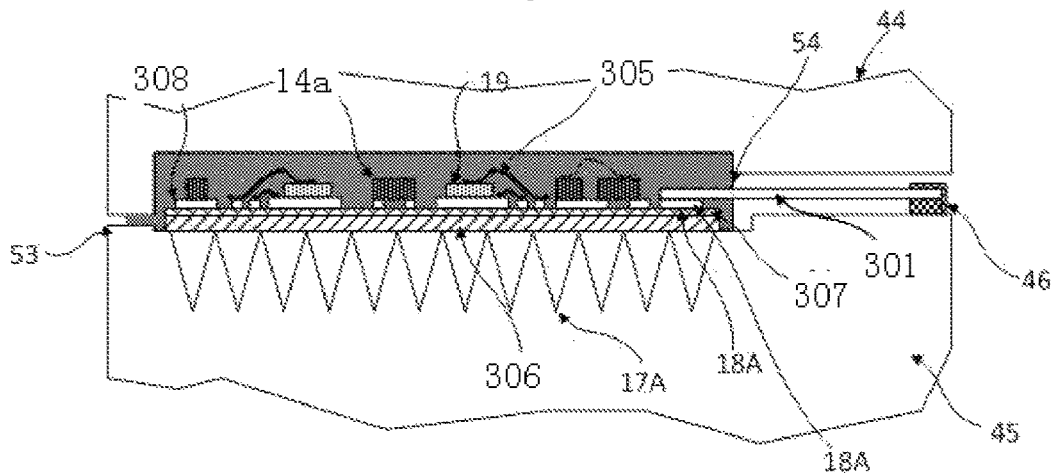
FIG. 41 is a schematic view of the structure shown in FIG. 40, in which a sealing resin is added.
Figure 42:
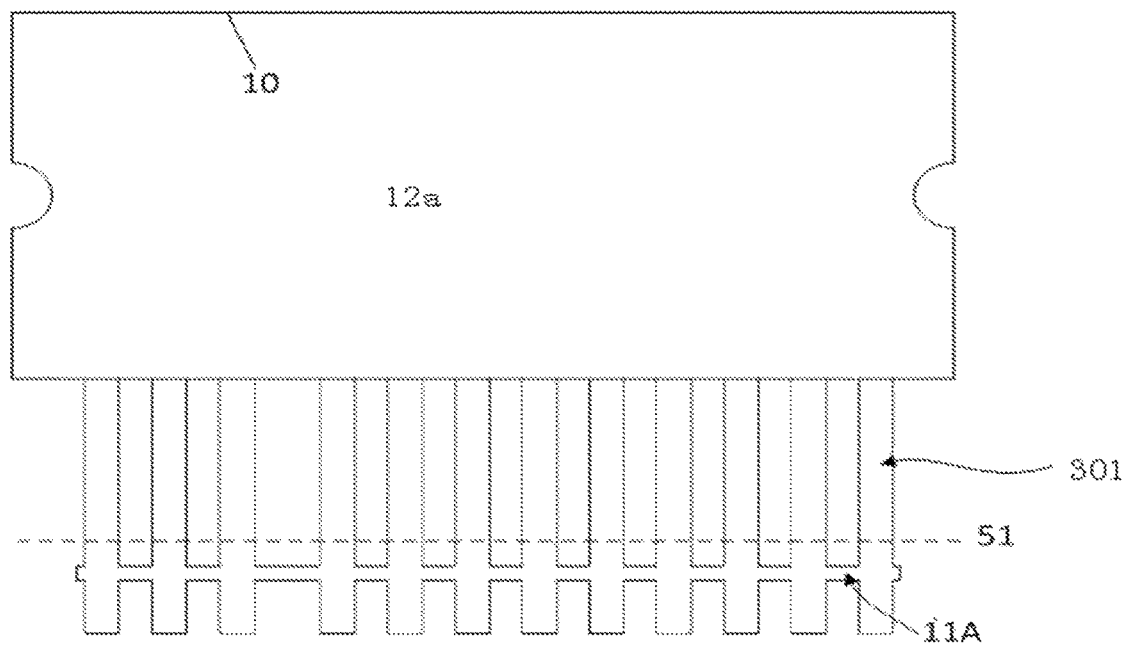
FIG. 42 is a schematic view of the structure shown in FIG. 41, in which a pin is cut off.

As shown in FIGS. 35, 36 and 21, the intelligent power module 10 according to embodiments of the present disclosure includes the radiator 306, the insulating layer 307, the plurality of circuit wirings 308, the power component 19, the non-power component 14a, the plurality of pins 301 and the sealing resin 12.

Specifically, the upper surface of the radiator 306 is flat, the lower surface of the radiator 306 is provided with the heat dissipating corrugation 17A. The insulating layer 307 is arranged to the upper surface of the radiator 306. The plurality of circuit wirings 308 are spaced apart from each other and are arranged to the insulating layer 307. The power component 19 and the non-power component 14a are respectively arranged to the plurality of circuit wirings 308. The power component 19 is electrically connected to the circuit wiring 308 via the metal wire 305, and the non-power component 14a is electrically connected to the circuit wiring 308 via the metal wire 305. One end of each of the plurality of pins 301 is connected to the plurality of circuit wirings 308, and the other end of each of the plurality of pins 301 extends out of the intelligent power module 10 and is connected to the other exterior parts. The sealing resin 12 completely seals the plurality of circuit wirings 308 and covers the upper surface of the radiator 306.

In the intelligent power module 10 according to embodiments of the present disclosure, the radiator 306 is arranged below the insulating layer 307 and the lower surface of the radiator 306 is provided with the heat dissipating corrugation 17A, increasing greatly the heat dissipating area of the intelligent power module 10, such that the insulating layer 307 may satisfy the requirement of the power component for heat dissipation without using the high thermal-conductive material. Meanwhile, during the application process of the intelligent power module 10, the exterior needs not to be provided with a radiator, thereby reducing the application difficulty and cost and improving assembly quality. The structure reduces the cost while improving the reliability, and may be designed to be compatible with functions and pins of the current intelligent power module, thereby being convenient for promotion and application of the intelligent power module 10.

There may be various kinds of the radiator 306 may be formed to be multiple, for example, according to some embodiments of the present disclosure, the radiator 306 may be constituted by the wet-type carbon composite functional paper. A graphite paper may be actually prepared by powdery and fibrous carbon materials through the combined machining. The material is capable of withstanding the high temperature above 350° C. and may be folded into any shapes according to needs, thereby acquiring the heat dissipating corrugation 17A. As the paper radiator constituted by the paper material has the light weight, the total weight of the intelligent power module 10 is reduced, thereby being convenient for the long-distance transportation and assembly by workers, and reducing the cost.

In order to facilitate the description, one side of the radiator 306 which is provided with the heat dissipating corrugation 17A may be called as the back face, and an opposite side may be called as the surface of the radiator 306. According to some embodiments of the present disclosure, the area of an orthographic projection of the heat dissipating corrugation 17A on the lower surface of the radiator 306 is less than the area of the lower surface of the radiator 306A. The distance between the outer edge of the heat dissipating corrugation 17A and the outer edge of the lower surface of the radiator 306 is more than 1 mm, that is, the heat dissipating corrugation 17A could not completely cover the back face of the radiator 306, instead a flattening space of at least 1 mm is set aside at the edge of the back face of the radiator 306.

As shown in FIG. 36, the lower surface of the sealing resin 12 may be flush with the back face of the radiator 306. Thus, the heat dissipating corrugation 17A may not be sealed by the sealing resin 12, thereby not influencing the heat dissipating properties of the heat dissipating corrugation 17A. The sealing resin 12 may be molded by transfer molding with thermosetting resin, and also may be molded by injection molding with the thermoplastic resin. Herein, the resin 12 seals all components on the surface of the paper radiator 306.

The manufacturing method of the intelligent power module according to embodiments of the present disclosure will be described in combination of the drawings in detail in the following.

As shown in FIG. 37, the manufacturing method of the intelligent power module according to embodiments of the present disclosure includes:

P10: manufacturing the radiator and the pin, making the upper surface flat, and arranging the heat dissipating corrugation on the lower surface of the radiator.

P20: arranging the insulating layer on the upper surface of the radiator, and arranging the circuit wiring on the upper surface of the insulating layer.

P30: arranging the circuit component and the pin connected to the exterior on the circuit wiring.

P40: connecting the circuit component with the circuit wiring via the metal wire.

P50: baking the radiator and molding the sealing resin, shaping the pin to acquire the intelligent power module.

The manufacturing method of the intelligent power module according to embodiments of the present disclosure has the beneficial effects that: the circuit wiring is formed on the paper radiator and the orderly processing is completed, the paper radiator with the lighter weight has low requirement for the carrier during the processing, the positioning is easier, thereby reducing manufacturing cost, improving the process qualification rate, omitting the process for mounting the power component to the interior of the radiator, and reducing the investment fees for the devices.

The intelligent power module manufactured by means of the above method may be the intelligent power module 10 according to embodiments of the present disclosure. In which, the radiator may be configured as a wet-type carbon composite functional paper radiator.

In the step P20, the step of arranging the insulating layer includes doping at least one of the spherical or angular silicon dioxide, silicon nitride and silicon carbide in the insulating material, and then pressing them to the upper surface of the radiator by means of the hot pressing. The upper surface of the insulating layer is provided with the plurality of circuit wirings as well as provided with the plurality of welding pads. In addition, in the step P20, the plurality of circuit wirings may be formed on the upper surface of the insulating layer. Each circuit wiring is provided with the circuit component, each circuit component includes the power component and the non-power component, the heat dissipating area corresponds to the power component, and each circuit wiring is provided with the pin connected to the exterior.

In the step P30, after the circuit wiring is provided with the pin, the radiator may be further cleaned.

In the step P50, the condition of baking the radiator is that: in an oxygen-free environment, the baking time is more than 2 hours and the baking temperature is 110° C. to 140° C.

According to some embodiments of the present disclosure, the manufacturing method of the intelligent power module may further include a step P60 of: performing a module functional test on the intelligent power module. In which, the module functional test includes an insulation and voltage resistance test, a static power test and a delay time test.

The manufacturing processes of the intelligent power module 10 in the present embodiment may be as same as the manufacturing processes of the intelligent power module 10 in the above-mentioned embodiment, which will not be elaborated herein.

The manufacturing method of the intelligent power module according to embodiments of the present disclosure will be described in combination of the drawings in detail in the following.

The manufacturing method of the power module according to an embodiment of the present disclosure includes:

Q10: forming the radiator;

Q20: taking the radiator as a power module base material, and forming the insulating layer at one side of the power module base material;

Q30: forming a welding area and the pin at one side of the insulating layer not in contact with the radiator;

Q40: mounting at least one power component in a power welding area of the welding area;

Q50: forming the sealing layer to complete the fabricating of the intelligent power module.

In the manufacturing method of the power module according to embodiments of the present disclosure, by forming the radiator, heat conductive area and heat conductive efficiency of the power module are increased effectively, problems of the power component such as burning loss or failure caused by poor heat dissipation are reduced, thus improving the reliability of the power module and reducing failure rate of the power module. In addition, by gathering the plurality of power modules in the same area, the radiator can be prepared in the above same area without increasing the fabricating complexity, in the meanwhile, the heat from the plurality of power modules can be avoided from transmitting to the non-power module.

In addition, the manufacturing method of the power module according to the above embodiment of the present disclosure may further have the following additional technical features:

The welding area also includes a non-power welding area, at least one non-power component is mounted in the non-power welding area.

The step Q10 includes a step Q11 of: forming the radiator by using a wet-type carbon composite layer.

The step Q30 includes a step Q31 of: forming the heat dissipating corrugation at one side of the radiator not in contact with the insulating layer, the heat dissipating corrugation is corresponding to the area where the at least one non-power component is.

In the manufacturing method of the power module according to embodiments of the present disclosure, by using the wet-type carbon composite layer to form the radiator and forming the heat dissipating corrugation, the heat dissipation area and the heat dissipation efficiency of the power module are increased effectively. In the meanwhile, as the wet-type carbon composite layer has the extremely high mechanical strength, the thickness of the radiator may be reduced effectively, thereby reducing the volume of the power module.

According to an embodiment of the present disclosure, the step Q40 includes:

Q41: coating a first solder paste layer on the power welding area;

Q42: after mounting the at least one power component in the power welding area, processing the first solder paste layer by means of the reflow soldering to solidify the first solder paste layer;

Q43: coating a second solder paste layer on a non-power welding area;

Q44: after mounting at least one non-power component in the non-power welding area, processing the second solder paste layer by means of the reflow soldering to solidify the second solder paste layer;

Q45: making the radiator subject to a cleaning treatment, in which the cleaning treatment includes a spraying treatment and/or an ultrasonic cleaning treatment.

In the manufacturing method of the power module according to embodiments of the present disclosure, by correctly welding the power module to the power welding area by means of the first solder paste layer, and when dismounting the power module which is mounted by mistake or damaged, the first solder paste layer may be heated rapidly to achieve the disassembly of the power module.

In the manufacturing method of the power module according to embodiments of the present disclosure, by correctly welding the non-power module to the non-power welding area by means of the second solder paste layer, and when dismounting the non-power module which is mounted by mistake or damaged, the second solder paste layer may be heated rapidly to achieve the disassembly of the non-power module. In addition, by adding the step of cleaning treatment, a surface impurity such as soldering flux may be eliminated effectively, thereby increasing the adhesion of the follow-up material and reducing the stress problem caused by the surface impurity.

According to an embodiment of the present disclosure, the step of forming the insulating layer at one side of the power module base material includes the following specific steps of: forming a heat conductive insulating layer at one side of the power module base material, the heat conductive insulating layer includes one or more heat conductive insulating base layer of a silicon dioxide layer, a silicon nitride layer and a silicon carbide layer; and making the heat conductive insulating layer subject to a hot pressing treatment to form the insulating layer.

In the manufacturing method of the power module according to embodiments of the present disclosure, by adding the insulating layer constituted by the heat conductive insulating base layer, a short circuit between the power modules may be avoided effectively. In addition, the heat conductive insulating base layer includes a large amount of inorganic composition, further improving the heat dissipation efficiency of the power module.

According to an embodiment of the present disclosure, the step Q30 includes:

Q'31: forming a metal seed layer at one side of the insulating layer not in contact with a radiation layer, in which, a thickness of the metal seed layer is 0.01 to 0.1 micrometers;

Q'32: making the seed layer subject to an electroplating treatment to form the circuit wiring, in which, the thickness of the circuit wiring is 1 to 5 micrometers;

Q'33: etching the circuit wiring to form the welding area, the pin and the welding pad;

Q'34: connecting the metal wire between the welding area, the pin and the welding pad.

According to an embodiment of the present disclosure, the step of forming the welding area and the pin at the one side of the insulating layer not in contact with the radiator includes the following specific steps of: forming the circuit wiring at the one side of the insulating layer not in contact with the radiator; etching the circuit wiring to form the welding area, the pin and the welding pad; and forming the metal wire between the welding area, the pin and the welding pad.

According to an embodiment of the present disclosure, the step of forming the circuit wiring at the one side of the insulating layer not in contact with the radiator includes the following specific steps of: forming a metal seed layer at one side of the insulating layer not in contact with the radiator, in which, thickness of the metal seed layer is 0.01 to 0.1 micrometers; making the seed layer subject to an electroplating treatment to form the circuit wiring, in which, the thickness of the circuit wiring is 1 to 5 micrometers;

According to an embodiment of the present disclosure, the step of forming the sealing layer to complete the fabricating of the power module includes the following specific steps of: making the thermoplastic resin subject to an injection molding treatment to form a sealing layer to complete the fabricating of the power module, in which, the area of the transfer molding treatment is an area on the power module apart from the corrugation area.

According to an embodiment of the present disclosure, the step of forming the sealing layer to complete the fabricating of the power module includes the following specific steps of: making the thermoplastic resin subject to an injection molding treatment to form a sealing layer to complete the fabricating of the power module, in which, the area of the transfer molding treatment is an area on the power module apart from the corrugation area.

The manufacturing process of the power module according to embodiments of the present disclosure includes the following steps.

(1) the step of forming the radiator 306 and the heat dissipating corrugation 17A

The paper radiator 306 with suitable dimension is designed according to needed circuit layout. With respect to the general intelligent power module, the dimension of one piece may be 64 mm×30 mm, and the thickness of 1.5 mm. Then by means of the high temperature resistant glue of which a tolerable temperature is above 300° C., one surface of the above 64 mm×30 mm rectangular paper radiator is assembled with a rectangle with the same material of which the thickness is 0.5 mm.

By using the insulating material having the spherical or angular dopant and the copper material and by means of the hot pressing at the same time, the insulating material is formed on the surface of the radiator 306 and configured as the insulating layer 307, and the copper material is formed on the surface of the insulating layer 307 and configured as the circuit wiring 308. Herein, in order to improve the voltage withstanding characteristics, the thickness of the insulating layer 307 may be designed to be 110 μm, and in order to improve the heat dissipating characteristics, the thickness of the insulating layer 307 may be designed to be 70 μm. Herein, in order to improve the flow capacity, the thickness of the circuit wiring 308 may be designed to be 0.07 mm, and in order to reduce cost, the thickness of the circuit wiring 308 may be designed to be 0.035 mm or 0.0175 mm.

The specific position on the circuit wiring 308 is corroded, and the rest part is the metal wire 305 and the welding pad 18A. The wet-type carbon composite material with the thickness of 0.5 mm is formed in in irregular shape as the heat dissipating corrugation 17A, and both surfaces thereof are subject to anti-corrosion treatment and waterproof treatment such as treatment of coating with waterproof glue. By means of the high temperature resistant glue of which a tolerable temperature is above 300° C., the heat dissipating corrugation 17A is adhered to the back face of the paper radiator 306.

(2) The Step of Forming the Pin 301

Each pin 301 is made of copper base material and by means of stamping or etching. The pin 301 is formed by connecting twelve separate pin units via the reinforcing rib. The separate pin unit is configured as a long strip having a length C of 25 mm, a width K of 1.5 mm and a thickness H of 1 mm. Sometimes, in order to facilitate the assembly, one end of the pin unit may also be provided with a certain arc by means of pressing. Then the nickel layer is formed by means of chemical plating. By using a mixed solution of nickel salt and sodium hypophosphite with appropriate complexing agent added, a nickel layer is formed on the surface of the copper material which has been formed in a specific shape. The metallic nickel has high passivation capability, and an extremely thin passivation coating may be formed rapidly, thereby withstanding corrosions due to the atmosphere, alkali or some certain acid. A nickeling crystal is extremely tiny and the thickness of the nickel layer is generally 0.1 μm. Then by means of acid sulfate process and at an indoor temperature, the copper material with the formed shape and coated with the nickel layer is immersed in a plating solution with positive tin ions and is electrified, then a nickel-tin alloy layer is formed on the surface of the nickel layer. The thickness of the alloy layer is generally controlled to be 5 μm, and the formation of the alloy layer greatly improves the protectiveness and the weldability.

(3) The Step of Forming the Power Component 19, the Non-Power Component 14a, the Circuit Wiring 308 and the Welding Pad 18A

Firstly, by means of a solder paste printer and a steel mesh, the specific position of the metal wire 305 and the welding pad 18A on the insulating layer 307 are coated with solder paste. In order to improve height of solder wicking, the steel mesh with thickness of 0.15 mm may be adopted. In order to reduce the risk that the power component 19 and the non-power component 14a shift, the steel mesh with thickness of 0.12 mm may be adopted. In the present embodiment, the height of the power component 19 in use is 0.07 mm, which is the lightest component, such that the steel mesh with the thickness of 0.12 mm is adopted.

Then, the power component 19, the non-power component 14a and the pin 301 are mounted. The power component 19 and the non-power component 14a may be directly placed on the specific position of the metal wire 305. However one end of the pin 301 needs to be placed on the welding pad 18A, and the other end needs to be fixed by the carrier, the carrier is made from synthetic stone and the like material. Herein, the carrier needs to be subject to a hollowed-out treatment at the bottom, such that the heat dissipating corrugation 17A is exposed. A space having at least 1 mm in distance from the edge of the back face of the radiator 306 and not covered by the heat dissipating corrugation 17A is in contact with the carrier for supporting.

Then, the insulating layer 307 placed on the carrier 20 is subject to the reflow soldering, and the solder paste is solidified, the non-power component 14a and the pin 301 are fixed.

Herein, the solder paste of which the solution temperature is 280° C. is adopted.

(4) The Step of Forming the Metal Wire 305

Firstly, the radiator 306 is placed in the cleaning machine to be cleaned, and the soldering flux residues such as rosin during the reflow soldering and foreign matter residues such as aluminum wire during the stamping are cleaned out. According to the arrangement density of the non-power component 14a on the circuit wiring 308, the cleaning may be performed by means of spraying or ultrasonic or a combination thereof.

During cleaning, the pin 301 is clamped by a mechanical arm, and the radiator 306 is placed in a cleaning tank, and it is noted that the mechanical arm could not touch the radiator 306, as the radiator 306 has brittleness and is prone to deform. If the mechanical arm clamps the radiator 306, vibration generated during the cleaning may be prone to cause the radiator 306 to crack.

(5) The Step of Forming the Binding Wire

According to needs of the flow capacity, an aluminum wire with suitable diameter is adopted as a binding wire, and with respect to the integrated circuit for signal control, the gold wire may also be considered as the binding wire. In the present embodiment, the aluminum wire is adopted. In generally, the aluminum wire of 350 μm-400 μm is used for binding the power component 19, the aluminum wire of 38 μm-200 μm is used for binding the non-power component 14a, and the aluminum wire of 350 μm-400 μm is used for binding the radiator 13.

The power module includes: a bridge functional module 1001, a compressor inverter functional module 1002, a power factor correction functional module 1003, and a fan inverter functional module 1004.

The step of forming the resin sealing layer 12a

Firstly, the paper radiator 306 is baked in an oxygen-free environment. A baking time should not be less than 2 hours and a baking temperature should be 125° C.

The paper radiator 306 provided with the pin 301 is conveyed to a mold. By making the specific part of the pin 301 in contact with a fixing device, the paper radiator 306 is positioned. A boss is made flush with the bottom of a molding chamber, and an ejector pin with a height of 1 mm may also be mounted to the bottom of the molding chamber, to ensure the height be not too low.

When the mold is closed, the paper radiator 306 is placed in the molding chamber formed inside the mold, and the sealing resin is injected from a pouring gate. The sealing method may adopt the transfer molding of the thermosetting resin or the injection molding of the thermosetting resin. Moreover, gas inside the molding chamber corresponding to the sealing resin injected from the pouring gate is discharged to the exterior via an air outlet.

Herein, the back face of the paper radiator 306 is fitted closely to the lower mold. In order to improve the closely fitting, an ejector pin may also be added to the upper mold, however there is still a small amount of sealing resin entering a gap between the back face of the paper radiator 306 and the lower mold. Therefore, after demolding, laser etching or grinding are needed to remove the small amount of sealing resin residual on the back face of the radiator 306, such that the back face of the radiator 306 may be exposed from the sealing resin, and the part of the radiator 306 above the back face is sealed by the resin sealing layer 12a.

(7) The Step of Making the Pin 301 Subject to the Follow-Up Treatment

In the former process, i.e., the transfer molding process, the other parts apart from the pin 301 are sealed by the resin sealing layer 12a. In the present process, according to requirement for length and shape to be used, for example, the exterior pin 301 is cut off from the position of a dotted line, and may be bent into a certain shape sometimes, to make it convenient for the follow-up assembly.

Then the module is placed in the test device to get a common electrical parameter test, which generally includes test items such as the insulation and voltage resistance test, the static power test and the delay time test. The qualified module through the test is a finished product.

By means of the above processes, the manufacturing of the power module is completed.

The technical scheme of the present disclosure is described in detail in combination of the drawings in the above. In the manufacturing method of the power module of the present disclosure, by forming the radiator, heat conductive area and heat conductive efficiency of the power module are increased effectively, problems of the power component such as burning loss or failure caused by poor heat dissipation are reduced, thus improving the reliability of the power module and reducing failure rate of the power module. In addition, by gathering the plurality of power modules in the same area, the radiator can be prepared in the above same area without increasing the fabricating complexity, in the meanwhile, the heat from the plurality of power modules can be avoided from transmitting to the non-power module.

Figure 46A:
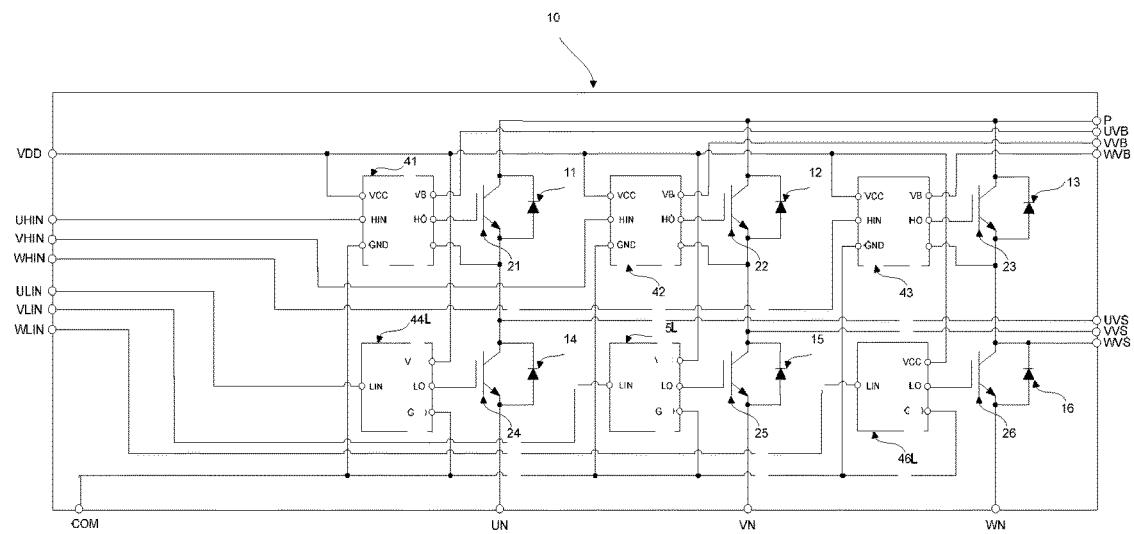
FIG. 46 (A) is a circuit diagram of an intelligent power module of embodiments of the present disclosure.
Figure 46B:
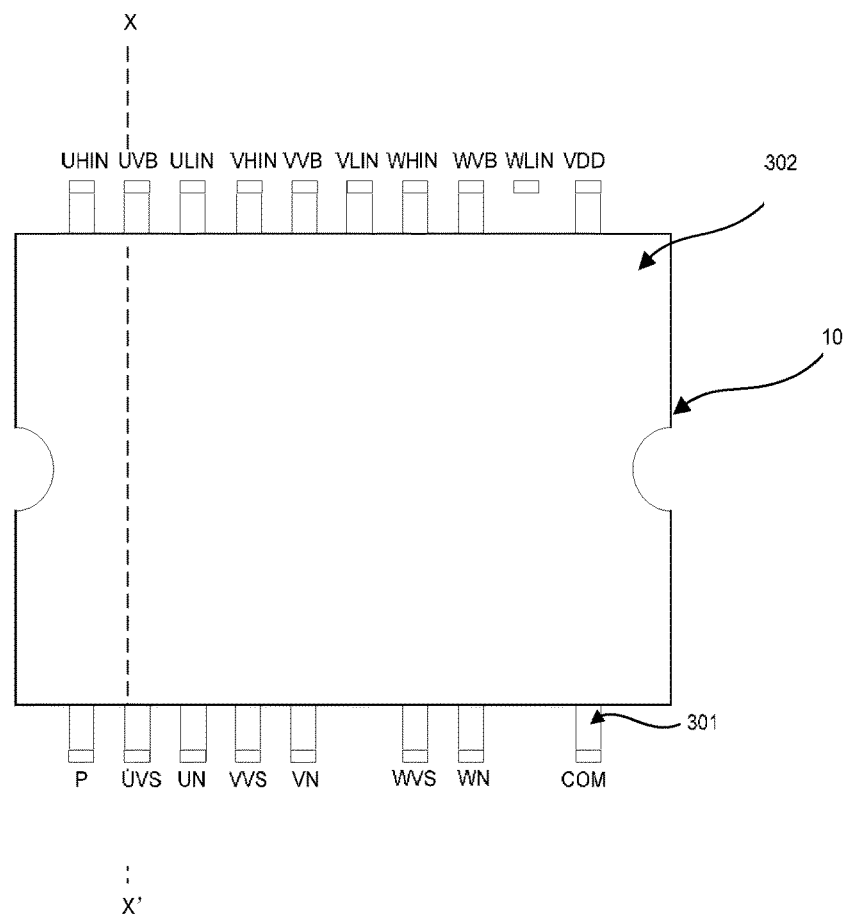
Figure 46:
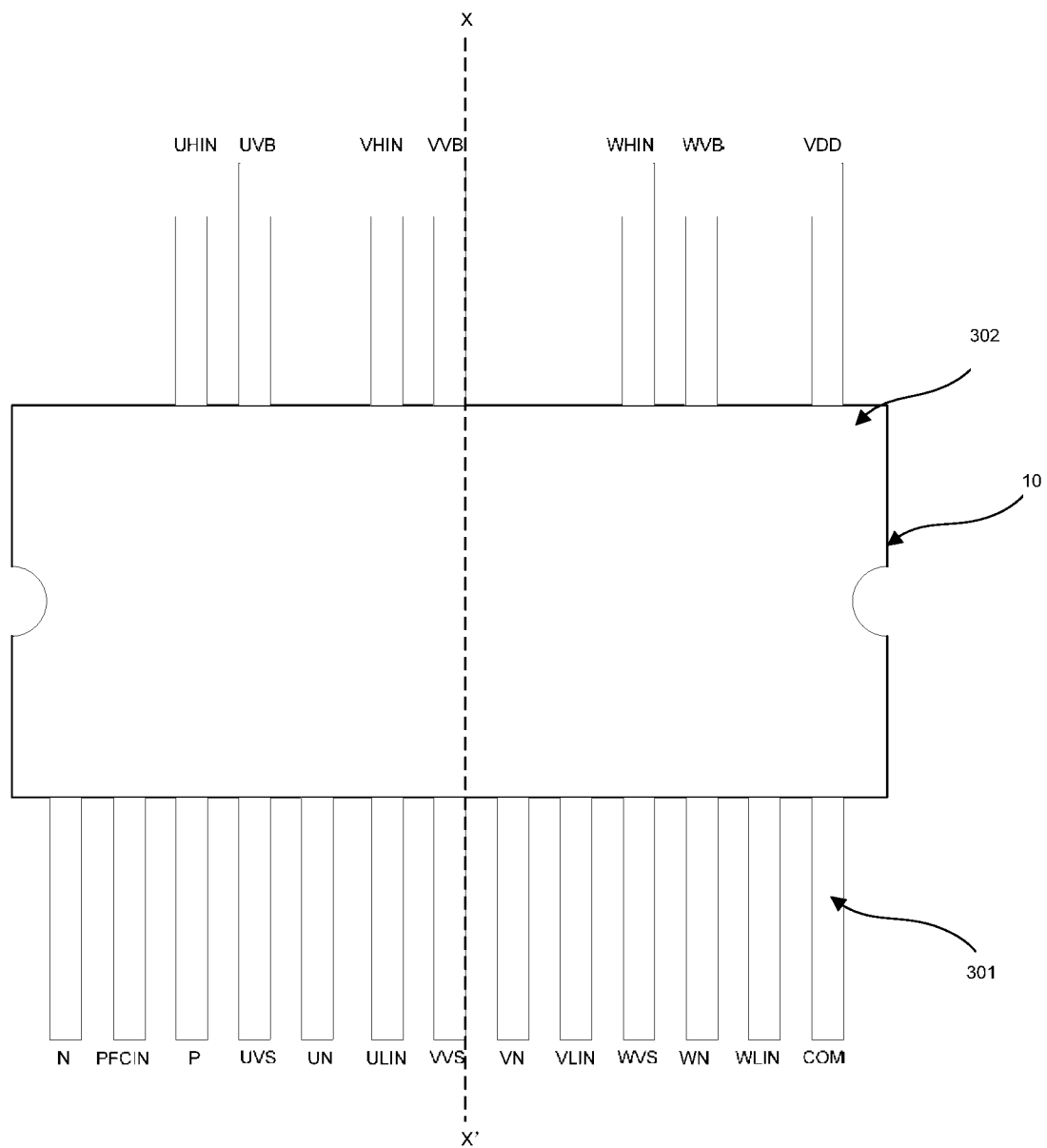

As shown in FIGS. 46(A) and 46(AA), a circuit diagram of an intelligent power module according to embodiments of the present disclosure is provided.

In the intelligent power module provided by the present disclosure, a U-phase high voltage drive integrated tube 41, a V-phase high voltage drive integrated tube 42 and a W-phase high voltage drive integrated tube 43 are three single-armed HVIC tubes for driving an upper bridge-arm IGBT tube. Their structures are completely same, and they serve to transmit logic signals of 0-5V of an input terminal HIN to an output terminal HO, in which the HO is a logic signal of VS-VS+15V. Since the VS may vary within 0-300V, so the U-phase high voltage drive integrated tube 41, the V-phase high voltage drive integrated tube 42 and the W-phase high voltage drive integrated tube 43 may be achieved by means of a high voltage resistant tape-out process. Sometimes in order to reduce the cost, a BCD process of 650V may be used and in order to reduce the design difficulty of a voltage resistant structure, a SOI process of 650V may be used.

In the intelligent power module provided by the present disclosure, a U-phase low voltage drive integrated tube 44L, a V-phase low voltage drive integrated tube 45L and a W-phase low voltage drive integrated tube 46L are three single-armed LVIC tubes for driving a lower bridge-arm IGBT tube. Their structures are completely same, and they serve to transmit logic signals of 0-5V of an input terminal LIN to an output terminal LO, in which the LO is a logic signal of 0-15V. Since the U-phase low voltage drive integrated tube 44L, the V-phase low voltage drive integrated tube 45L and the W-phase low voltage drive integrated tube 46L need not to be achieved by means of a high voltage resistant tape-out process, sometimes in order to reduce the cost, a Bipolar process of 20V may be used and in order to improve consistency, a BCD process of 20V may be used.

In the intelligent power module provided by the present disclosure, a first low voltage drive integrated tube 47 is a single-armed LVIC tube configured to drive a high speed IGBT tube 27 of a power factor correction circuit part. In order to save the cost, the Bipolar process of 20V may be used to tape out, and in consideration of reducing the power consumption, the BCD process of 20V also may be used.

In the intelligent power module provided by the present disclosure, a first IGBT tube, a second IGBT tube, a third IGBT tube, a fourth IGBT tube, a fifth IGBT tube, a sixth IGBT tube, a first FRD tube, a second FRD tube, a third FRD tube, a fourth FRD tube, a fifth FRD tube and a sixth FRD tube are corresponding to an IGBT tube 21, an IGBT tube 22, an IGBT tube 23, an IGBT tube 24, an IGBT tube 25, an IGBT tube 26, an FRD tube 11, an FRD tube 12, an FRD tube 13, an FRD tube 14, an FRD tube 15 and an FRD tube 16 shown in FIG. 46 (C).

An VCC (i.e., a power supply terminal) of the U-phase high voltage drive integrated tube 41 and the U-phase low voltage drive integrated tube 44L, an VCC of the V-phase high voltage drive integrated tube 42, the V-phase low voltage drive integrated tube 45L and an VCC of the W-phase high voltage drive integrated tube 43, the W-phase low voltage drive integrated tube 44L and the PFC drive integrated tube 47 are connected and configured as a VDD terminal of the intelligent power module 10. The VDD is a power supply of a low voltage area of the intelligent power module 10, and the VDD is generally 15V.

The HIN terminal (i.e., the input terminal) of the U-phase high voltage drive integrated tube 41 is configured as a U-phase upper bridge-arm input terminal UHIN of the intelligent power module 10; the HIN terminal of the V-phase high voltage drive integrated tube 42 is configured as a V-phase upper bridge-arm input terminal VHIN of the intelligent power module 10; the HIN terminal of the W-phase high voltage drive integrated tube 43 is configured as a W-phase upper bridge-arm input terminal WHIN of the intelligent power module 10; the LIN terminal (an input terminal) of the U-phase low voltage drive integrated tube 44L is configured as a U-phase lower bridge-arm input terminal ULIN of the intelligent power module 10; the LIN terminal of the V-phase low voltage drive integrated tube 45L is configured as a V-phase lower bridge-arm input terminal VLIN of the intelligent power module 10; the LIN terminal of the W-phase low voltage drive integrated tube 46L is configured as a W-phase lower bridge-arm input terminal WLIN of the intelligent power module 10; the PIN terminal of the first low voltage drive integrated tube 47 is configured as an input terminal PFCIN of the power factor correction circuit (PFC circuit) of the intelligent power module 10.

Seven input circuits of the intelligent power module 10 including the U phase, the V phase, the W phase and the PFC are used to receive the input signals of 0-5V.

A GND terminal (i.e., a ground terminal) of the U-phase high voltage drive integrated tube 41, a GND terminal of the V-phase high voltage drive integrated tube 42, a GND terminal of the W-phase high voltage drive integrated tube 43, a GND terminal of the U-phase low voltage drive integrated tube 44L, a GND terminal of the V-phase low voltage drive integrated tube 45L, a GND terminal of the W-phase low voltage drive integrated tube 46L and a GND terminal of the first low voltage drive integrated tube 47 are connected and configured as a COM terminal of the intelligent power module 10. The COM terminal is configured as a negative terminal of the VDD power supply.

A VB terminal (i.e., a positive terminal of high voltage power supply) of the U-phase high voltage drive integrated tube 41 is configured as a positive terminal UVB of a U-phase high voltage area power supply of the intelligent power module 10; a VB terminal of the V-phase high voltage drive integrated tube 42 is configured as a positive terminal VVB of a V-phase high voltage area power supply of the intelligent power module 10; a VB terminal of the W-phase high voltage drive integrated tube 43 is configured as a positive terminal WVB of a W-phase high voltage area power supply of the intelligent power module 10; the HO terminal (i.e., input terminal) of the U-phase high voltage drive integrated tube 41 is connected to a grid of the IGBT tube 21, the VS terminal (i.e., the negative terminal of the high voltage power supply) of the U-phase high voltage drive integrated tube 41, an emitter of the IGBT tube 21, an anode of the FRD tube 11, a collector of the IGBT tube 24 and a cathode of the FRD tube 14 are connected and configured as a negative terminal UVS of a U-phase high voltage area power supply of the intelligent power module 10.

The HO terminal of the V-phase high voltage drive integrated tube 42 is connected with a grid of the IGBT tube 22, the VS terminal of the V-phase high voltage drive integrated tube 42, an emitter of the IGBT tube 22, an anode of the FRD tube 12, a collector of the IGBT tube 25 and a cathode of the FRD tube 15 are connected and configured as a negative terminal VVS of a V-phase high voltage area power supply of the intelligent power module 10.

The HO terminal of the W-phase high voltage drive integrated tube 43 is connected with a grid of the IGBT tube 23, the VS terminal of the W-phase high voltage drive integrated tube 43, an emitter of the IGBT tube 23, an anode of the FRD tube 13, a collector of the IGBT tube 26 and a cathode of the FRD tube 16 are connected and configured as a negative terminal WVS of a W-phase high voltage area power supply of the intelligent power module 10.

A collector of the IGBT tube 21, a cathode of the FRD tube 11, a collector of the IGBT tube 22, a cathode of the FRD tube 12, a collector of the IGBT tube 23, a cathode of the FRD tube 13 and a cathode of a high power FRD tube 18 are connected and configured as a high voltage input terminal P of the intelligent power module 10. The P is generally connected to 300V.

The LO terminal (i.e., the output terminal) of the U-phase low voltage drive integrated tube 44L is connected with a grid of the IGBT tube 24, an emitter of the IGBT tube 24 and an anode of the FRD tube 14 are connected and configured as a U-phase low voltage reference terminal UN of the intelligent power module 10.

The LO terminal of the V-phase low voltage drive integrated tube 45L is connected with a grid of the IGBT tube 25, an emitter of the IGBT tube 25 and an anode of the FRD tube 15 are connected and configured as a V-phase low voltage reference terminal VN of the intelligent power module 10.

The LO terminal of the W-phase low voltage drive integrated tube 46L is connected with a grid of the IGBT tube 26, an emitter of the IGBT tube 26 and an anode of the FRD tube 16 are connected and configured as a W-phase low voltage reference terminal WN of the intelligent power module 10.

A POUT terminal of the first low voltage drive integrated tube 47 is connected with a grid of the high speed IGBT tube 27, an emitter of the high speed IGBT tube 27 is connected with an anode of a small power FRD tube 17, a collector of the high speed IGBT tube 27 is connected with a cathode of the small power FRD tube 17 and an anode of a high power FRD tube 18. Herein the small power FRD tube 17 is not necessary, and may not be accessed in other embodiments.

Referring to FIGS. 46(B), 46(C) and 46(D), FIG. 46(B) is a top view of a preferable embodiment of an intelligent power module of the present disclosure, FIG. 46 (C) is a cross sectional view along a line X-X' of FIG. 46 (B), FIG. 46 (D) is a front top view illustrating that a sealing resin is removed from an intelligent power module according to embodiments of the present disclosure.

The intelligent power module 10 of the present disclosure has the paper radiator 306 provided with the insulating layer 307 on the surface, the circuit wiring 308 arranged to the insulating layer 307, the IGBT tube 21, the IGBT tube 22, the IGBT tube 23, the IGBT tube 24, the IGBT tube 25, the IGBT tube 26, the high speed IGBT tube 27, the HVIC tube 41, the HVIC tube 42, the HVIC tube 43, the HVIC tube 44H, the HVIC tube 45H and the HVIC tube 46H arranged to the circuit wiring 308, the FRD tube 11, the FRD tube 12, the FRD tube 13, the FRD tube 14, the FRD tube 15, the FRD tube 16, the small power FRD tube 17 and the high power FRD tube arranged to a bearing tray 309 and the pin 301 arranged at the edge of the circuit wiring 308.

One side of the radiator 306 is configured as the front face, and the other side is configured as the back face.

The front face of the radiator 306 is covered with the insulating layer 307, the circuit wiring 308 is arranged to the surface of the insulating layer 307 far away from the radiator 306.

The back face of the radiator 306 is provided with a corrugation 320 for heat dissipation.

In which, the radiator 306 and the corrugation 320 each may adopt the wet-type carbon composite functional paper.

The radiator 306 may be adhered to the corrugation 320 by means of the high temperature resistant glue, or the two may be integrally formed.

In addition, the intelligent power module 10 may further include: the pin 301 arranged at the edge of the circuit wiring 308, the metal wire 305 for forming the electrical connections between the above components, and the sealing resin 302 configured to seal the circuit and at least completely cover all the components on the upper surface of the radiator 306.

In addition, the intelligent power module 10 may further include: the metal wire 305 used to connect the circuit wiring 308, the IGBT tube 21, the IGBT tube 22, the IGBT tube 23, the IGBT tube 24, the IGBT tube 25, the IGBT tube 26, the FRD tube 11, the FRD tube 12, the FRD tube 13, the FRD tube 14, the FRD tube 15, the FRD tube 16, and the FRD tube 17 to form the corresponding circuit.

In addition, the intelligent power module 10 may further include: the pin 301 arranged at the edge of the power module, connected with the circuit wiring 308 and configured as the input and output by extending outwards.

In addition, according to the needs of a circuit layout inside the intelligent power module 10 and peripheral applications, the pin 301 may be arranged at one edge, two edges, three edges or four edges of the intelligent power module 10.

Each component of the intelligent power module 10 according to embodiments of the present disclosure will be described in detail in the following.

The paper radiator 306 is the wet-type carbon composite functional paper. Graphite paper may be formed by powdery and fibrous carbon materials through the combined machining. The material is capable of withstanding the high temperature above 350° C. and may be folded into any shapes according to needs, thereby acquiring the heat dissipating corrugation 320. In order to improve corrosion resistance and waterproofness, the surface may be subject to waterproof treatment. The radiator 306 and the heat dissipating corrugation 320 are integrally formed, in which the radiator 306 has a regular shape and the heat dissipating corrugation 320 has an irregular shape. The radiator 306 and the heat dissipating corrugation 320 may be configured as the wet-type carbon composite materials with different thickness, and the way of different thickness is adopted by the present embodiment. In which, in order to increase mechanical strength, the radiator 306 adopts a thicker wet-type carbon composite material, of which the thickness may be designed to be 1.5 mm, and in order to lower cost and increase corrugation density, the heat dissipating corrugation 320 adopts a thinner wet-type carbon composite material, of which the thickness may be designed to be 0.5 mm. Herein, one side of the radiator 306 which is provided with the heat dissipating corrugation 320 may be called as a back face, and an opposite side may be called as a surface of the radiator 306. Herein, the heat dissipating corrugation 320 may not completely cover the back face of the paper radiator 17. An edge of the back face of the radiator 306 needs to set aside a flattening space of at least 1.5 mm.

One surface of the paper radiator 306 covered by the insulating layer 307 is called as the front face of the paper radiator 306. The resin material such as epoxy resin may be filled with fillers such as aluminum oxide in high concentration to improve the thermal conductivity, as well as the dopant such as silicon dioxide, silicon nitride, silicon carbide and the like may be added to reach a higher thermal conductivity. Herein, the dopant may be spherical or angular, which is press fitted to the surface of the radiator 306 by means of a hot pressing.

The circuit wiring 308 is constituted by metal such as copper, and is formed at the particular position of the paper radiator 306. According to power requirement, the circuit wiring 308 may be designed to have a thickness of 0.035 mm or 0.07 mm, and may be preferably designed to have the thickness of 0.07 mm with respect to a general intelligent power module. The thickness of 0.07 mm is adopted in the present embodiment. In particular, the edge of the paper radiator 306 is formed with the circuit wiring 308 configured to mount the pin 301. Herein, a plurality of circuit wirings 308 configured to mount the pin 301 are arranged around the two sides of the paper radiator 306. According to functional needs, the plurality of circuit wirings 308 configured to mount the pin 301 may be arranged around one side, two sides, three sides or four sides of the paper radiator 306.

The IGBT tubes 21-27 and the FRD tubes 11-18 are fixed to the circuit wiring 308 to form the prescribed circuit. Herein, as to the seven IGBT tubes, one side having the emitter and grid is mounted face up, the side having the collector is mounted face down, and as to the FRD tube, the side having the anode is mounted face up, and the side having the cathode is mounted face down.

The HVIC tube 41 is fixed to the IGBT tube 21, the HVIC tube 42 is fixed to the IGBT tube 22, the HVIC tube 43 is fixed to the IGBT tube 23, the LVIC tube 44L is fixed to the IGBT tube 24, the LVIC tube 45L is fixed to the IGBT tube 25, and the LVIC tube 46L is fixed to the IGBT tube 26. Herein, the position of the IGBT tube to which the HVIC tube and the LVIC tube are fixed is configured as an emitter, with respect to the general IGBT tube of 30A, the area of the emitter may not be less than 6 mm$^2$, and with respect to the general single-armed HVIC tube and the single-armed LVIC tube, the area may not be less than 2 mm$^2$.

The thickness of the bearing tray 309 is designed to be 1 mm. In order to improve the heat dissipation, with respect to the intelligent power module having current capacity of above 30 A, the thickness also may be designed to be 1.5-2 mm. In order to save the cost and further reduce the volume, with respect to the intelligent power module having current capacity of below 15 A, the thickness also may be designed to be 0.2-0.5 mm. The side of the bearing tray 309 mounted with the FRD tube is provided with a flat part, and the side of the bearing tray 309 mounted with the FRD tube is provided with one or more protrusion parts 310 at an edge away from the flat part. Height of the protrusion part 310 is equivalent to a sum±1 μm of the thickness of the FRD tube and the thickness of the IGBT tube. In order to improve the flow capacity, the number of the protrusion parts 310 may be 5. In order to simplify the process, the number of the protrusion parts 310 may be 2. In the present embodiment the number is designed to be 3.

The cathodes of the FRD tubes 11-16 are fixed to the flat part on the front face of the bearing tray 309, and the side of the FRD tubes 11-16 having the anode faces up.

The anodes of the FRD tubes 11-16 are connected with the emitters of the IGBT tube 21-26 respectively by means of conductive solder, such as silver glue, solder paste and the like. The protrusion parts 310 are connected with the circuit wiring 308 connected with the collector of the IGBT tube 21-26 respectively by means of conductive solder, such as silver glue, solder paste and the like. Herein, the current capacity of the FRD tube is generally designed to be below a half of that of the corresponding IGBT tube. Thus, the area of the FRD tube is far less than the area of the IGBT tube. Therefore, when the anode of the FRD tube is completely in contact with the emitter of the IGBT tube, part of the anode and the grid of the IGBT tube may be exposed.

The HVIC tubes 41-46 are respectively fixed to the circuit wiring 308 adjacent to the IGBT tubes 21-26.

The metal wire 305 may be an aluminum wire, a gold wire or a copper wire, which allows an electrical connection between the circuit components and the circuit wiring 308 through binding, and is sometimes used to allow an electrical connection between the pin 301 and the circuit wiring 308.

The pin 301 is fixed to the circuit wiring 308 which is arranged at the edge of the paper radiator 306, and configured to, for example, to input from or output to the outside. Herein, two opposite sides are designed to have a plurality of pins 301 thereon, the pins 301 and the circuit wiring 308 are welded to each other by a conductive electrical adhesive such as a tin solder. The pins 301 are generally made from metal such as copper. A nickel-tin alloy layer is formed on a surface of the copper by chemical plating and electroplating, thickness of the alloy layer is generally 5 µm. A clad layer may protect the copper from corrosion and oxidation, and may improve weldability.

The resin 302 may be molded by transfer molding with the thermosetting resin as well as be molded by injection molding with the thermoplastic resin.

Compared with the prior art, the intelligent power module 10 of embodiments of the present disclosure has the following beneficial effects:

1. In the intelligent power module, the low voltage area drive circuit may be achieved by the LVIC tube, the high voltage area drive circuit may be achieved by the HVIC tube. The LVIC tube may be achieved by means of low-cost low voltage process such as BIPOLAR or COMS, the HVIC tube may be achieved by means of high voltage process such as BCD or SOI, the process cost of the former is merely one third of the latter, thereby reducing the manufacturing cost of the intelligent power module.

2. In the intelligent power module, the respectively separate HVIC tube or the LVIC tube is arranged to the IGBT tube, and a trace of the grid from the HVIC tube or the LVIC tube to the IGBT tube may be consistent, thereby effectively ensuring the consistency of the dynamic characteristics of the six IGBT tubes. A rising edge and a falling edge of one IGBT for the power factor correction may be configured to be very steep, and the area of the circuit wiring may be saved largely, thereby reducing the area of the circuit board of the intelligent power module, making the cost of the intelligent power module further reduced.

3. As the power module structure of the present disclosure may adopt a smaller inductance and capacitance, the reduction of the distributed inductance and capacitance may make the dynamic power consumption of the intelligent power module of the present disclosure reduced significantly. Moreover in the present disclosure, the circuit board is replaced by the paper radiator, the aluminum radiator is replaced by the heat dissipating corrugation, such that the weight of the intelligent power module is reduced, the cost of material and transportation is reduced with it.

4. The FRD tube and the IGBT tube are arranged in a three-dimensional manner, such that the contact area is increased, the trace length between the power components is lowered to the minimum, the metal wire for connection is omitted, the area is further reduced significantly, and the cost of the intelligent power module is further reduced.

From the above, the intelligent power module 10 of the present disclosure reduces the cost meanwhile reducing the volume and weight, and improving the heat dissipation effect.

In addition, a manufacturing method of the intelligent power module 10 is further provided by an embodiment of the present disclosure and includes the following steps.

Step S1 includes forming the paper radiator 306, covering the insulating layer 307 on the front face of the radiator 306, and forming the circuit wiring 308 on the surface of the insulating layer 307;

specifically, according to the set circuit layout, choosing the wet-type carbon composite material with a predetermined dimension to form the paper radiator 306;

using the insulating material and copper material on the front face of the radiator 306, and by means of hot pressing, making the insulating material formed on the surface of the radiator 306 as the insulating layer 307, and making the copper material formed on the surface of the insulating layer 307 as the copper clad layer; and afterwards, corroding a particular position on the copper clad layer, and making the rest part formed as the circuit wiring 308.

Step S2 includes mounting the IGBT tubes 21-27, the FRD tubes 11-18, the HVIC tubes 41-43, the LVIC tubes 44L-46L and the preformed pin 301 to the surface of the circuit wiring 308, and mounting the FRD tubes 11-16 to the bearing tray.

Step S3 includes mounting the HVIC tubes 41-43, the LVIC tubes 44L-46L and 47 and the FRD tubes 11-16 at the positions of the emitters of the IGBT tubes 21-26 respectively. Step S4 includes using the metal wire 305 to connect the IGBT tubes 21-27, the FRD tubes 11-18, the HVIC tubes 41-43, the LVIC tubes 44L-46L and 47 and the circuit wiring 308 to form the corresponding circuit.

Step S5 includes using the sealing resin 302 to seal the front face of the radiator 306.

Step S6 includes covering the corrugation 320 on the back face of the radiator 306, in which specifically, the corrugation 320 is formed by the wet-type carbon composite and is adhered to back face of the radiator 306 by means of the high temperature resistant glue.

Further, before the step S2, the manufacturing method may further include:

step S7 of fabricating the separate pin 301 with the clad layer.

Specifically, firstly, copper base material is used to form a row of pins 301 by stamping or etching, in which the pins 301 are connected to each other by a reinforcing rib.

Then, a nickel layer and a nickel-tin alloy layer are formed on a surface of the pin 301 in sequence, to acquire the pin 301 with the clad layer.

Further, after the step S6, the manufacturing method may further include:

step S8 of trimming and shaping of the pin 301 and performing the module function test.

Figure 53:
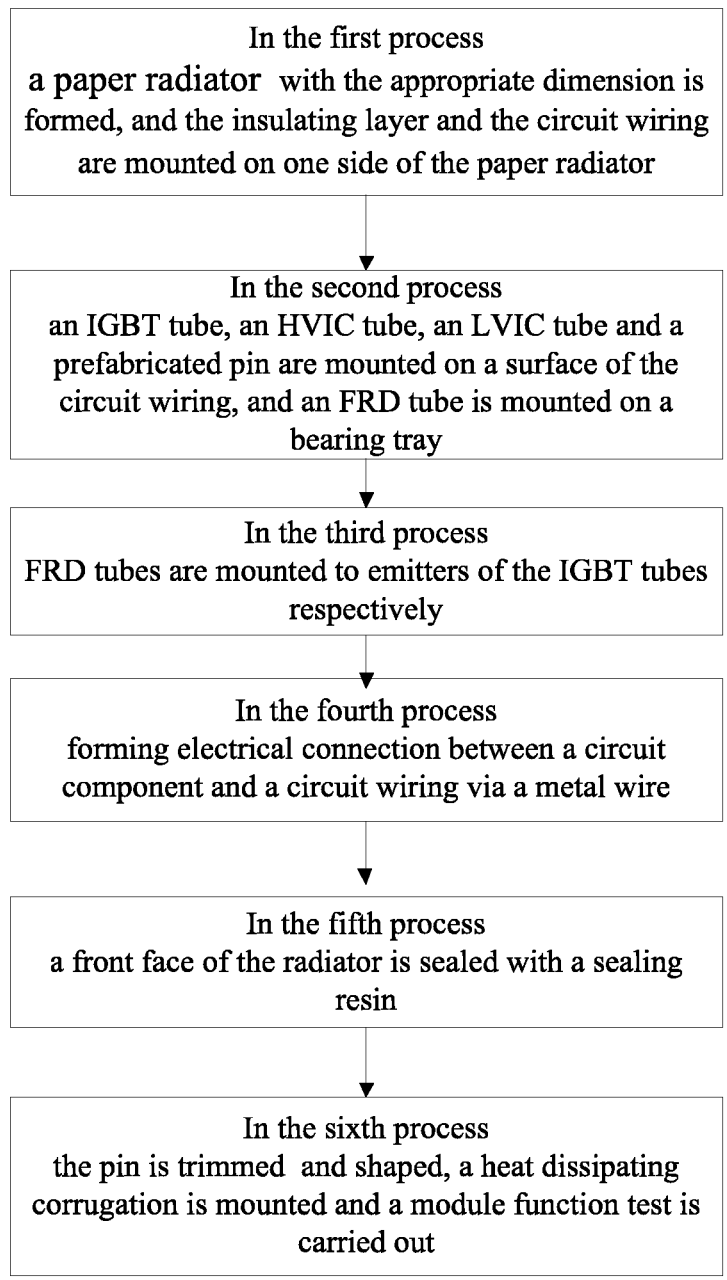
FIG. 53 is a flow chart of a manufacturing method of an intelligent power module according to embodiments of the present disclosure.
Figure 53A:
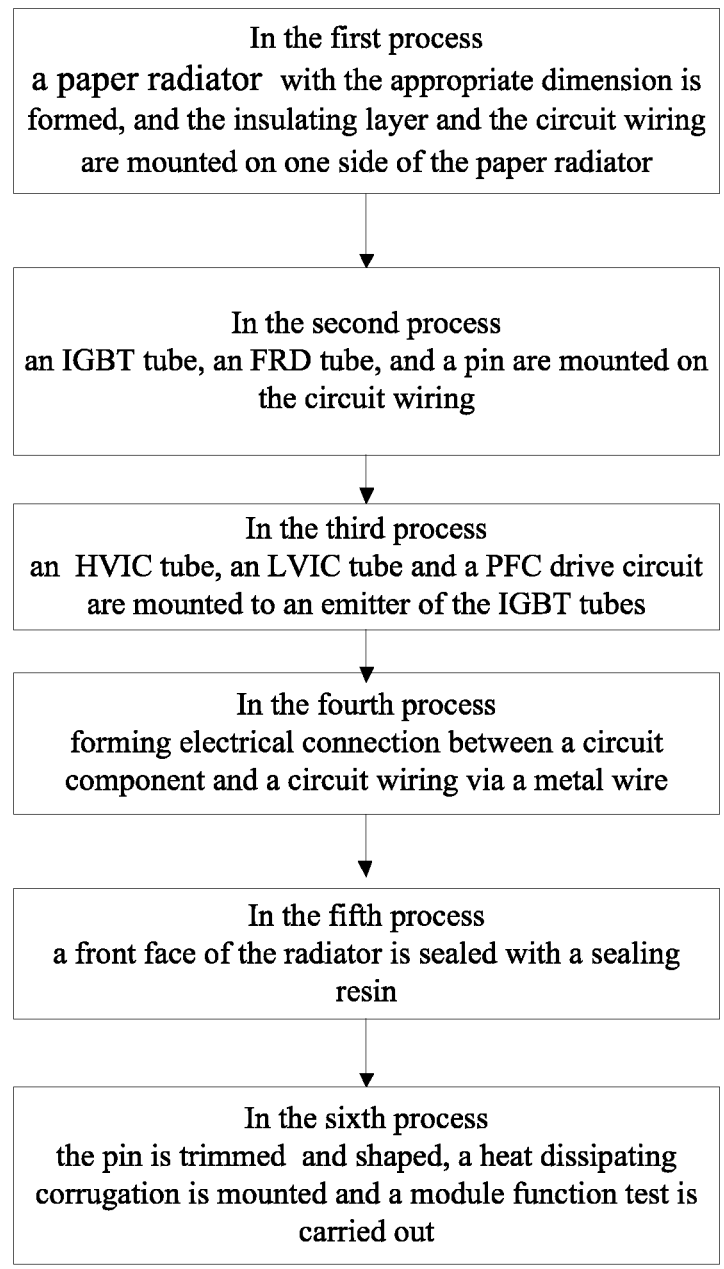

The manufacturing method of the intelligent power module 10 of the present disclosure may include: the process for arranging the insulating layer 307 on the surface of the radiator 306; the process for forming the circuit wiring 308 on the surface of the insulating layer 307; the process for arranging the IGBT tubes 21-27 and the FRD tubes 11-18 to the circuit wiring 308; the process for arranging the HVIC tubes 41-43, the LVIC tubes 44L-46L and the PFC drive integrated circuit 47 to the IGBT tube; the process for connecting the each circuit component and the circuit wiring 306 via the metal wire 305; the process for baking and molding; the process for shaping the pin 301; and the process for performing the functional test. A specific process drawing is shown in FIGS. 53 and 53 (A).

Each the process will be elaborated in the following.

Figure 47A:
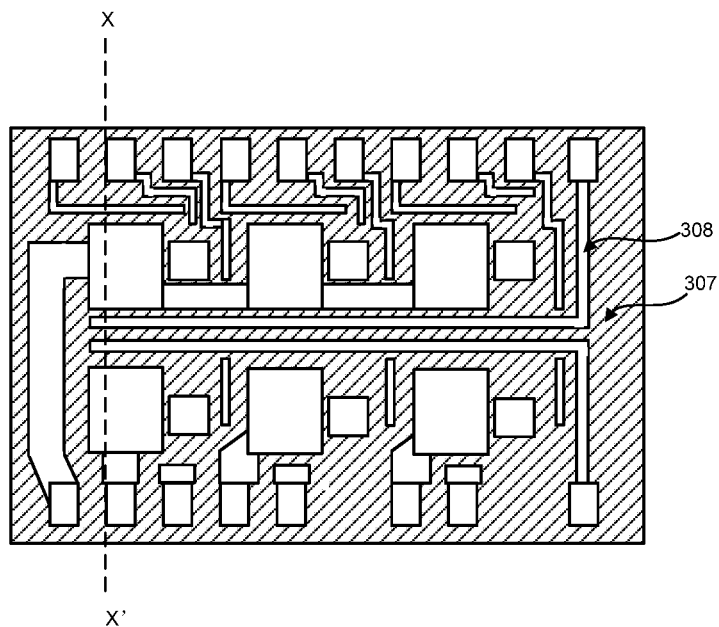
FIG. 47 (A) is top view illustrating a first process of embodiments of the present disclosure that an insulating layer and a copper clad layer are formed on a front face of a paper radiator.
Figure 47B:
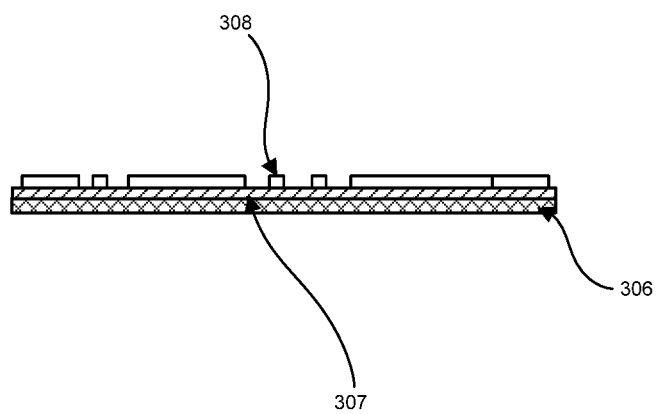

The first process is made by reference to FIGS. 47 (A) and 47 (B).

FIG. 47 (A) is top view illustrating a first process of embodiments of the present disclosure for making an insulating layer and a copper clad layer formed on a front face of a paper radiator; FIG. 47 (B) is a side view of FIG. 47 (A).

In the first process of embodiments of the present disclosure, the insulating layer is formed on the paper radiator with the appropriate dimension and the circuit wiring is formed on the surface of the insulating layer.

Firstly, referring to the top view FIG. 47 (A) and the side view FIG. 47 (B), according to the needed circuit layout, the paper radiator 306 with the appropriate dimension is prepared. With respect to the general intelligent power module, the dimension may be 44 mm×20 mm, both surfaces are subject to the anti-corrosion treatment. The surface of at least one side of an aluminum substrate is provided with the insulating layer 307. In addition, the surface of the insulating layer is attached with a copper clad as the conductive pattern. Then the copper clad fabricated by the process is etched, and is partially removed, to form the circuit wiring 308.

Herein, the formation of the paper radiator with the appropriate dimension may be achieved by directly punching a proximate matter of 1 m×1 m, as well as by shearing the proximate matter of 1 m×1 m.

Figure 48:
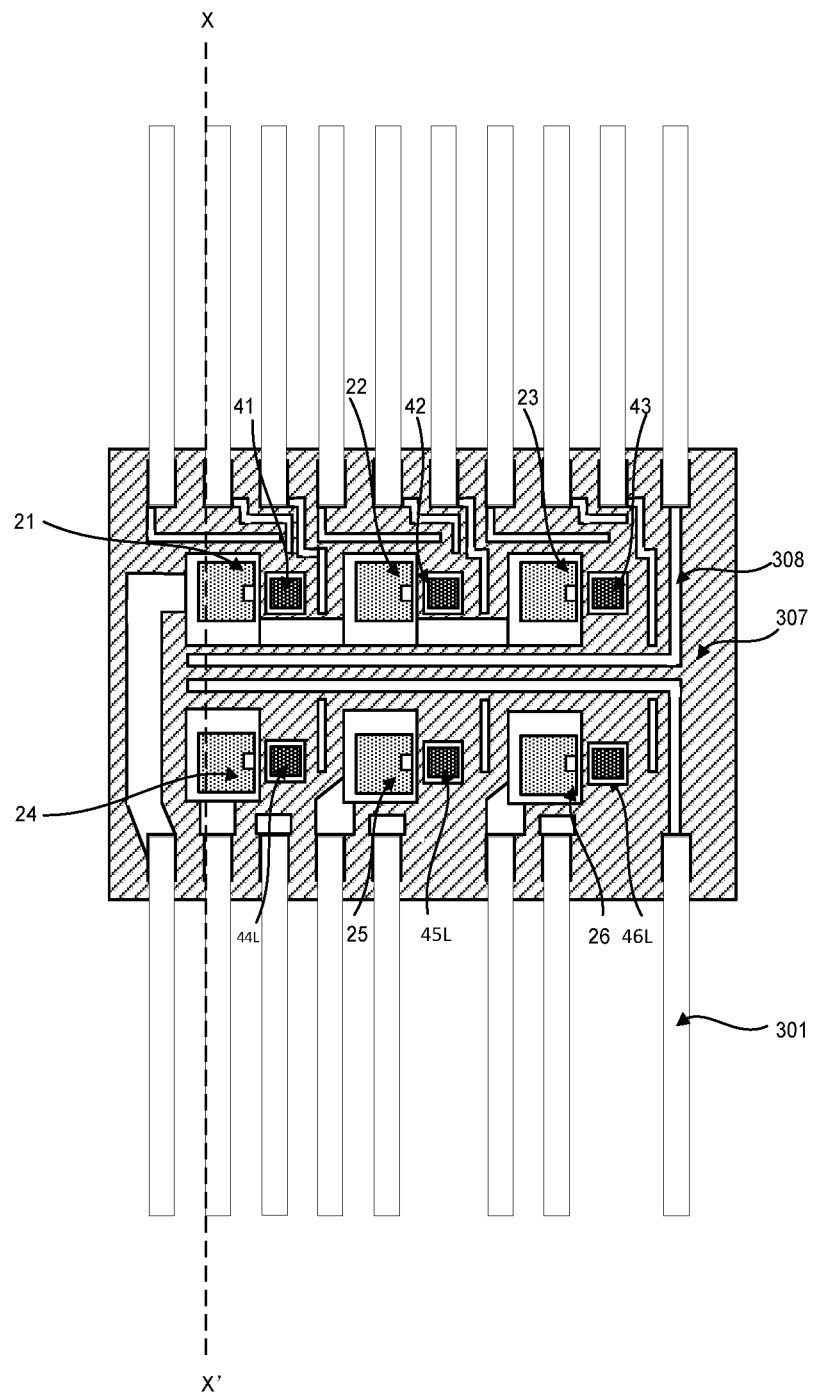
FIG. 48 (A) is top view illustrating that an IGBT tube, a high voltage drive integrated tube, a low voltage drive integrated tube and a preformed pin are mounted to a surface of a circuit wiring and an FRD tube is mounted to a bearing tray in a second process of embodiments of the present disclosure.

The second process in some embodiments is made by reference to FIGS. 48 (AA) and 48 (BB). FIG. 48 (AA) is a top view illustrating that an IGBT tube, a FRD tube and a pin are mounted to a circuit wiring in the second process of embodiments of the present disclosure; FIG. 48 (BB) is a side view of FIG. 48 (AA).

In the second process of the present disclosure, the IGBT tubes 21-27, the FRD tubes 11-18 and the pin 301 are mounted to the circuit wiring 308.

Referring to FIGS. 48 (AA) and 48 (BB), the IGBT tubes 21-27, the FRD tubes 11-18 and the pin 301 are mounted to the prescribed position of the circuit wiring 308 by means of solder such as solder paste.

Herein, in order to reduce void ratio after welding with the solder paste, and to control the cost, a reflow furnace with nitrogen protection may be used to fix the solder paste. If the cost is acceptable, a manner of vacuum reflow may be considered to use. A melting temperature of the solder paste is generally at 280° C.

Each the pin 301 is made of the copper base material and by means of stamping or etching. Then the nickel layer is formed on the surface of the pin by means of chemical plating.

Specifically, a mixed solution of nickel salt and sodium hypophosphite with appropriate complexing agent added are used to form a nickel layer on the surface of the copper material which has been formed in a specific shape. The metallic nickel has high passivation capability, and an extremely thin passivation coating may be formed rapidly, thereby withstanding corrosions due to the atmosphere, alkali or some certain acid. A nickeling crystal is extremely tiny and the thickness of the nickel layer is generally 0.1 µm.

Then by means of acid sulfate process and at an indoor temperature, the copper material with the formed shape and coated with the nickel layer is immersed in a plating solution with positive tin ions and is electrified, then a nickel-tin alloy layer is formed on the surface of the nickel layer. The thickness of the alloy layer is generally controlled to be 5 µm, and the formation of the alloy layer greatly improves the protectiveness and the weldability.

In some other embodiments, referring to FIGS. 48 (A) and 48 (B), FIG. 48 (A) is top view illustrating that an IGBT tube, an HVIC tube, an LVIC tube and a preformed pin are mounted to a surface of a circuit wiring and an FRD tube is mounted to a bearing tray in a second process of embodiments of the present disclosure. FIG. 48 (B) is a side view of FIG. 48 (A), FIG. 48 (C) is a bottom view of a bearing tray in a second process of embodiments of the present disclosure. FIG. 48 (D) is a front view of a bearing tray in a second process of embodiments of the present disclosure.

In the second process, the IGBT tubes 21-26, the HVIC tubes 41-43, the LVIC tubes 44L-46L and the pin 301 are mounted to the circuit wiring 308, and the FRD tubes 11-16 is mounted to the bearing tray.

Referring to FIGS. 48 (A) and 48 (B), the IGBT tubes 21-26, the HVIC tubes 41-43, the LVIC tubes 44L-46L and the pin 301 are mounted to the prescribed position of the circuit wiring 308 by means of solder such as solder paste. The FRD tubes 11-16 are mounted to the particular position on a side of the bearing tray 309 having the protrusion part 310 by means of solder such as solder wire. As the FRD tubes 11-16 may not be in direct contact with the radiator, in order to reduce the void ratio and reduce heat accumulation, the welding may be performed by means of eutectic soldering.

Third process in some embodiments is made by reference to FIGS. 49 (AA) and 49 (BB), FIG. 49 (AA) is a top view illustrating that an HVIC tube and an LVIC tube are mounted to an emitter of an IGBT tube in a third process of embodiments of the present disclosure. FIG. 49 (BB) is a side view of FIG. 49 (AA).

In the third process of the present disclosure, the HVIC tubes 41-43, the LVIC tubes 44L-46L and the PFC drive integrated tube 47 are mounted at the position of the emitter of the IGBT tubes 21-27.

Firstly, referring to FIGS. 49 (AA) and 49 (BB), the HVIC tube 41 is mounted to the IGBT tube 21, the HVIC tube 42 is mounted to the IGBT tube 22, the HVIC tube 43 is mounted to the IGBT tube 23, the HVIC tube 44H is mounted to the IGBT tube 24, the HVIC tube 45H is mounted to the IGBT tube 25, the HVIC tube 46H is mounted to the IGBT tube 26, the PFC drive integrated tube 47 is mounted to the high speed IGBT tube 27.

Herein, if the back face of the HVIC tube and the LVIC tube is not an electrode such as the GND, the silver glue having the conductivity may be used as a fixing material. If the back face of the HVIC tube and the LVIC tube is an electrode such as the GND, the red glue having no conductivity may be used as a fixing material.

Secondly, by means of baking at 175° C., the silver glue or red glue is solidified. Herein, a curing temperature of the silver glue or red glue is about 170° C., and a curing time is about 2 hours. Since the baking temperature is far lower than the melting temperature of the solder paste, during the heating process, the welding effect of the IGBT tube, the FRD tube and the Pin is not influenced.

In some other embodiments, referring to FIGS. 49 (A) and 49 (B), FIG. 49 (A) is a top view illustrating that an FRD tube is mounted to an emitter of an IGBT tube in a third process of embodiments of the present disclosure, FIG. 49 (B) is a side view of FIG. 49 (A).

In the third process of the present disclosure, the FRD tubes 11-16 are mounted at the position of the emitters of the IGBT tubes 21-26.

Firstly, referring to FIGS. 49 (A) and 49 (B), the FRD tube 11 is mounted to the IGBT tube 11, the FRD tube 12 is mounted to the IGBT tube 22, the FRD tube 13 is mounted to the IGBT tube 23, the FRD tube 14 is mounted to the IGBT tube 24, the FRD tube 15 is mounted to the IGBT tube 25, and the FRD tube 16 is mounted to the IGBT tube 26.

Herein, in order to control the void ratio better, the silver glue having the conductivity may be used as a fixing material. The silver glue with appropriate shape and thickness is dotted at a particular position of the emitter of the IGBT tube and at a particular position of the circuit wiring 308 connected with the collector of the IGBT tube. Then the anode of the FRD tube is arranged to the position of the emitter of the IGBT tube having the silver glue, and the protrusion part 310 of the bearing tray 309 where the FRD tube is located is arranged to the position of the circuit wiring 308 connected with the collector of the IGBT tube having the silver glue.

Figure 50:
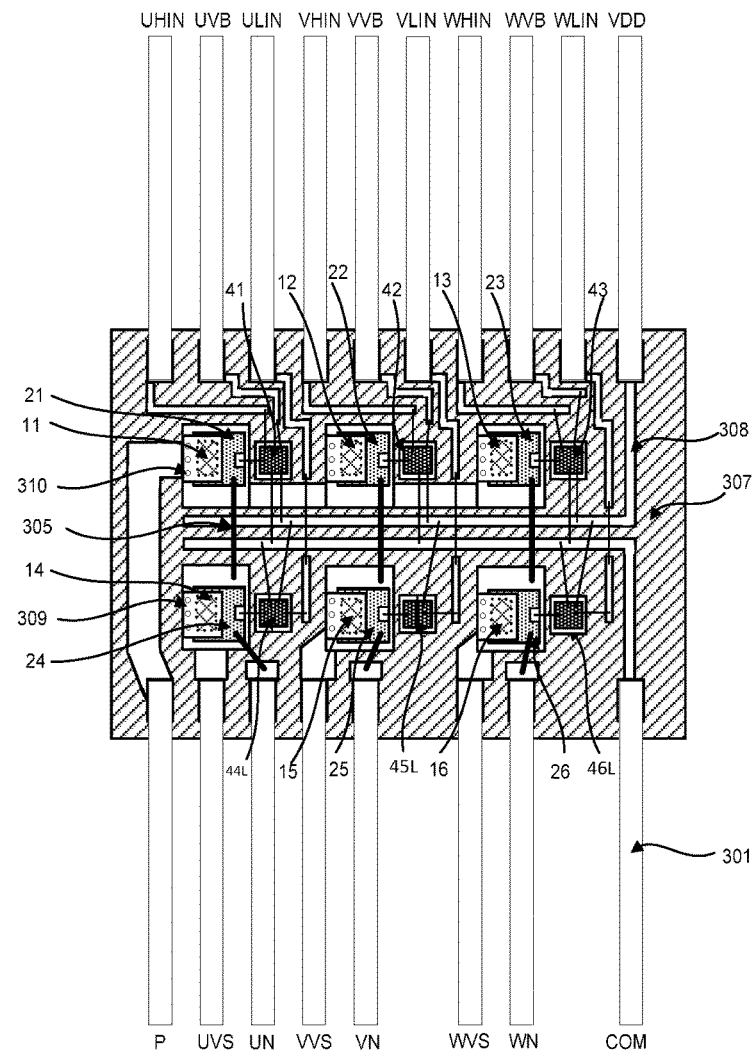
FIG. 50 (A) is a top view illustrating that an IGBT tube, an FRD tube, a high voltage drive integrated tube, a low voltage drive integrated tube and a circuit wiring are connected to form a circuit via a metal wire in a fourth process of embodiments of the present disclosure.
Figure 50:
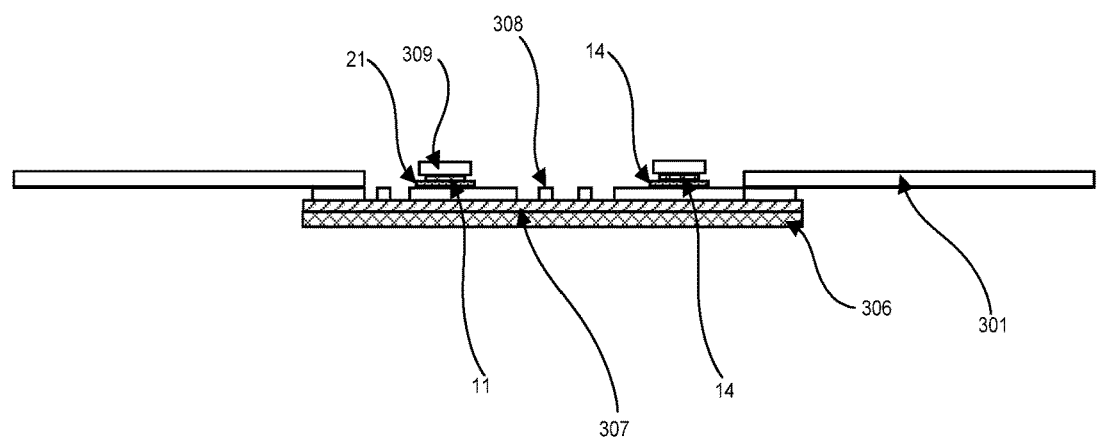

The fourth process in some embodiments is made by reference to FIGS. 50 (AA) and 50 (BB). FIG. 50 (AA) is a top view illustrating that a power component, a non-power component, a radiator and a circuit wiring are connected via a metal wire in a fourth process of embodiments of the present disclosure. FIG. 50 (BB) is a side view of FIG. 50 (AA).

In the fourth process of the present disclosure, an electrical connection between the circuit component and the circuit wiring 308 is formed by means of the metal wire 305.

Referring to FIGS. 50 (AA) and 50 (BB), the IGBT tubes 21-27, the FRD tubes 11-18, the HVIC tubes 41-43, the LVIC tubes 44L-46L, the PFC drive integrated tube 47 and the circuit wiring 308 are connected by binding.

In some other embodiments, referring to FIGS. 50 (A) and 50 (B), FIG. 50 (A) is a top view illustrating that an IGBT tube, an FRD tube, an HVIC tube, an LVIC tube and a circuit wiring are connected to form a circuit via a metal wire in a fourth process of embodiments of the present disclosure. FIG. 50 (B) is a side view of FIG. 50 (A).

In the fourth process of the present disclosure, an electrical connection between the circuit component and the circuit wiring 308 is formed by means of the metal wire 305.

Referring to FIGS. 50 (A) and 50 (B), the IGBT tubes 21-26, the FRD tubes 11-16, the HVIC tubes 41-43, the LVIC tubes 44L-46L and the circuit wiring 308 are connected by binding.

According to needs of the flow capacity, an aluminum wire with suitable diameter is adopted as a binding wire. With respect to a part for signal control, such as the HVIC tube and the LVIC tube, the gold wire of 15 μm or the aluminum wire of 38 μm may be considered as the binding wire. With respect to a power part, such as the IGBT tube and the FRD tube, the aluminum wire of 200 μm-400 μm may be used for the binding.

In consideration of the influence on the binding wire caused by the vibration of a binding machine, a thick line may be bound firstly and then a fine line is bound. In consideration of anti-static effect, a fine line may be bound firstly and then a thick line is bound. It may be determined according to the vibration range of the machine and anti-static effect of the binding head of the machine.

Figure 51:
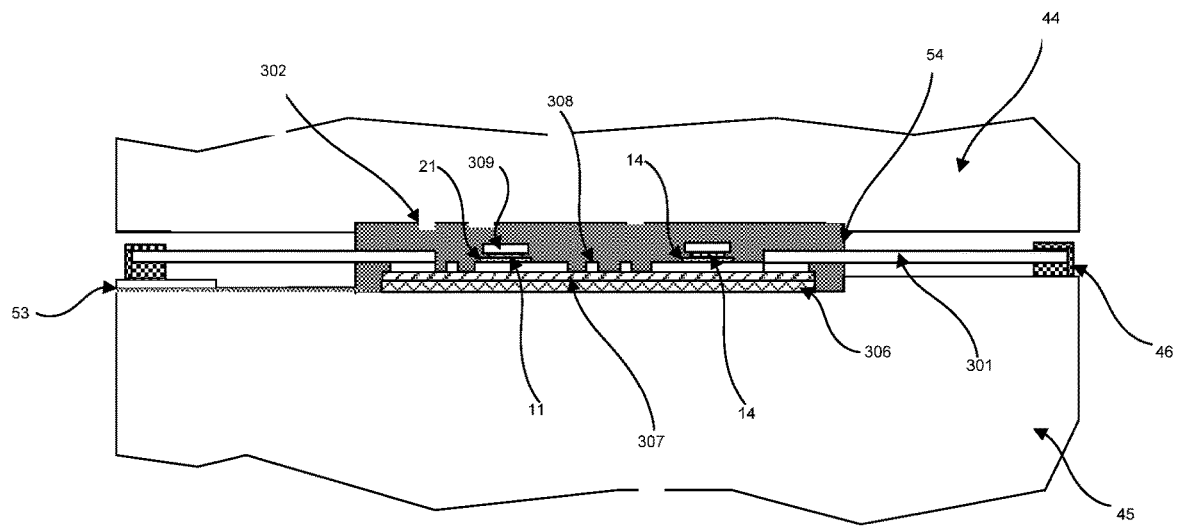
FIG. 51 is a cross sectional view illustrating that a paper radiator is sealed by a sealing resin through a mold in a fifth process of embodiments of the present disclosure.
Figure 51A:
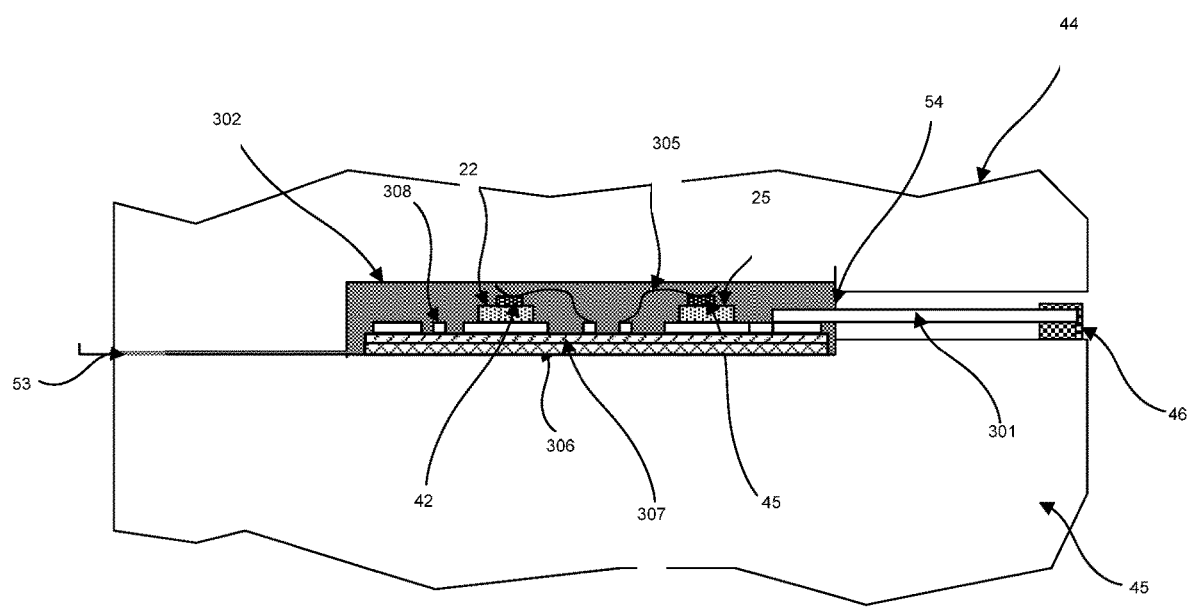

The fifth process is made by reference to FIGS. 51 and 51 (A) which are cross sectional views illustrating that a paper radiator is sealed by a sealing resin through a mold in a fifth process of embodiments of the present disclosure.

In the fifth process of the present disclosure, the paper radiator 306 is sealed by means of the sealing resin 302.

The paper radiator 306 provided with the pin 301 is conveyed to molds 44 and 45. By making the specific part of the pin 301 in contact with a fixing device 46, the paper radiator 306 is positioned.

When the mold is closed, the paper radiator 306 is placed in the molding chamber formed inside the mold 50, and the sealing resin 302 is injected from a pouring gate 53. The sealing method may adopt the transfer molding of the thermosetting resin or the injection molding of the thermosetting resin. Moreover, gas inside the molding chamber corresponding to the sealing resin 302 injected from the pouring gate 53 is discharged to the exterior via an air outlet 54. With respect to choosing the position of the pouring gate 53, it may choose one side that does not completely have the pin 301, i.e., the upper side of FIG. 50 (A), with respect to choosing the air outlet 54, it should choose one side that completely has the pin 301, i.e., the lower side of FIG. 50 (A).

Herein, the back face of the paper radiator 306 is fitted closely to the lower mold 45. However there is still a small amount of sealing resin 302 entering a gap between the back face of the paper radiator 306 and the lower mold 45. Therefore, after demolding, laser etching or grinding are needed to remove the small amount of sealing resin 12 residual on the back face of the radiator 306, such that the back face of the radiator 306 may be exposed from the sealing resin 302 and may be flat, and the part of the radiator 306 above the back face is sealed by the sealing resin 12.

Figure 52A:
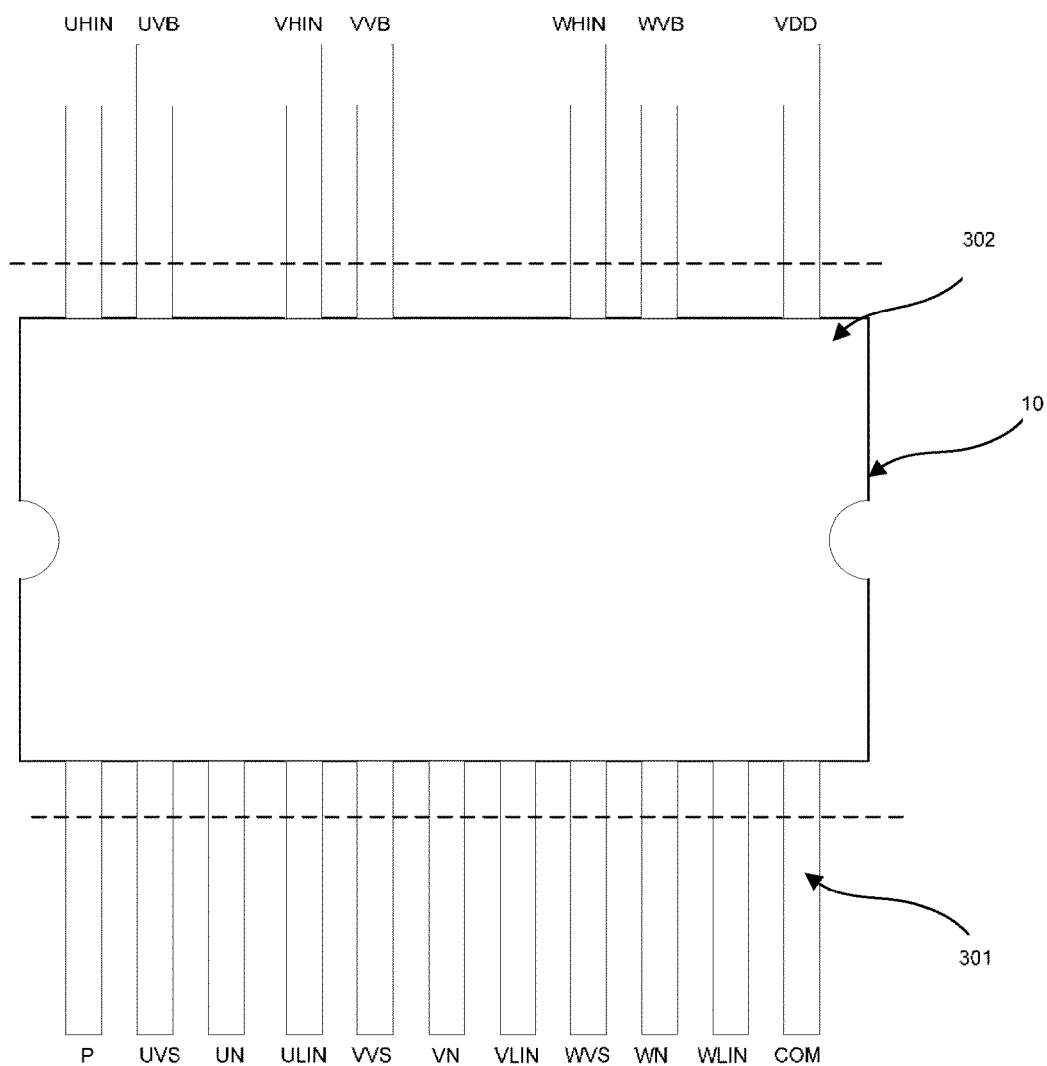
FIG. 52 (A) is a schematic view illustrating that a pin is trimmed and formed in a sixth process of embodiments of the present disclosure.
Figure 52B:
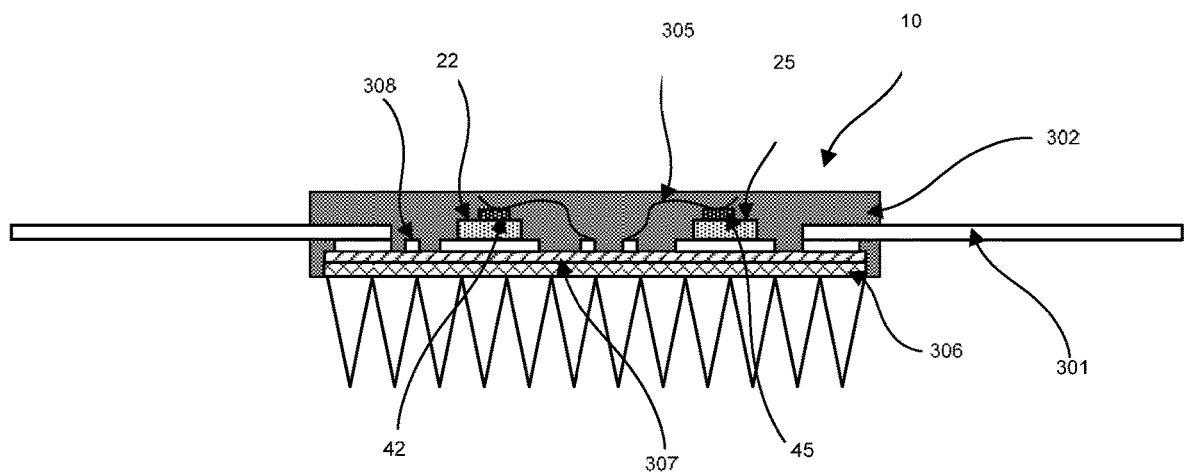

The sixth process is made by reference to FIGS. 52 (A) and 52 (B), FIG. 52 (A) is a schematic view illustrating that a pin is trimmed and formed in a sixth process of embodiments of the present disclosure. FIG. 52 (B) is a schematic view illustrating that a heat dissipating corrugation is mounted in a sixth process of embodiments of the present disclosure.

In the sixth process of the present disclosure, the pin 301 is trimmed and formed, the heat dissipating corrugation is mounted and gets the module function test, the intelligent power module is completed as the product through the process.

In the former process, i.e., the transfer molding process, the other parts apart from the pin 301 are sealed by the resin 302. In the present process, according to requirement for length and shape to be used, for example, the exterior pin 301 is cut off from the position of a dotted line, and may be bent into a certain shape sometimes, to make it convenient for the follow-up assembly, as shown in FIG. 52 (A).

The high temperature resistant glue of which a tolerable temperature is above 150° C. is used to adhere the heat dissipating corrugation 320 to the back face of the radiator 306. Herein, in order to improve the heat dissipation, the heat dissipating corrugation 320 may completely cover the part of the back face of the radiator 306 exposed from the thermosetting resin frame 13a, and in order to reduce the cost, the heat dissipating corrugation 320 may only cover the back face of the paper radiator 306 that has the power component 19.

Then the module is placed in the test device to get a common electrical parameter test, which generally includes test items such as the insulation and voltage resistance test, the static power test and the delay time test. The qualified module through the test is a finished product.

The intelligent power module 10 as shown in FIG. 46 is finished through the above processes.

In the intelligent power module and the manufacturing method thereof provided by the present disclosure, the FRD tube and the IGBT tube of the power component are arranged in a three-dimensional manner through the bearing tray, such that the contact area is increased, the trace length between the power components is lowered to the minimum, the metal wire for connection is omitted, the area is reduced significantly, and the cost of the intelligent power module is reduced.

A control circuit of an intelligent power module, the intelligent power module and the manufacturing method thereof are further provided by the present disclosure. In the intelligent power module, the low voltage area drive circuit may be achieved by the low voltage drive integrated tube, the high voltage area drive circuit may be achieved by the high voltage drive integrated tube. The low voltage drive integrated tube may be achieved by means of low-cost low voltage process such as BIPOLAR or COMS, the high voltage drive integrated tube may be achieved by means of high voltage process such as BCD or SOI, the process cost of the former is merely one third of the latter, thereby significantly reducing the manufacturing cost of the intelligent power module.

Moreover, in the intelligent power module, the separate high voltage drive integrated tube or the low voltage drive integrated tube is arranged to the corresponding IGBT tube, and a trace of the grid from the high voltage drive integrated tube or the low voltage drive integrated tube to the IGBT tube may be consistent, thereby effectively ensuring the consistency of the dynamic characteristics of the six IGBT tubes. A rising edge and a falling edge of one IGBT for the power factor correction may be configured to be very steep, and the area of the circuit wiring may be saved largely, thereby significantly reducing the area of the circuit board of the intelligent power module, making the cost of the intelligent power module further reduced.

In addition, the power module structure of the present disclosure may adopt a smaller inductance and capacitance, and the reduction of the distributed inductance and capacitance may make the dynamic power consumption of the intelligent power module of the present disclosure reduced significantly. Moreover in the present disclosure, the circuit board is replaced by the paper radiator, the aluminum radiator is replaced by the heat dissipating corrugation, such that the intelligent power module itself has better heat dissipating effect, thereby not needing a radiator connected to the exterior, and the radiator is made from paper material, thereby reducing the weight of the intelligent power module, and significantly reducing the material cost and transportation cost with it.

In the specification, it is to be understood that terms such as "central," "length," "width," "thickness," "upper," "lower," "front," "rear," "left," "right," "top," "bottom," "inner," and "outer," should be construed to refer to the orientation as then described or as shown in the drawings under discussion. These relative terms are for convenience of description and do not require that the present invention be constructed or operated in a particular orientation.

In the description of the present invention, the term "a plurality of" means two or more than two, unless specified otherwise.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An intelligent power module comprising:
   a radiator, at least part of a lower surface of the radiator defining a heat dissipating area, the heat dissipating area being provided with a heat dissipating corrugation;
   an insulating layer provided to an upper surface of the radiator;
   a circuit wiring provided to the insulating layer; and
   a circuit component provided to the circuit wiring and connected to the circuit wiring via a metal wire;
   wherein the circuit component comprises a power component and a non-power component, the power component and the non-power component both are arranged on the circuit wiring, the power component and the non-power component are electrically connected with the circuit wiring via the metal wire, the power component is opposite to the heat dissipating area, a partition portion is provided between the power component and the non-power component, the partition portion is arranged on a corresponding position on the lower surface of the radiator, a width of the partition portion is 1 mm to 5 mm;
   wherein the power component comprises an Insulated Gate Bipolar Transistor ("IGBT") tube and a Fast Recovery Diode ("FRD") tube connected with the IGBT tube, a bottom portion of the FRD tube is provided with a support portion, the FRD tube is arranged at a preset position of the IGBT tube upside down and a top portion of the FRD tube is in contact with the IGBT tube, the support portion is connected with the IGBT tube through the circuit wiring;
   wherein six power components are provided and include three upper bridge-arm power components and three lower bridge-arm power components, the power component further comprises a U-phase high voltage drive integrated tube, a V-phase high voltage drive integrated tube and a W-phase high voltage drive integrated tube correspondingly connected with the three upper bridge-arm power components respectively, and a U-phase low voltage drive integrated tube, a V-phase low voltage drive integrated tube and a W-phase low voltage drive integrated tube correspondingly connected with the three lower bridge-arm power components respectively; and
   the intelligent power module further comprises a power factor correction circuit, the power factor correction circuit has functions of a bridge, a compressor inverter and a power factor correction or has functions of a bridge, a compressor inverter, a power factor correction and a fan inverter, the power factor correction circuit is connected with the U-phase high voltage drive integrated tube, the V-phase high voltage drive integrated tube, the W-phase high voltage drive integrated tube, the U-phase low voltage drive integrated tube, the V-phase low voltage drive integrated tube and the W-phase low voltage drive integrated tube.

2. The intelligent power module according to claim 1, wherein the radiator is configured as a paper radiator having wet-type carbon composite material function or the radiator is configured as a paper radiator made from an insulating material capable of withstanding temperature of above 350° C.

3. The intelligent power module according to claim 1, wherein a plurality of heat dissipating corrugations are provided, the plurality of heat dissipating corrugations are spaced apart from each other or the plurality of heat dissipating corrugations are arranged continuously.

4. The intelligent power module according to claim 1, wherein a distance between an outer edge of the heat dissipating corrugation and an outer edge of the lower surface of the radiator is more than 1 mm.

5. The intelligent power module according to claim 1, wherein the heat dissipating area protrudes downwards to form a boss and the heat dissipating corrugation is arranged on the boss.

6. The intelligent power module according to claim 1, further comprising a frame structure fitted over a periphery of the intelligent power module, the frame structure comprising an annular frame surrounding at a side face of the intelligent power module and an extending portion perpendicularly extending from a bottom portion of the annular frame to an inner side and in contact with a bottom portion of the radiator, thickness of the extending portion being 1 mm to 1.5 mm.

7. The intelligent power module according to claim 1, wherein a plurality of circuit wirings spaced apart from each other are provided, and
  the intelligent power module further comprises a plurality of pins having first ends respectively connected with the plurality of circuit wirings, and second ends connected to an exterior.

8. The intelligent power module according to claim 7, wherein an edge of at least one side of the insulating layer is provided with a plurality of welding pads, and the second ends of the plurality of pins are respectively connected with the plurality of welding pads.

9. The intelligent power module according to claim 1, wherein a thickness of the radiator in an up-down direction is 1.2 mm to 2.5 mm, and dimension of heat dissipating corrugation extending along the up-down direction is 0.3 mm to 0.7 mm.

10. The intelligent power module according to claim 1, wherein the intelligent power module further comprises a sealing resin, the sealing resin completely seals the circuit wiring and the circuit component and covers the upper surface of the radiator and an area apart from the heat dissipating area.

11. The intelligent power module according to claim 1, wherein a side of the support portion mounted with the FRD tube is provided with a flat part and is provided with one or more protrusion parts for connecting the circuit wiring at an edge away from the flat part.

12. The intelligent power module according to claim 1, wherein the three upper bridge-arm power components are configured as a first power component, a second power component and a third power component, and the three lower bridge-arm power components are configured as a fourth power component, a fifth power component and a sixth power component;
  the first power component comprises a first IGBT tube and a first FRD tube, the second power component comprises a second IGBT tube and a second FRD tube, the third power component comprises a third IGBT tube and a third FRD tube, the fourth power component comprises a fourth IGBT tube and a fourth FRD tube, the fifth power component comprises a fifth IGBT tube and a fifth FRD tube, and the sixth power component comprises a sixth IGBT tube and a sixth FRD tube;
  the U-phase high voltage drive integrated tube, the V-phase high voltage drive integrated tube, and the W-phase high voltage drive integrated tube comprise power supply terminals, input terminals, output terminals, high voltage power supply positive terminals, high voltage power supply negative terminals and ground terminals, the U-phase low voltage drive integrated tube, the V-phase low voltage drive integrated tube and the W-phase low voltage drive integrated tube comprise power supply terminals, input terminals, output terminals and ground terminals,
  wherein the input terminals of the U-phase high voltage drive integrated tube, the V-phase high voltage drive integrated tube, and the W-phase high voltage drive integrated tube are respectively configured as input terminals of a U-phase upper bridge arm, a V-phase upper bridge arm and a W-phase upper bridge arm of the intelligent power module; the input terminals of the U-phase low voltage drive integrated tube, the V-phase low voltage drive integrated tube and the W-phase low voltage drive integrated tube are respectively configured as input terminals of a U-phase lower bridge arm, a V-phase lower bridge arm and a W-phase lower bridge arm of the intelligent power module;
  the power supply terminals of the U-phase high voltage drive integrated tube, the V-phase high voltage drive integrated tube, and the W-phase high voltage drive integrated tube and the power supply terminals of the U-phase low voltage drive integrated tube, the V-phase low voltage drive integrated tube and the W-phase low voltage drive integrated tube are connected and configured as a positive terminal of a low voltage area power supply of the intelligent power module, the ground terminals of the U-phase high voltage drive integrated tube, the V-phase high voltage drive integrated tube, and the W-phase high voltage drive integrated tube and the ground terminals of the U-phase low voltage drive integrated tube, the V-phase low voltage drive integrated tube and the W-phase low voltage drive integrated tube are connected and configured as a negative terminal of a low voltage area power supply of the intelligent power module, the high voltage power supply positive terminals of the U-phase high voltage drive integrated tube, the V-phase high voltage drive integrated tube, and the W-phase high voltage drive integrated tube are configured as positive terminals of a U, V, W three-phase high voltage area power supply of the intelligent power module;
  the output terminal of the U-phase high voltage drive integrated tube is connected to a grid of the first IGBT tube, the high voltage power supply negative terminal of the U-phase high voltage drive integrated tube is connected with an emitter of the first IGBT tube, an anode of the first FRD tube, a collector of the fourth IGBT tube and a cathode of the fourth FRD tube and is configured as a negative terminal of a U-phase high voltage area power supply of the intelligent power module; the output terminal of the V-phase high voltage drive integrated tube is connected with a grid of the second IGBT tube, the high voltage power supply negative terminal of the V-phase high voltage drive integrated tube is connected with an emitter of the second IGBT tube, an anode of the second FRD tube, a collector of the fifth IGBT tube and a cathode of the fifth FRD tube and is configured as a negative terminal of a V-phase high voltage area power supply of the intelligent power module; the output terminal of the W-phase high voltage drive integrated tube is connected with a grid of the third IGBT tube, the high voltage power supply negative terminal of the W-phase high voltage drive integrated tube is connected with an emitter of the third IGBT tube, an anode of the third FRD tube, a collector of the sixth IGBT tube and a cathode of the sixth FRD tube and is configured as a negative terminal of a W-phase high voltage area power supply of the intelligent power module;

a collector of the first IGBT tube, a cathode of the first FRD tube, a collector of the second IGBT tube, a cathode of the second FRD tube, a collector of the third IGBT tube and a cathode of the third FRD tube are connected and configured as a high voltage input terminal of the intelligent power module;

the output terminal of the U-phase low voltage drive integrated tube is connected with a grid of the fourth IGBT tube, an emitter of the fourth IGBT tube and an anode of the fourth FRD tube are connected and configured as a U-phase low voltage reference terminal of the intelligent power module, the output terminal of the V-phase low voltage drive integrated tube is connected with a grid of the fifth IGBT tube, an emitter of the fifth IGBT tube and an anode of the fifth FRD tube are connected and configured as a V-phase low voltage reference terminal of the intelligent power module, the output terminal of the W-phase low voltage drive integrated tube is connected with a grid of the sixth IGBT tube, an emitter of the sixth IGBT tube and an anode of the sixth FRD tube are connected and configured as a W-phase low voltage reference terminal of the intelligent power module.

13. The intelligent power module according to claim 12, wherein the power factor correction circuit comprises a high speed IGBT tube, a high power FRD tube, a small power FRD tube and a first low voltage drive integrated tube;

the first low voltage drive integrated tube comprises an input terminal, an output terminal, a power supply terminal and a ground terminal;

the input terminal of the first low voltage drive integrated tube is configured as an input terminal of the power factor correction circuit; the power supply terminal of the first low voltage drive integrated tube is configured as a power supply terminal of the power factor correction circuit; the ground terminal of the first low voltage drive integrated tube is configured as a ground terminal of the power factor correction circuit;

the input terminal of the first low voltage drive integrated tube is connected with a grid of the high speed IGBT tube, an emitter of the high speed IGBT tube is connected with an anode of the small power FRD tube, a collector of the high speed IGBT tube is connected with a cathode of the small power FRD tube and an anode of the high power FRD tube.

14. A manufacturing method of an intelligent power module, wherein the intelligent power module comprising:
a radiator, at least part of a lower surface of the radiator defining a heat dissipating area, the heat dissipating area being provided with a heat dissipating corrugation;
an insulating layer provided to an upper surface of the radiator;
a circuit wiring provided to the insulating layer; and
a circuit component provided to the circuit wiring and connected to the circuit wiring via a metal wire;
wherein the manufacturing method comprising the following steps of:
S10: fabricating a radiator, and forming a heat dissipating corrugation on a lower surface of the radiator, and covering an upper surface of the radiator with an insulating layer;
S20: laying out a circuit wiring on a surface of the insulating layer;
S30: mounting a circuit component and a pin to a corresponding position of the circuit wiring;
S40: connecting the circuit wiring and the circuit component via a metal wire;
S50: coating a sealing layer on the surface of the insulating layer, to cover the circuit wiring, the circuit component and the metal wire;
S60: providing a waterproof layer on the lower surface of the radiator; and
S70: performing a module functional test on the intelligent power module, the module functional test including an insulation and voltage resistance test, a static power test and a delay time test.

15. The manufacturing method according to claim 14, wherein the step S10 further comprises the following sub-steps of:
S11: according to a set circuit layout, choosing a wet-type carbon composite material with a predetermined dimension to form a paper radiator;
S12: forming a through hole at an appointed position between the circuit wirings, the through hole runs through the insulating layer and the radiator;
S13: using an insulating material and copper material on a front face of the radiator, and by means of hot pressing, making the insulating material formed on the surface of the radiator as the insulating layer, and making the copper material formed on the surface of the insulating layer as a copper clad layer;
S14: corroding a particular position on the copper clad layer, and making the rest part formed as the circuit wiring and a welding pad; and
S15: forming the corrugation with the wet-type carbon composite material, and adhering the corrugation to a back face of the radiator via high temperature resistant glue.

16. The manufacturing method according to claim 15, wherein the step S50 further comprises the following sub-steps of:
S51: arranging a thermosetting resin frame around the surface of the insulating layer;
S52: injecting a thermoplastic resin in the range of the thermosetting resin frame and in the through hole so as to seal the circuit wiring, the circuit component and the metal wire; and
S53: trimming and shaping the pin and sealing the position on the back face of the radiator that is not covered with the corrugation by using the sealing resin.

17. The manufacturing method according to claim 14, wherein,
the step S30 of preforming the pin before mounting the circuit component to the corresponding position of the circuit wiring, further comprises the following substeps of:
S31: choosing copper base material, and forming a row of pins by stamping or etching the copper base material, the pins being connected to each other by a reinforcing rib; and
S32: forming a nickel layer and a nickel-tin alloy layer in sequence on a surface of the pin, to acquire the pin with a clad layer;
the step S40 further comprises the following substeps of:
S41: welding the circuit component to the circuit wiring by reflow soldering;
S42: eliminating soldering flux residues on the insulating layer;
S43: connecting the circuit wiring and the circuit component by using the metal wire.

18. The manufacturing method according to claim 14, wherein the radiator is the paper radiator, the step of covering the front face of the radiator with the insulating layer and forming the circuit wiring and the welding pad on the surface of the insulating layer comprises:
S'10: according to a set circuit layout, choosing a wet-type carbon composite material with a predetermined dimension to form a paper radiator;
S'20: using an insulating material and copper material on a front face of the radiator, and by means of hot pressing, making the insulating material formed on the surface of the radiator as the insulating layer, and making the copper material formed on the surface of the insulating layer as a copper clad layer;
S'30: corroding a particular position on the copper clad layer, and making the rest part formed as the circuit wiring and a welding pad;
S'40: forming a partition portion on a back face of the radiator, and fixing the preformed heat dissipating corrugation to the position on the back face of the radiator corresponding to the power component, in which S'40 includes S'41 of, removing the material on the particular position of the back face of the paper radiator by means of cutting, tearing, corroding or the like, to form the partition portion;
S'50: forming the corrugation with the wet-type carbon composite material, and adhering the corrugation to the position on the back face of the radiator corresponding to the power component by means of high temperature resistant glue.

19. A manufacturing method of an intelligent power module, wherein the intelligent power module comprising:
a radiator, at least part of a lower surface of the radiator defining a heat dissipating area, the heat dissipating area being provided with a heat dissipating corrugation;
an insulating layer provided to an upper surface of the radiator;
a circuit wiring provided to the insulating layer; and
a circuit component provided to the circuit wiring and connected to the circuit wiring via a metal wire;
wherein the manufacturing method comprising the following steps of:
T10: manufacturing a radiator and a pin, and flatting an upper surface of the radiator;
T20: arranging an insulating layer on the upper surface of the radiator, and forming a circuit wiring on an upper surface of the insulating layer;
T30: arranging a circuit component and the pin connected to an exterior on the circuit wiring, arranging a heat dissipating area to a lower surface of the radiator, and defining a heat dissipating corrugation in the heat dissipating area;
T40: connecting the circuit component with the circuit wiring via a metal wire; and
T50: baking the radiator and molding a sealing resin, shaping the pin to acquire the intelligent power module.

20. A manufacturing method of an intelligent power module, wherein the intelligent power module comprising:
a radiator, at least part of a lower surface of the radiator defining a heat dissipating area, the heat dissipating area being provided with a heat dissipating corrugation;
an insulating layer provided to an upper surface of the radiator;
a circuit wiring provided to the insulating layer; and
a circuit component provided to the circuit wiring and connected to the circuit wiring via a metal wire;
wherein the manufacturing method comprising the following steps of:
P10: manufacturing a radiator and a pin, flatting an upper surface of the radiator, and arranging a heat dissipating corrugation to a lower surface of the radiator;
P20: arranging an insulating layer on the upper surface of the radiator, and arranging a circuit wiring on an upper surface of the insulating layer;
P30: arranging a circuit component and the pin connected to an exterior on the circuit wiring;
P40: connecting the circuit component with the circuit wiring via a metal wire;
P50: baking the radiator and molding a sealing resin, shaping the pin to acquire the intelligent power module.

21. The manufacturing method according to claim 20, wherein the step P30 further comprises a step of cleaning the radiator;
in the Step P50, the radiator is baked in an oxygen-free environment, baking time is more than 2 hours and a baking temperature is 110° C. to 140° C.

22. A manufacturing method of an intelligent power module comprising:
Q10: forming a radiator;
Q20: taking the radiator as a power module base material, and forming an insulating layer at one side of the power module base material;
Q30: forming a welding area and a pin at one side of the insulating layer not in contact with the radiator;
Q40: mounting at least one power component in a power welding area of the welding area; and
Q50: forming a sealing layer to complete the fabricating of the intelligent power module;
wherein the welding area also comprises a non-power welding area, at least one non-power component is mounted in the non-power welding area,
the step Q10 comprises a step Q11 of forming the radiator by means of a wet-type carbon composite layer;
the step Q30 comprises a step Q31 of forming a heat dissipating corrugation at one side of the radiator not in contact with the insulating layer, the heat dissipating corrugation is corresponding to the area where the at least one non-power component is;

the step Q40 comprises:

Q41: coating a first solder paste layer on the power welding area;

Q42: after mounting the at least one power component in the power welding area, processing reflow soldering on the first solder paste layer to solidify the first solder paste layer;

Q43: coating a second solder paste layer on the non-power welding area;

Q44: after mounting the at least one non-power component in the non-power welding area, processing reflow soldering on the solder paste layer to solidify the second solder paste layer; and Q45: cleaning the radiator subject, in which the cleaning includes a spraying treatment and/or an ultrasonic cleaning treatment.

23. The manufacturing method according to claim 22, wherein the step Q30 comprises:

Q'31: forming a metal seed layer at one side of the insulating layer not in contact with the radiation layer, in which, a thickness of the metal seed layer is 0.01 to 0.1 micrometers;

Q'32: making the seed layer subject to an electroplating treatment to form a circuit wiring, in which, a thickness of the circuit wiring is 1 to 5 micrometers;

Q'33: etching the circuit wiring to form the welding area, the pin and the welding pad; and Q'34: connecting a metal wire between the welding area, the pin and the welding pad.

* * * * *